United States Patent
Ozawa

(10) Patent No.: US 7,067,871 B2
(45) Date of Patent: Jun. 27, 2006

(54) STACKED GATE SEMICONDUCTOR MEMORY

(75) Inventor: Yoshio Ozawa, Kanagawa (JP)

(73) Assignee: Kabushiki Kaisha Toshiba, Tokyo (JP)

(*) Notice: Subject to any disclaimer, the term of this patent is extended or adjusted under 35 U.S.C. 154(b) by 28 days.

(21) Appl. No.: 10/868,014

(22) Filed: Jun. 16, 2004

(65) Prior Publication Data
US 2005/0184327 A1 Aug. 25, 2005

(30) Foreign Application Priority Data
Feb. 19, 2004 (JP) .................. P2004-042622

(51) Int. Cl.
*H01L 29/788* (2006.01)
(52) U.S. Cl. .................. 257/315; 257/315; 257/316
(58) Field of Classification Search ................ 257/315, 257/316, 317, 324
See application file for complete search history.

(56) References Cited

U.S. PATENT DOCUMENTS

| | | | |
|---|---|---|---|
| 5,869,858 A | 2/1999 | Ozawa et al. | ................ 257/296 |
| 5,990,515 A * | 11/1999 | Liu et al. | ..................... 257/316 |

FOREIGN PATENT DOCUMENTS

JP        08-316348        11/1996

OTHER PUBLICATIONS

U.S. Appl. No. 10/724,103, filed Dec. 1, 2003, Yoshio Ozawa et al.
W. -H. Lee et al., "A Novel High K Inter-Poly Dielectric(IPD), $Al_2O_3$ for Low Voltage/High Speed Flash Memories: Erasing in msecs at 3.3V", Symposium on VLSI Technology Digest of Technical Papers: p. 117-118, (Jun. 10-12, 1997).

* cited by examiner

*Primary Examiner*—David Nelms
*Assistant Examiner*—Thinh T Nguyen
(74) *Attorney, Agent, or Firm*—Finnegan, Henderson, Farabow, Garrett & Dunner, L.L.P.

(57) ABSTRACT

A semiconductor memory embraces a plurality of memory cell transistors, and each of the memory cell transistors encompasses a substrate; a gate insulator stacked on the substrate, configured to enable tunneling of electrons through the gate insulator; a floating gate electrode stacked on the gate insulator, configured to accumulate electron charges; an inter-electrode dielectric stacked on the floating gate electrode incorporating a positive charge layer, distribution of the positive charge layer being localized in the lower half of the inter-electrode dielectric; and a control gate electrode stacked on the inter-electrode dielectric.

4 Claims, 29 Drawing Sheets

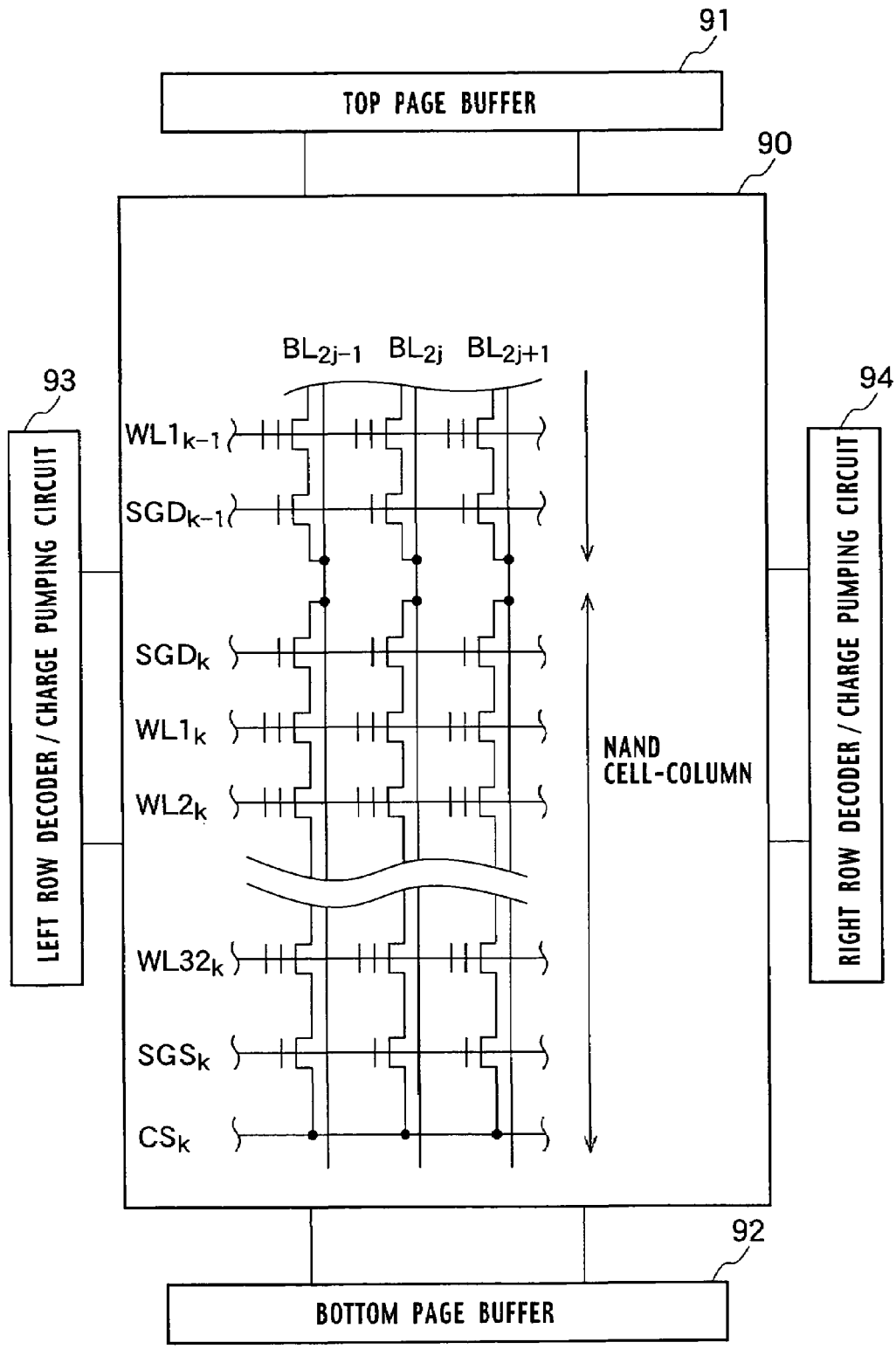

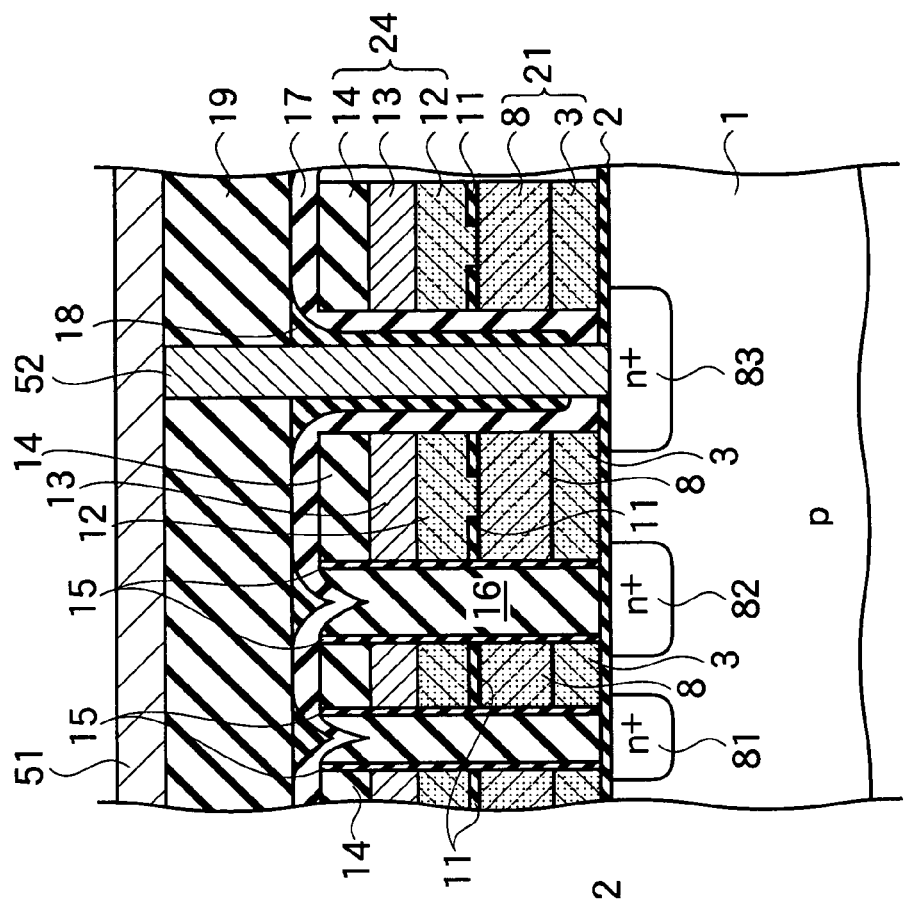
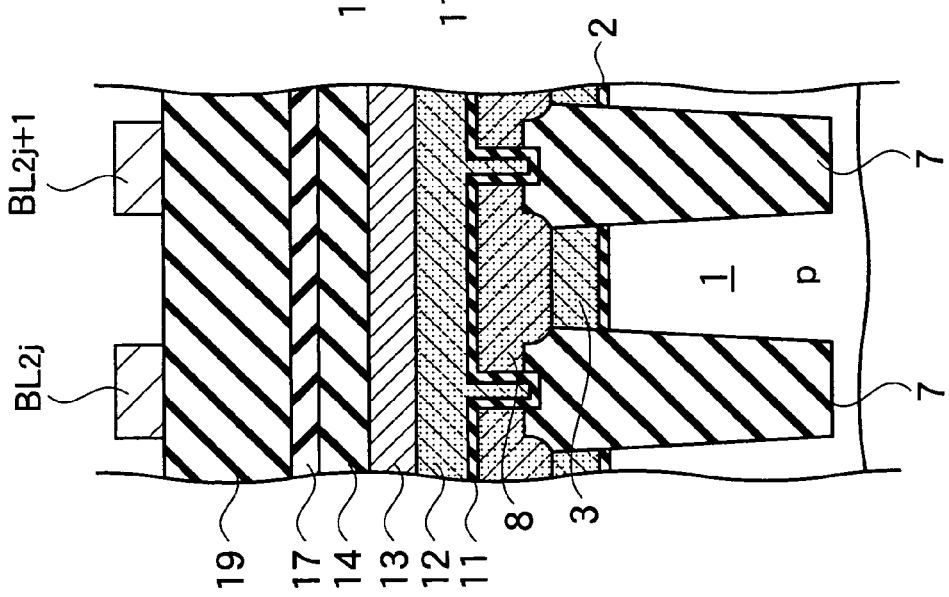

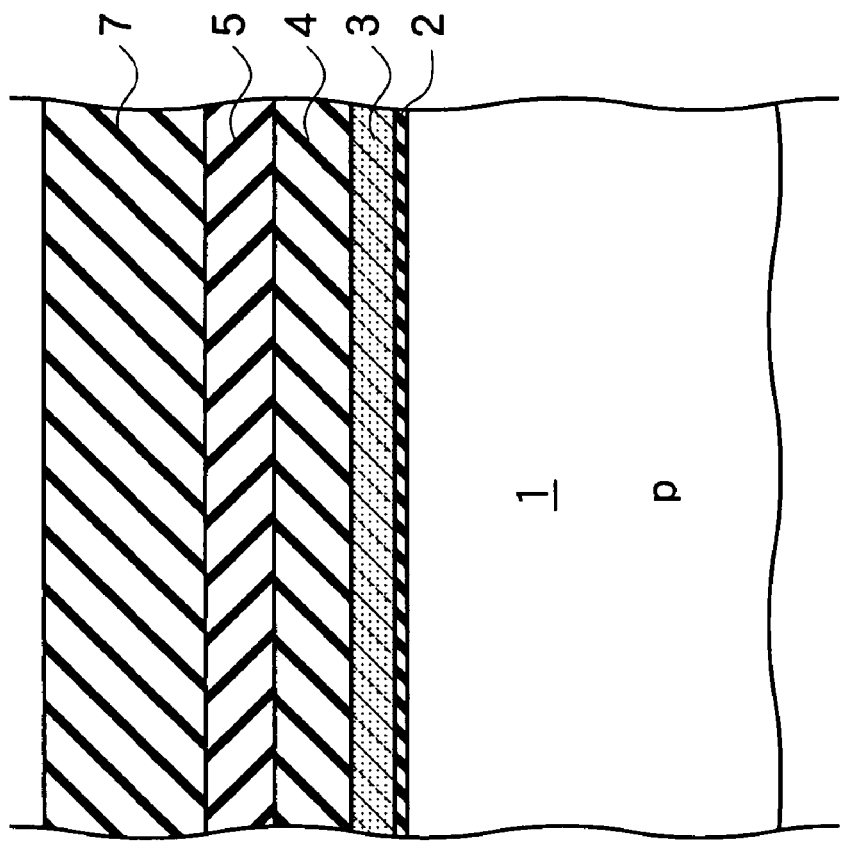
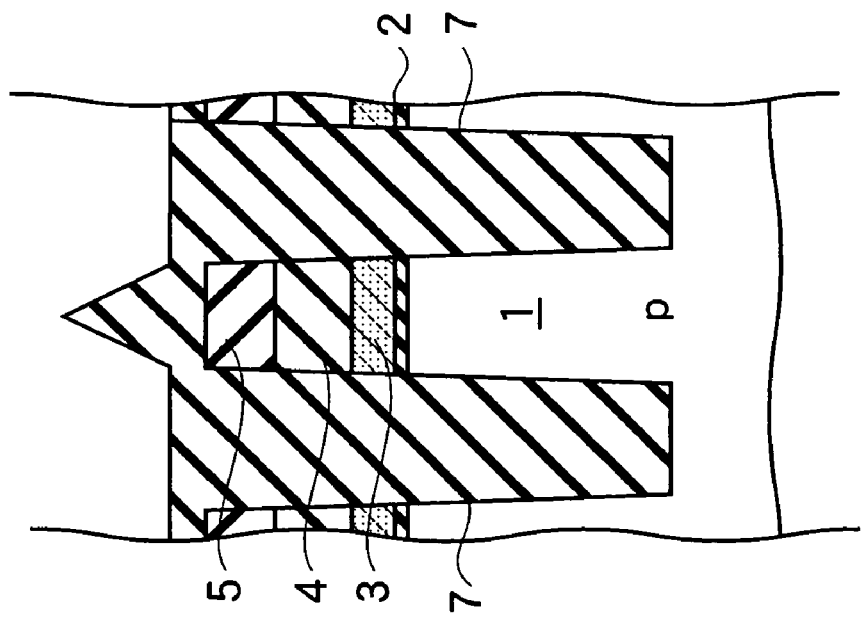
FIG. 8A
FIG. 8B

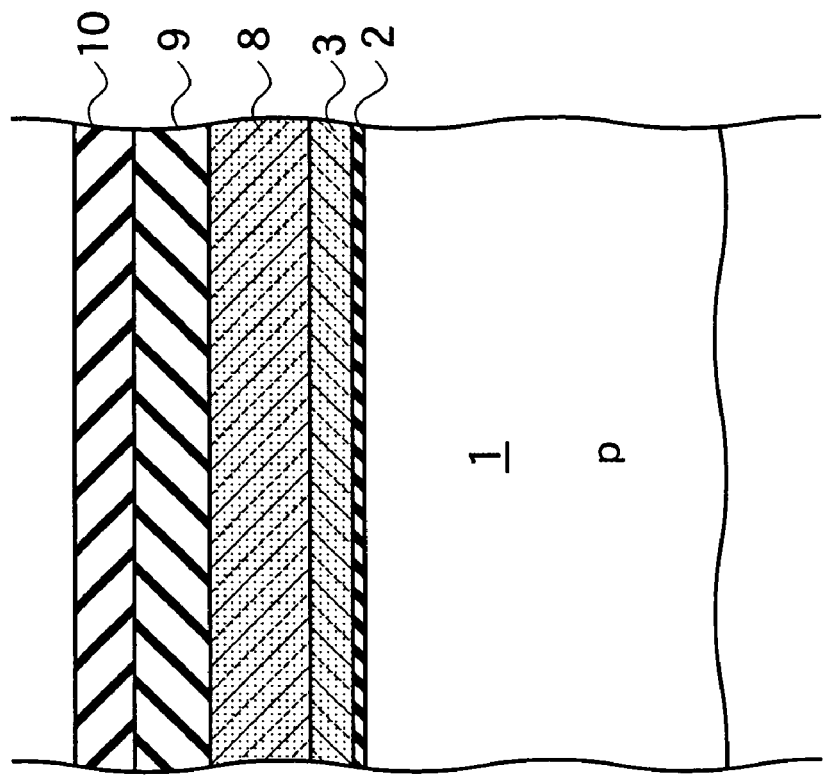
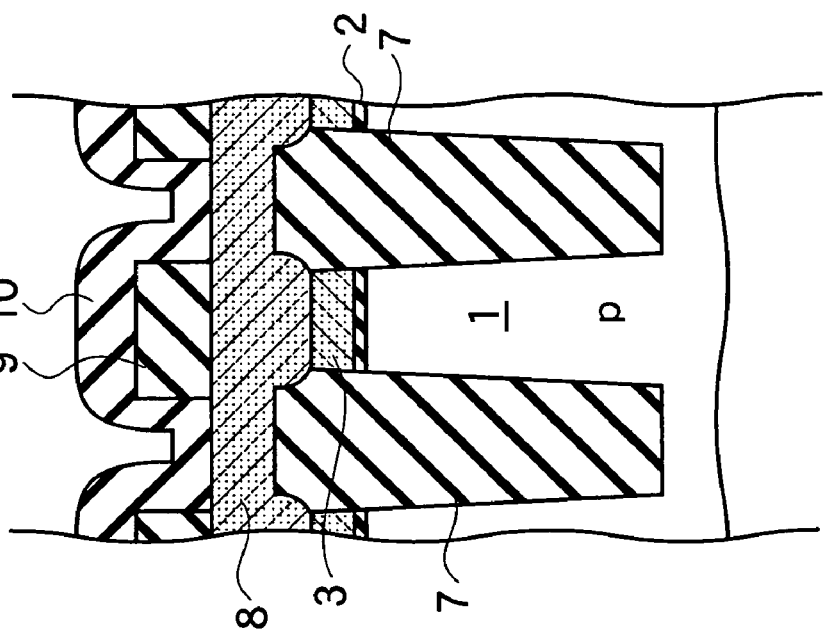

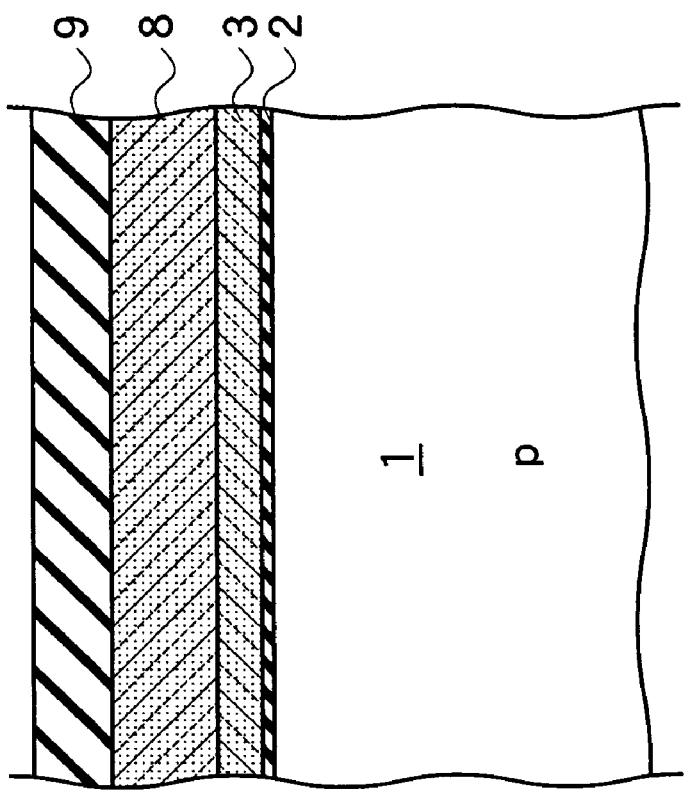
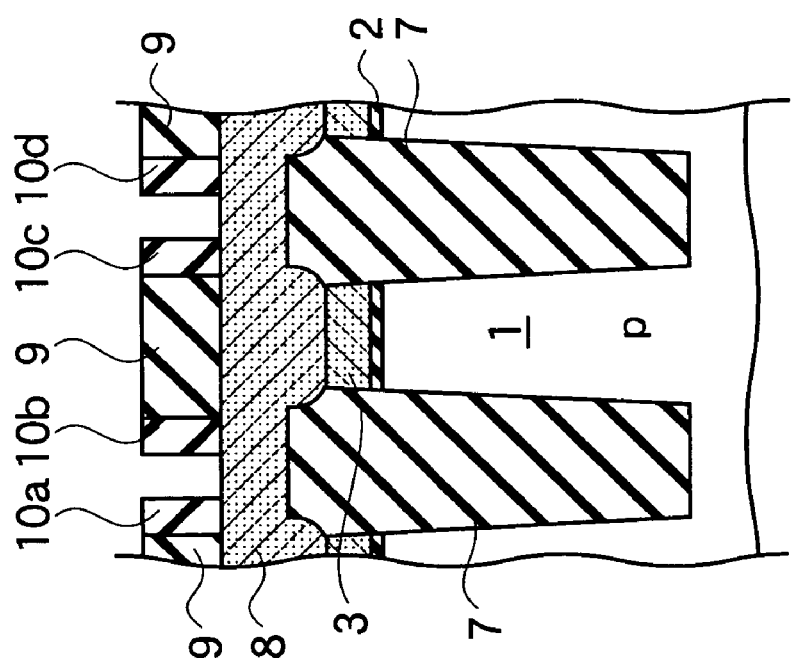
FIG. 10B
FIG. 10A

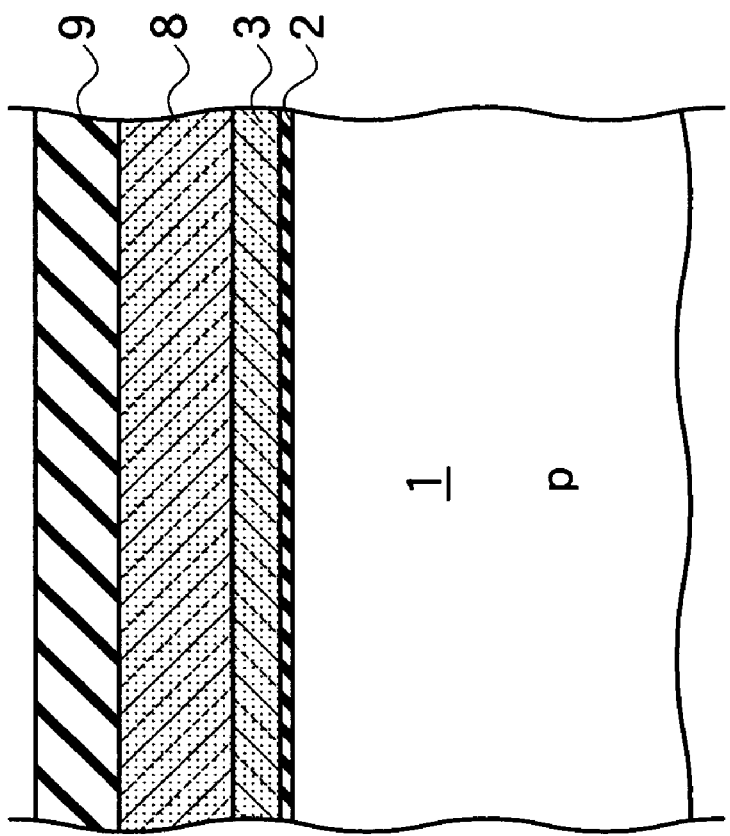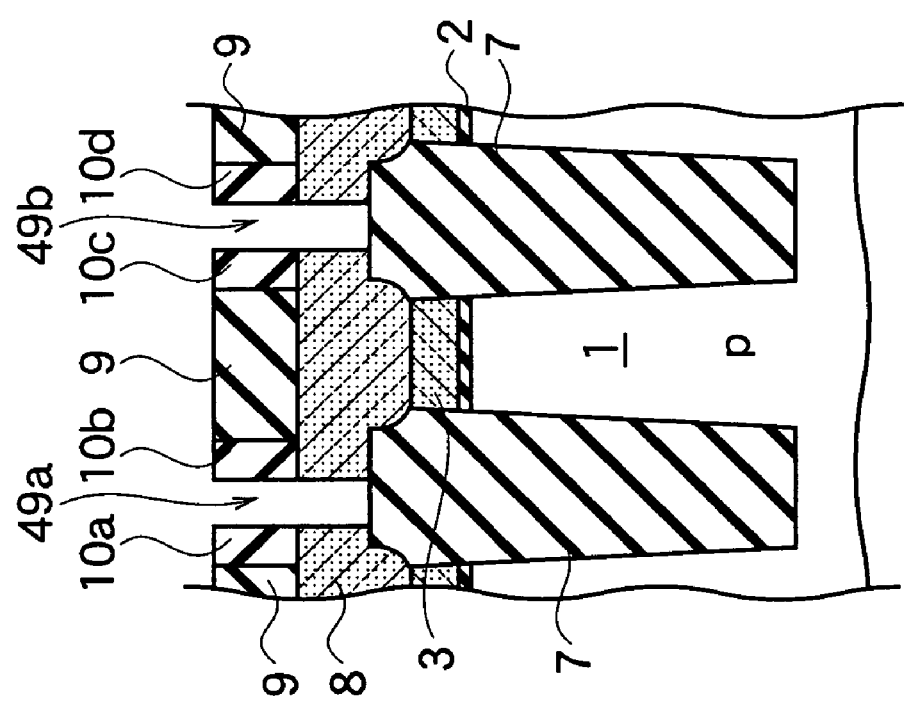
FIG. 11B
FIG. 11A

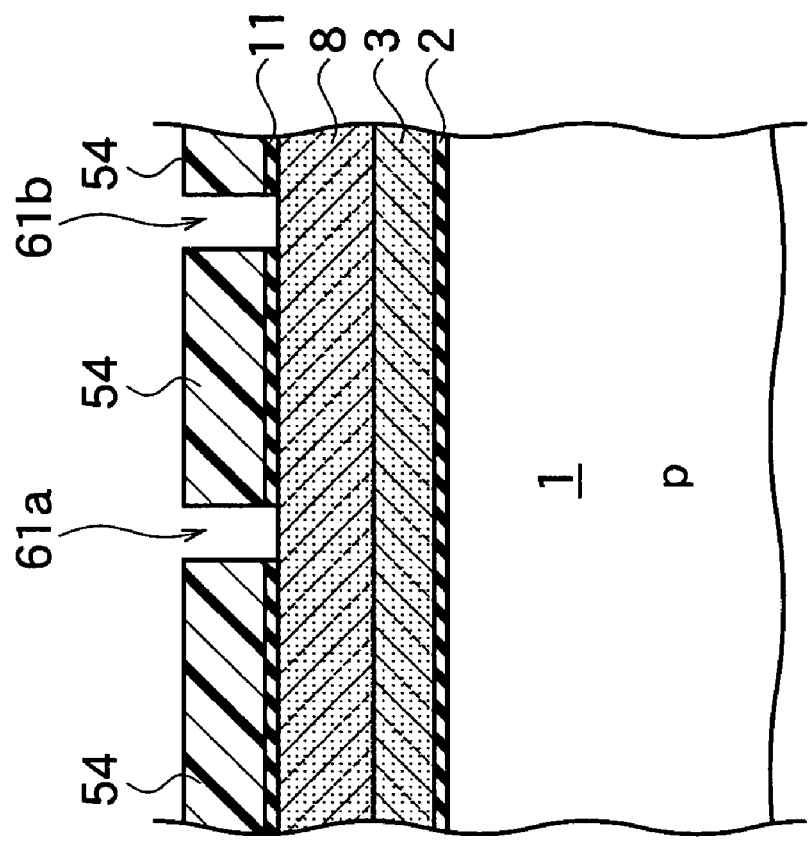
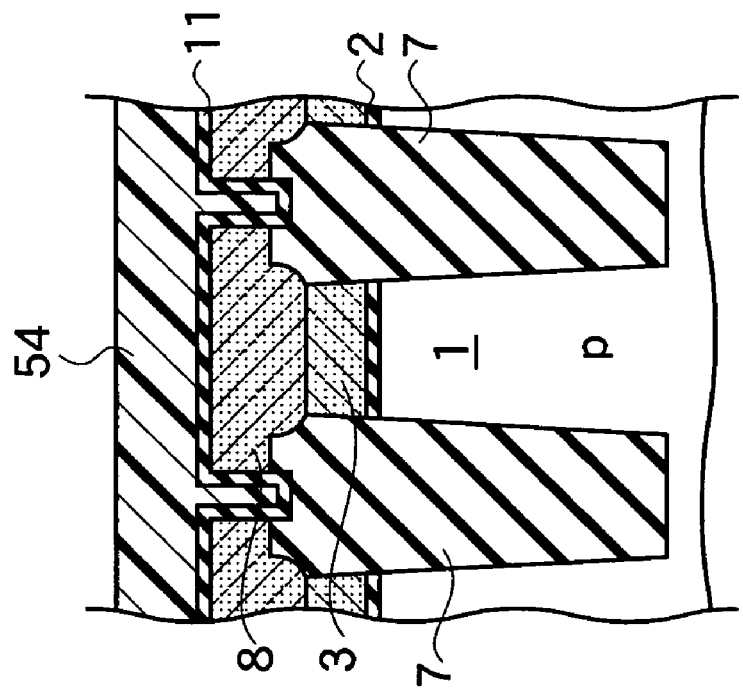

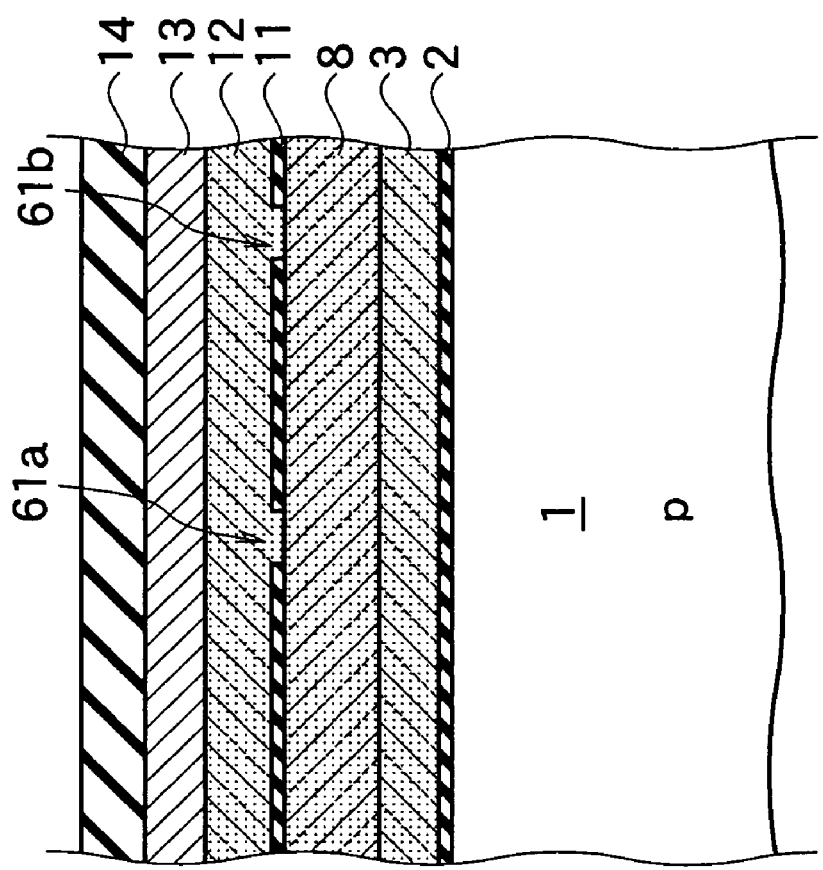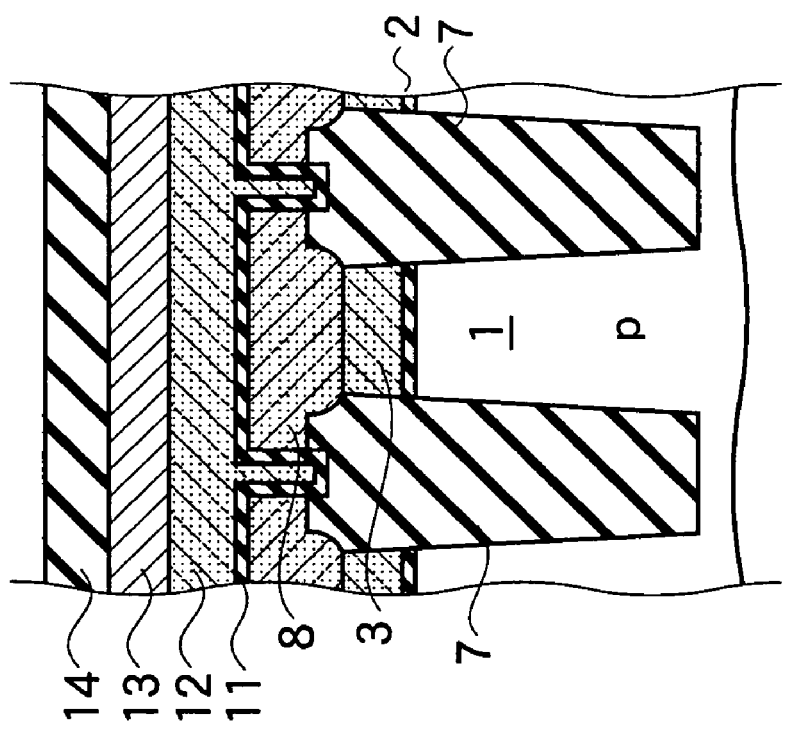

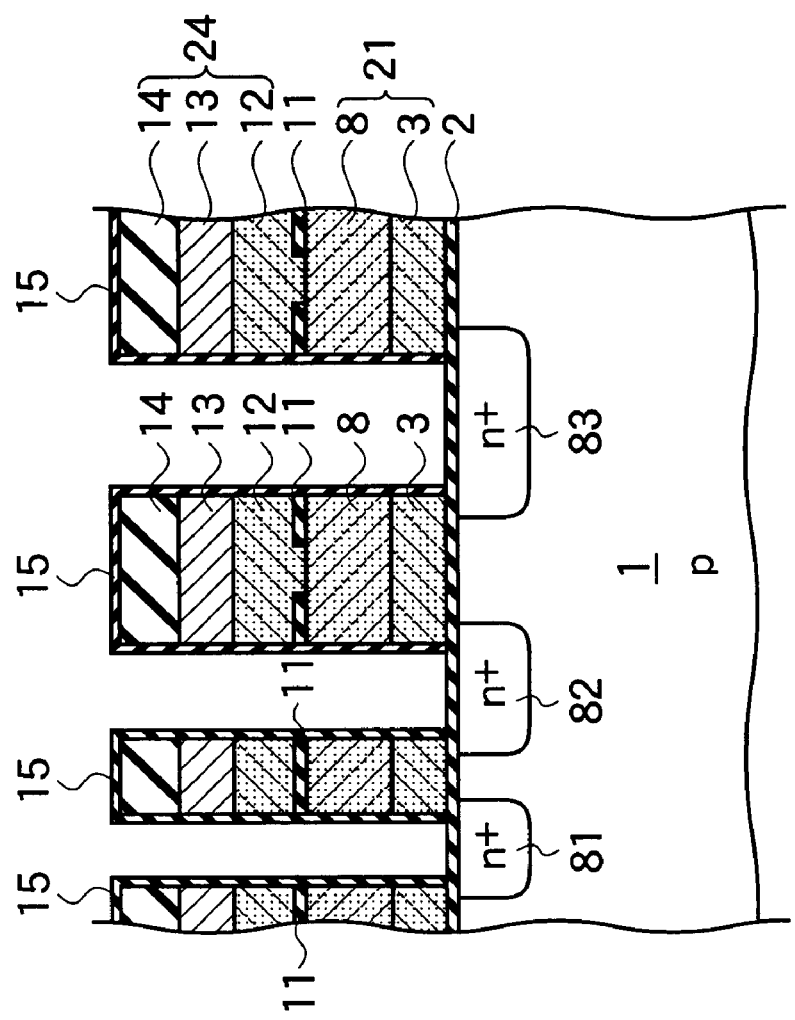

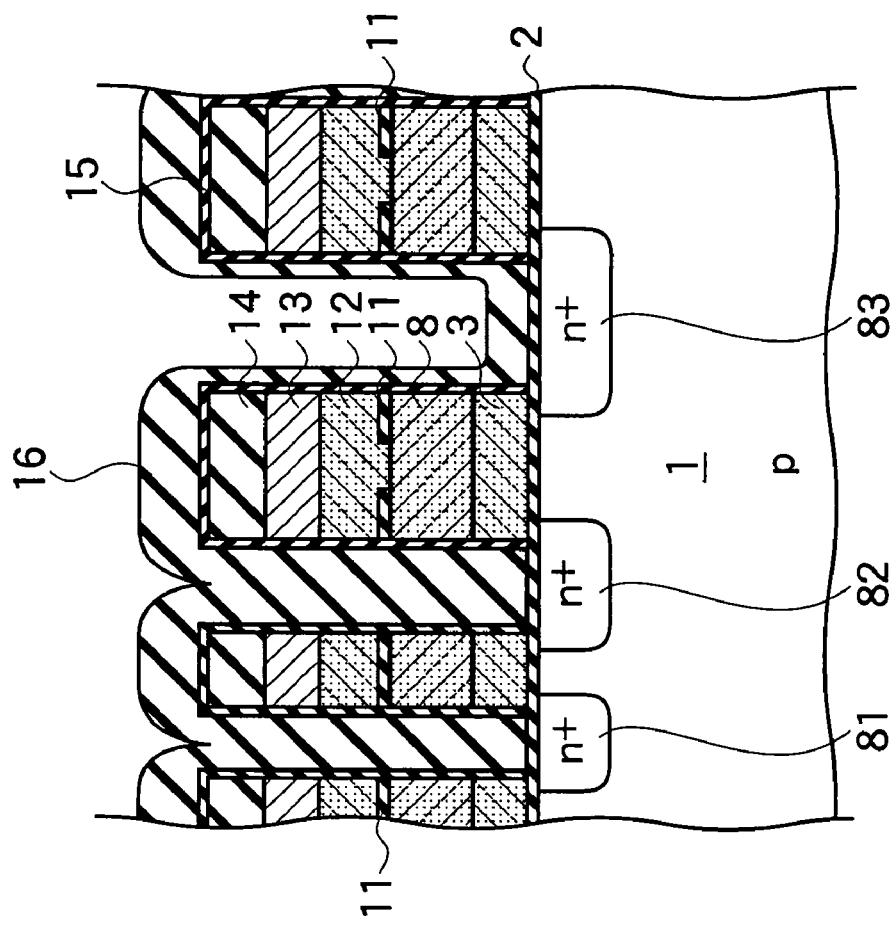
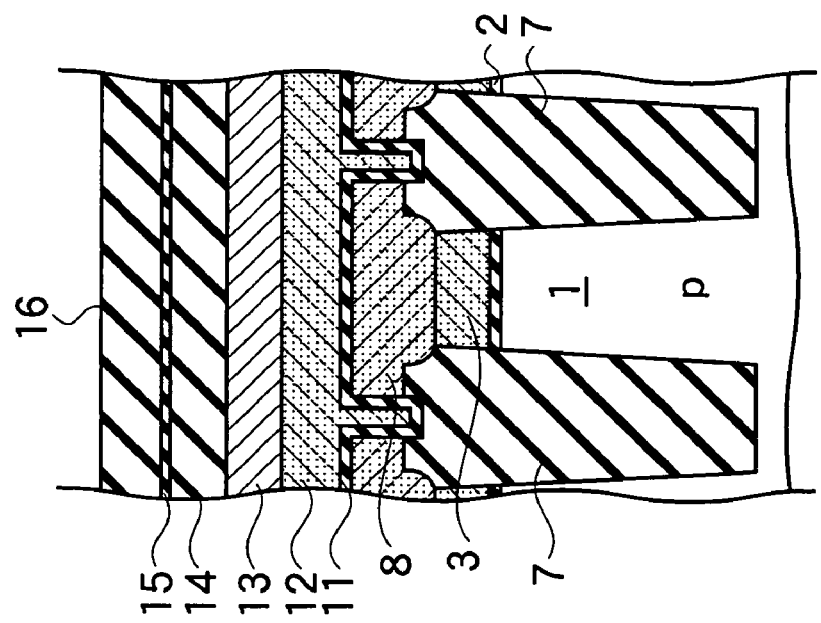

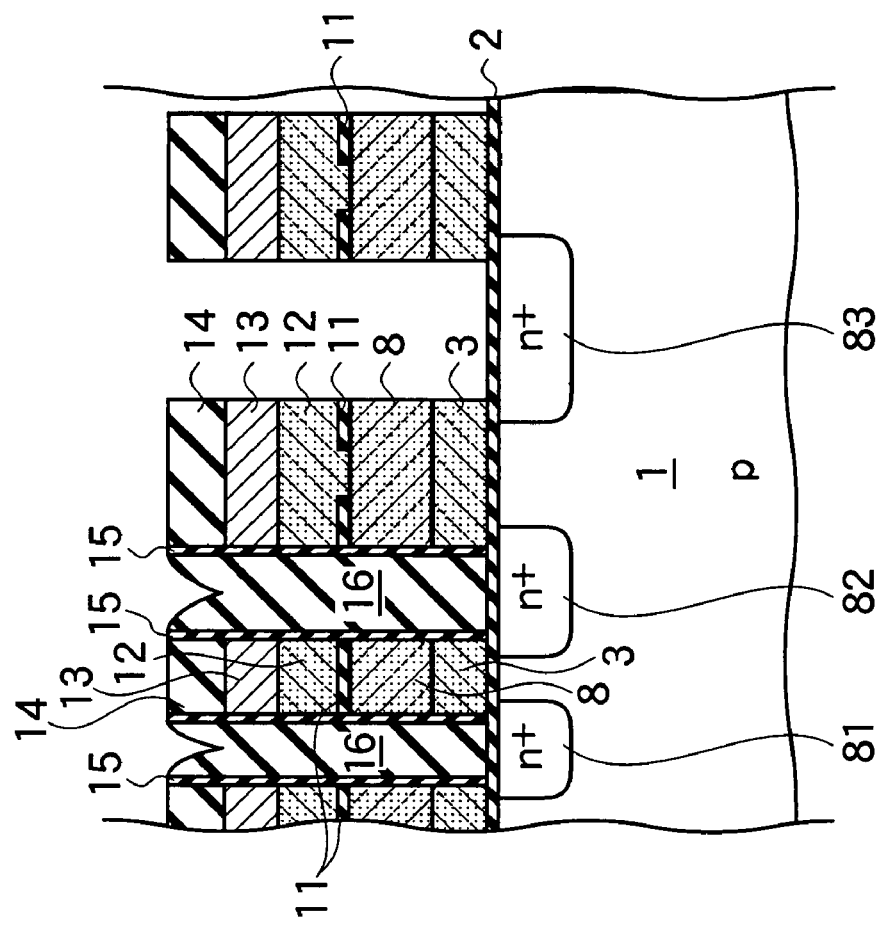
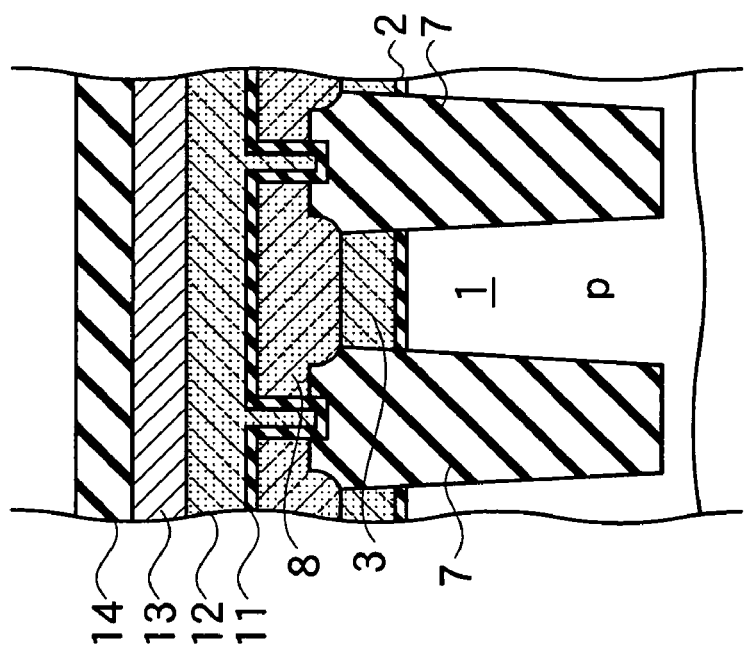
FIG. 17A
FIG. 17B

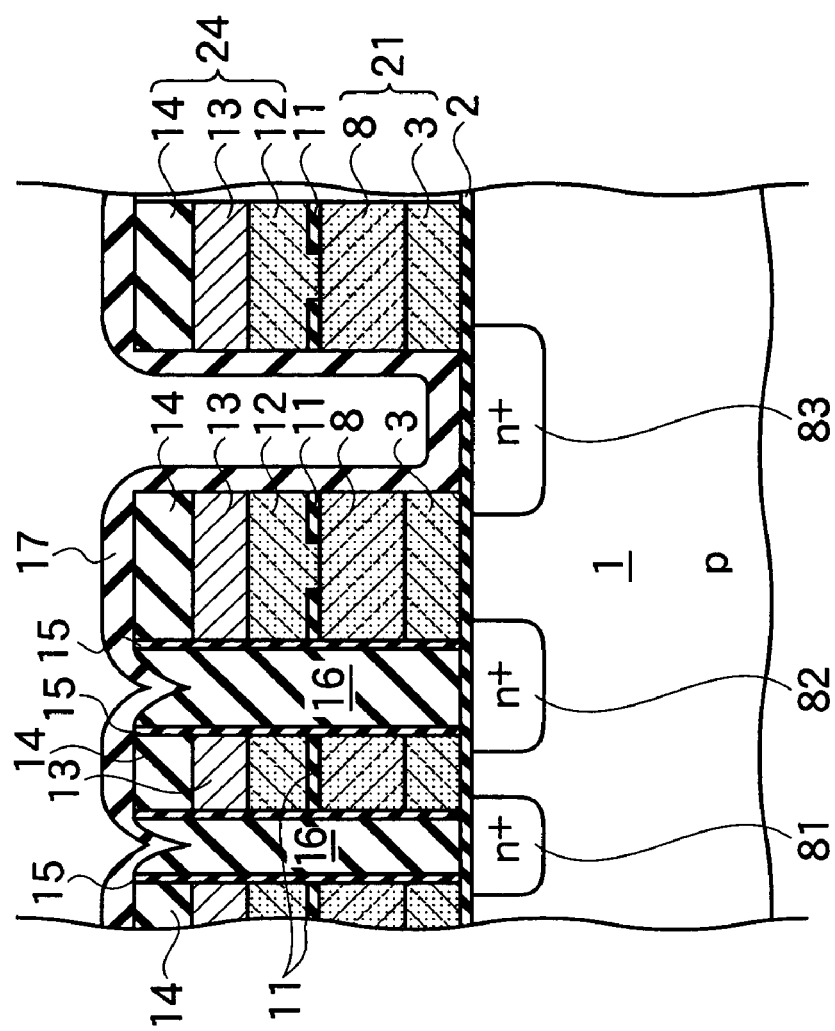
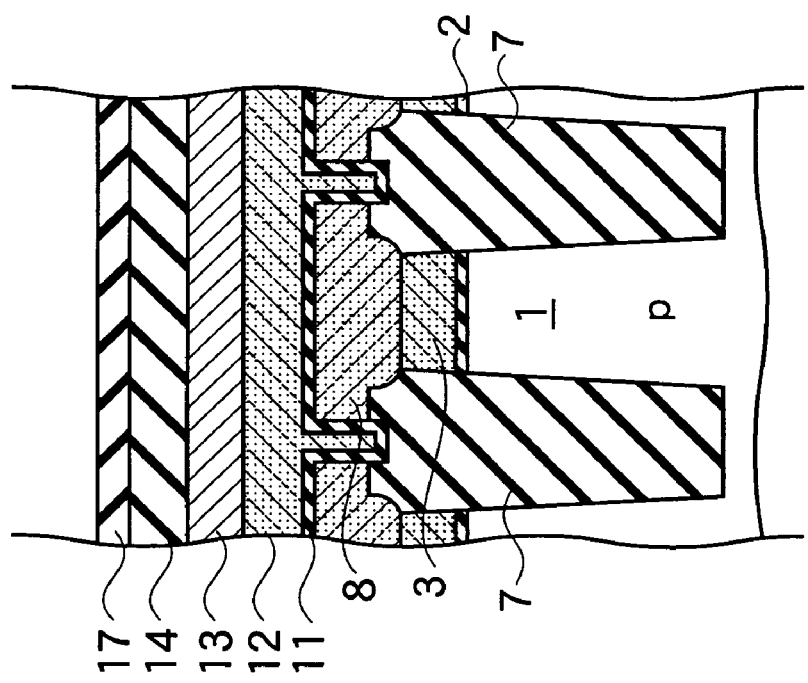
FIG. 18A
FIG. 18B

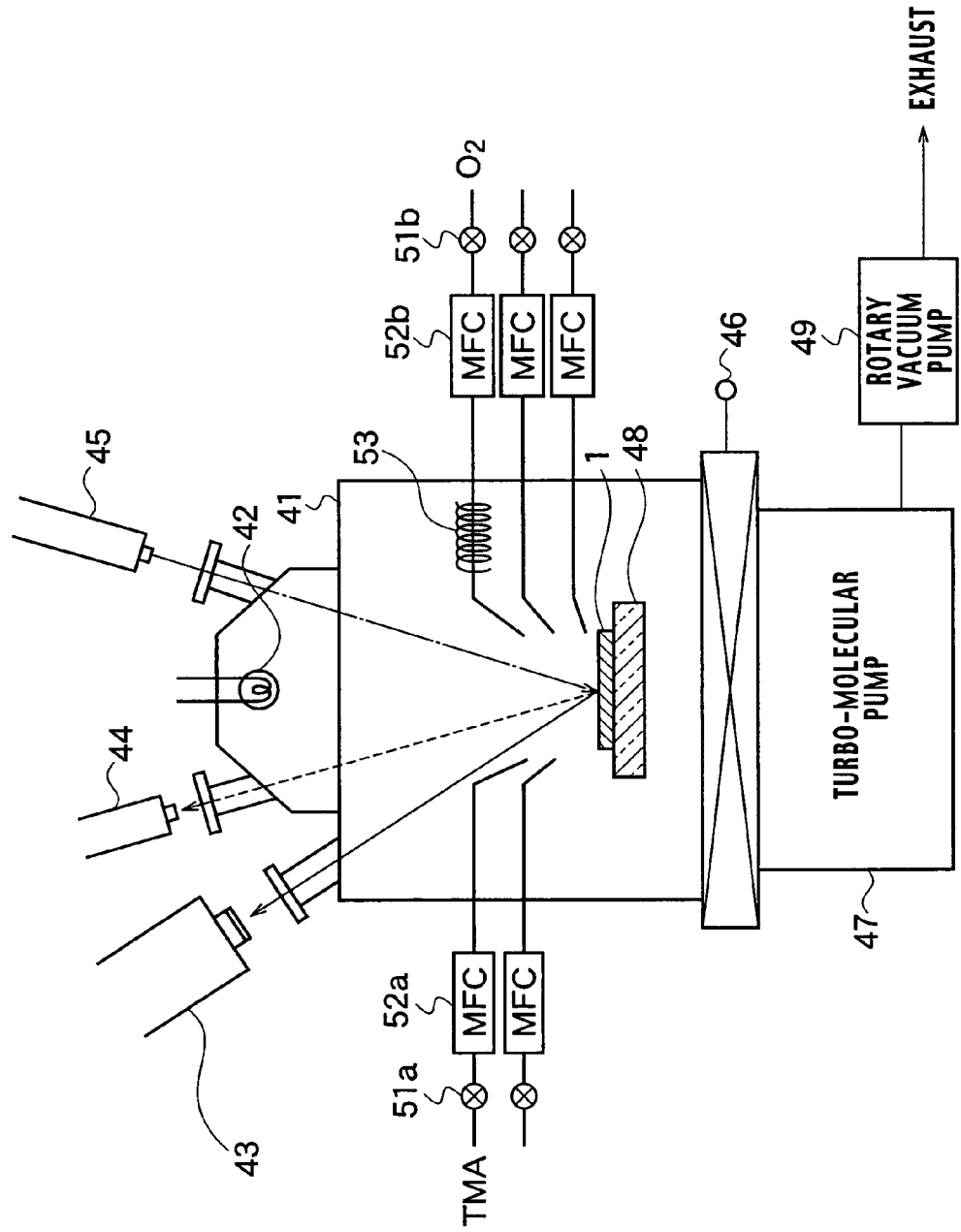

STACKED GATE SEMICONDUCTOR MEMORY

CROSS REFERENCE TO RELATED APPLICATIONS

This application claims benefit of priority under 35 USC 119 based on Japanese Patent Application No. P2004-042622 filed Feb. 19, 2004, the entire contents of which are incorporated by reference herein.

BACKGROUND OF THE INVENTION

1. Field of the Invention

The present invention relates to a semiconductor memory and a fabrication method for the semiconductor memory. In particular, it relates to gate structures of memory cells for the semiconductor memories in which miniaturization of cell size has advanced.

2. Description of the Related Art

In accordance with the advancement of semiconductor technology, especially with the development of microelectronic fabrication technology, miniaturization of memory cells and high integration of semiconductor memories have progressed. However, the miniaturization of memory cells causes problems of non-uniform distortion of the geometries and sizes of the respective memory cells due to processing unevenness, pattern misalignments caused during lithography processes, or the like. Therefore, there is a need to provide electrically erasable programmable read-only memory (EEPROM) capable of suppressing the increase of the dispersion in the respective capacitive coupling ratios among multiple memory cells. In a memory cell matrix in which miniaturization of the memory cells are supposed to be advanced, a specific memory cell implemented by a stacked gate architecture (hereinafter called "the stacked gate memory cell"), whose gate structure encompasses a gate insulator on a p-type silicon substrate, a floating gate electrode stacked on the gate insulator, an inter-electrode dielectric stacked on the floating gate electrode and a control gate electrode stacked on the inter-electrode dielectric, has been proposed in Japanese Patent Application laid-open No. H8-316348. In the proposed stacked gate memory cell, the shape of the gate insulator and that of the inter-electrode dielectric are defined by self-aligned methodology, the gate insulator facing to the inter-electrode dielectric, sandwiching the floating gate electrode between the gate insulator and the inter-electrode dielectric.

To fabricate the stacked gate memory cell disclosed in H8-316348, for example, by thermal oxidation, a 10 nm-thick silicon oxide film, which becomes a gate insulator (tunneling oxide film), is grown across the surface of the p-type silicon substrate. A first polycrystalline silicon film, which becomes a floating gate electrode, is deposited on the gate insulator. Afterwards, the first polycrystalline silicon film, the gate insulator, and the semiconductor substrate are successively etched by a reactive ion etching (RIE) method, using a single etching mask, so as to form device isolation grooves with vertical walls. Next, after deposition of a new silicon oxide film across the resulting surface, which becomes device isolation films, the new silicon oxide film is etched until it reaches the surface of the first polycrystalline silicon film using a chemical mechanical polishing (CMP) method, then the device isolation films are buried in the device isolation grooves so as to achieve a planarized surface. An inter-electrode dielectric made of a stacked ONO film, which is made up of three films: a lower silicon oxide film ($SiO_2$ film), a silicon nitride film ($Si_3N_4$ film), and an upper silicon oxide film ($SiO_2$ film), is then formed across the entire surface. A second polycrystalline silicon film, which becomes a control gate electrode, is then formed on the inter-electrode dielectric. The second polycrystalline silicon film, the inter-electrode dielectric, and the first polycrystalline silicon film are vertically etched to the silicon substrate in order using the RIE method or the like using a single etching mask, so as to form a control gate electrode, an inter-electrode dielectric, and a floating gate electrode. Finally, n-type impurity ions are implanted using the control gate electrode as an implantation mask, and forming n-type diffused regions by a self-aligned methodology. Consequently, the stacked gate memory cells of EEPROM are complete.

In this way, the stacked gate memory cell used for flash memory or the like is fabricated such that the gate insulator (tunneling oxide film), the floating gate electrode, the inter-electrode dielectric, and the control gate electrode are stacked on the silicon substrate (semiconductor substrate) in order. FIG. 1A is an energy band diagram showing energy levels of the semiconductor substrate 1, the gate insulator (tunneling oxide film) 2, the floating gate electrode 21, the inter-electrode dielectric 11, and the control gate electrode 24 at the program operation of the stacked gate memory cell. For the semiconductor substrate 1, the conduction band edge $E_c$ and the valence band edge $E_v$ are represented. For the gate insulator 2 and the inter-electrode dielectric 11, only the conduction band edge is represented. For the floating gate electrode 21 and the control gate electrode 24, a metallic band structure is assumed and Fermi level $E_F$ is represented in FIG. 1A. When a program gate voltage is applied between a silicon substrate 1 and the control gate electrode 24, an electric field established across the gate insulator (tunneling oxide film) 2 generates tunneling current flowing through the gate insulator 2. Consequently, a predetermined amount of charge is stored in the floating gate electrode 21 within a predetermined time, resulting in a "programmed" memory cell. At the time of the program operation, the electric field is also established in the inter-electrode dielectric 11 so the cell structure and the material of the insulator film must be designed so that the amount of tunneling leakage current flowing through the inter-electrode dielectric 11 is negligible.

FIG. 1B is a corresponding energy band diagram illustrating energy levels of the semiconductor substrate 1, the gate insulator (tunneling oxide film) 2, the floating gate electrode 21, the inter-electrode dielectric 11, and the control gate electrode 24 at the erase operation of the stacked gate memory cell. By applying an erase gate voltage, which is reverse of the program gate voltage, the charge stored in the floating gate electrode 21 is discharged to the substrate, resulting in an "erased" memory cell. The program and erase operations generally need application of high program and erase gate voltages of 20 volts or greater so that a sufficient amount of tunneling current can flow through the gate insulator (tunneling insulator film) 2 made of a silicon oxide film or the like. This high voltage operation prevents stacked gate memory cells from being highly integrated, and power dissipation from decreasing.

In 1997 *Symposium on VLSI Technology, Digest of Technical Papers* p. 117, usage of an alumina ($Al_2O_3$) film as the material for the inter-electrode dielectric 11 has been proposed. Since the alumina film has a higher dielectric constant than the stacked ONO film, the capacitance area of the inter-electrode dielectric 11 can be reduced. Therefore, the alumina film is suitable for the miniaturization of cell size.

Due to the same reason, a high dielectric oxide film such as a hafnium (Hf) oxide film, a zirconium (Zr) oxide film, or tantalum (Ta) oxide film, or an insulator film, which is obtained by doping an impurity into a high dielectric oxide film, may be used as the material of the inter-electrode dielectric 11.

However, if the above-mentioned high dielectric oxide film is formed on the floating gate electrode 21 made of silicon, a low dielectric silicon oxide film is formed on the interface between the inter-electrode dielectric 11 and the floating gate electrode 21. The interface low dielectric oxide film is formed during process stages such as cleaning the surface of the floating gate electrode 21, forming a high dielectric insulator film by, for example, CVD method, annealing to improve the film quality after formation of the high dielectric insulator film, and other related processes. In view of this problem, the surface of the floating gate electrode 21 may be nitrided, so as to prevent the formation of the silicon oxide film. Or, by the same reason, the silicon oxide film may be nitrided, so as to increase the dielectric constant of the interface low dielectric oxide film. Although either approach is not proved until actual results come out, it results in formation of an interface insulator 22 with a high barrier height and a lower dielectric constant than that of the inter-electrode dielectric 23, at the interface between the high dielectric inter-electrode dielectric 23 and the floating gate electrode 21.

FIG. 2A is an energy band diagram illustrating energy levels of the semiconductor substrate 1, the gate insulator (tunneling oxide film) 2, the floating gate electrode 21, the interface insulator 22, the inter-electrode dielectric 23, and the control gate electrode 24 at the program operation in this case. For the semiconductor substrate 1, the conduction band edge $E_c$ and the valence band edge $E_v$ are represented. For the gate insulator 2, the interface insulator 22, and the inter-electrode dielectric 23, only the conduction band edge is represented. For the floating gate electrode 21 and the control gate electrode 24, a metallic band structure is assumed and Fermi level $E_F$ is represented in FIG. 2A. When a program gate voltage is applied between the silicon substrate 1 and the control gate electrode 24, a predetermined amount of tunneling current flows through the gate insulator (tunneling oxide film) 2, and the charges are accumulated in the floating gate electrode 21. At this time, since a large voltage difference is established in the low dielectric constant interface insulator 22, effective tunneling distance for the mobile charges (carriers) within the floating gate electrode 21 becomes short, as is apparent through the comparison of FIGS. 1A and 2A. As a result, tunneling current flowing from the floating gate electrode 21 to the control gate electrode 24 increases, which makes storage of a predetermined amount of charge in the floating gate electrode 21 within a predetermined time impossible.

Note that FIG. 2B shows an energy band diagram at the erase operation. Applying the erase gate voltage, which is a reverse of the program gate voltage, discharges the stored charge. At this time, since the leakage current flowing through the inter-electrode dielectric 23 does not increase, the erase operation is successful.

As described above, since high program and erase gate voltages are needed for the earlier stacked gate memory cells, achievement of highly integrated stacked gate memory cells with reduced power dissipation is difficult. In addition, since tunneling current flowing from the floating gate electrode 21 to the control gate electrode 24 increases due to the presence of a low dielectric interface insulator 22, the programming speed decreases, or a stable and high performance program operation cannot be carried out.

SUMMARY OF THE INVENTION

An aspect of the present invention inheres in a semiconductor memory embracing a plurality of memory cell transistors, each of the memory cell transistors encompassing (a) a substrate; (b) a gate insulator stacked on the substrate, configured to enable tunneling of electrons through the gate insulator; (c) a floating gate electrode stacked on the gate insulator, configured to accumulate electron charges; (d) an inter-electrode dielectric stacked on the floating gate electrode incorporating a positive charge layer, distribution of the positive charge layer being localized in the lower half of the inter-electrode dielectric; and (e) a control gate electrode stacked on the inter-electrode dielectric.

Another aspect of the present invention inheres in a semiconductor memory embracing a plurality of memory cell transistors, each of the memory cell transistors encompassing (a) a substrate; (b) a gate insulator stacked on the substrate, configured to enable tunneling of electrons through the gate insulator; (c) a floating gate electrode stacked on the gate insulator, configured to accumulate electron charges; (d) an inter-electrode dielectric stacked on the floating gate electrode incorporating a positive charge layer, electron charge density in the positive charge layer lie between $1\times10^{12}$ cm$^{-2}$ and $6\times10^{16}$ cm$^{-2}$; and (e) a control gate electrode stacked on the inter-electrode dielectric.

Still another aspect of the present invention inheres in a semiconductor memory embracing a plurality of memory cell transistors, each of the memory cell transistors encompassing (a) a substrate; (b) a gate insulator stacked on the substrate, configured to enable tunneling of electrons through the gate insulator; (c) a floating gate electrode stacked on the gate insulator, configured to accumulate electron charges; (d) an interface insulator stacked on the floating gate electrode incorporating a positive charge layer, distribution of the positive charge layer being localized in the lower half of the interface insulator; (e) an inter-electrode dielectric stacked on the interface insulator having a dielectric constant larger than the dielectric constant of the interface insulator; and (f) a control gate electrode stacked on the inter-electrode dielectric.

Yet still another aspect of the present invention inheres in semiconductor memory embracing a plurality of memory cell transistors, each of the memory cell transistors encompassing (a) a substrate; (b) a gate insulator stacked on the substrate, configured to enable tunneling of electrons through the gate insulator; (c) a floating gate electrode stacked on the gate insulator, configured to accumulate electron charges; (c) an interface insulator stacked on the floating gate electrode incorporating a positive charge layer, electron charge density in the positive charge layer lies between $1\times10^{12}$ cm$^{-2}$ and $6\times10^{16}$ cm$^{-2}$; (d) an inter-electrode dielectric stacked on the interface insulator having a dielectric constant larger than the dielectric constant of the interface insulator; and (e) a control gate electrode stacked on the inter-electrode dielectric.

Yet still another aspect of the present invention inheres in a method for manufacturing a semiconductor memory embracing a plurality of memory cell transistors, each of the memory cell transistors embracing a gate insulator stacked on a substrate, configured to enable tunneling of electrons through the gate insulator, a floating gate electrode stacked on the gate insulator, an inter-electrode dielectric stacked on the floating gate and a control gate electrode stacked on the inter-electrode dielectric, the method encompassing (a) stacking a lower layer of the inter-electrode dielectric on the floating gate electrode by first growth condition for growing a stoichiometric composition of the inter-electrode dielectric;

(b) stacking a middle layer of the inter-electrode dielectric on the lower layer by second growth condition for growing a non-stoichiometric composition of the inter-electrode dielectric; and (c) stacking an upper layer of the inter-electrode dielectric on the middle layer by the first growth condition with a thickness larger than the sum of the thickness of the lower and middle layers, whereby the middle layer generates a positive charge layer in the inter-electrode dielectric, the positive charge layer is localized in the lower half of the inter-electrode dielectric.

Yet still another aspect of the present invention inheres in a method for manufacturing a semiconductor memory embracing a plurality of memory cell transistors, each of the memory cell transistors embracing a gate insulator stacked on a substrate, configured to enable tunneling of electrons through the gate insulator, a floating gate electrode stacked on the gate insulator, an inter-electrode dielectric stacked on the floating gate and a control gate electrode stacked on the inter-electrode dielectric, the method encompassing (a) stacking the inter-electrode dielectric on the floating gate electrode; and (b) implanting boron ions, selecting acceleration energy of the boron ions so that a projected range of the boron ions is larger than half of the thickness of the inter-electrode dielectric, a positive charge layer is generated by the implanted boron ions in the inter-electrode dielectric, the positive charge layer is localized in the lower half of the inter-electrode dielectric.

BRIEF DESCRIPTION OF THE DRAWINGS

Various embodiments of the present invention will be described with reference to the accompanying drawings. It is to be noted that the same or similar reference numerals are applied to the same or similar parts and elements throughout the drawings, and the description of the same or similar parts and elements will be omitted or simplified.

Generally and as it is earlier in the representation of semiconductor devices, it will be appreciated that the various drawings are not drawn to scale from one figure to another nor inside a given figure, and in particular that the layer thicknesses are arbitrarily drawn for facilitating the reading of the drawings.

FIG. 4 shows a schematic circuit structure of the semiconductor memory according to a first embodiment of the present invention;

FIGS. 6A and 6B are schematic cross sectional views showing part of a memory cell array of the semiconductor memory according to the first embodiment of the present invention; wherein FIG. 6A is a cross sectional view taken on line VB—VB in FIG. 5, and FIG. 6B is a cross sectional view taken on line VA—VA in FIG. 5;

FIGS. 8A and 8B are process flow cross sections explaining a fabrication method for the semiconductor memory according to the first embodiment of the present invention; wherein FIG. 8A is a cross sectional view cut along the bit-line direction corresponding to the cross sectional view, which is taken on line VB—VB in FIG. 5, and FIG. 8B is a cross sectional view cut along the word-line direction corresponding to the cross sectional view, which is taken on line VA—VA in FIG. 5;

FIG. 9A is a subsequent process flow cross section cut along the bit-line direction, after the process stage shown in FIG. 8A, and FIG. 9B is a subsequent process flow cross section cut along the word-line direction, after the process stage shown in FIG. 8B;

FIG. 10A is a subsequent process flow cross section cut along the bit-line direction, after the process stage shown in FIG. 9A, and FIG. 10B is a subsequent process flow cross section cut along the word-line direction, after the process stage shown in FIG. 9B;

FIG. 11A is a subsequent process flow cross section cut along the bit-line direction, after the process stage shown in FIG. 10A, and FIG. 11B is a subsequent process flow cross section cut along the word-line direction, after the process stage shown in FIG. 10B;

FIG. 13A is a subsequent process flow cross section cut along the bit-line direction, after the process stage shown in FIG. 12A, and FIG. 13B is a subsequent process flow cross section cut along the word-line direction, after the process stage shown in FIG. 12B;

FIG. 14A is a subsequent process flow cross section cut along the bit-line direction, after the process stage shown in FIG. 13A, and FIG. 14B is a subsequent process flow cross section cut along the word-line direction, after the process stage shown in FIG. 13B;

FIG. 15A is a subsequent process flow cross section cut along the bit-line direction, after the process stage shown in FIG. 14A, and FIG. 15B is a subsequent process flow cross section cut along the word-line direction, after the process stage shown in FIG. 14B;

FIG. 16A is a subsequent process flow cross section cut along the bit-line direction, after the process stage shown in FIG. 15A, and FIG. 16B is a subsequent process flow cross section cut along the word-line direction, after the process stage shown in FIG. 15B;

FIG. 17A is a subsequent process flow cross section cut along the bit-line direction, after the process stage shown in FIG. 16A, and FIG. 17B is a subsequent process flow cross section cut along the word-line direction, after the process stage shown in FIG. 16B;

FIG. 18A is a subsequent process flow cross section cut along the bit-line direction, after the process stage shown in FIG. 17A, and FIG. 18B is a subsequent process flow cross section cut along the word-line direction, after the process stage shown in FIG. 17B;

FIG. 20 is a schematic diagram explaining the outline of an atomic layer deposition (ALD) apparatus;

DETAILED DESCRIPTION OF THE EMBODIMENTS

In the following description specific details are set forth, such as specific materials, process and equipment in order to provide a thorough understanding of the present invention. It will be apparent, however, to one skilled in the art that the present invention may be practiced without these specific details. In other instances, well-known manufacturing materials, process and equipment are not set forth in detail in order not to unnecessary obscure the present invention.

Prepositions, such as "on", "above" and "under" are defined with respect to a planar surface of the substrate, regardless of the orientation in which the substrate is actually held. Similarly, "upper" and "lower" are defined with respect to the planar surface of the substrate, regardless of the orientation in which the substrate is actually held. A layer is on another layer even if there are intervening layers.

(Illustrative Operation Principle)

Before beginning to explain a semiconductor memory according to first to fourth embodiments of the present invention, the operational principle of the semiconductor memories according to these embodiments is briefly described using energy band diagrams in FIGS. 3A to 3D, focusing on a lower part of the stacked gate structure of a memory cell transistor, namely to a sub-structure implemented by a silicon (Si) semiconductor substrate 1, a gate insulator (tunneling oxide film) 2 stacked on the Si semiconductor substrate 1, and a gate electrode (floating gate electrode) 21 stacked on the gate insulator 2. For the semiconductor substrate 1, the conduction band edge $E_c$ and the valence band edge $E_v$ are represented. In the energy band diagram of the gate insulator 2, the upper line represents the conduction band edge, and the lower line represents the valence band edge. For the floating gate electrode 21, a metallic band structure is assumed and Fermi level $E_F$ is represented in FIGS. 3A to 3D.

Figure 1A:
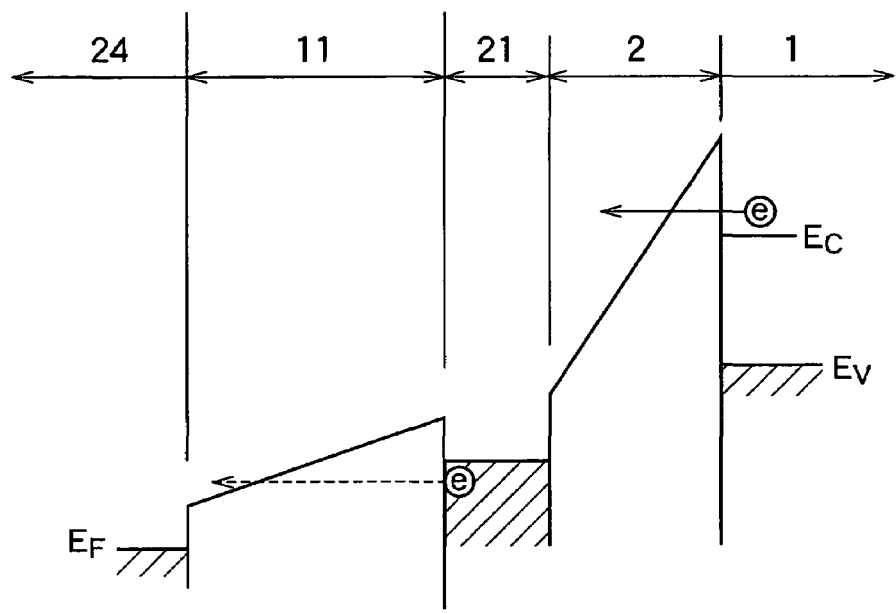
FIG. 1A is an energy band diagram explaining program operation in a memory cell structure of a earlier semiconductor memory.
Figure 1B:
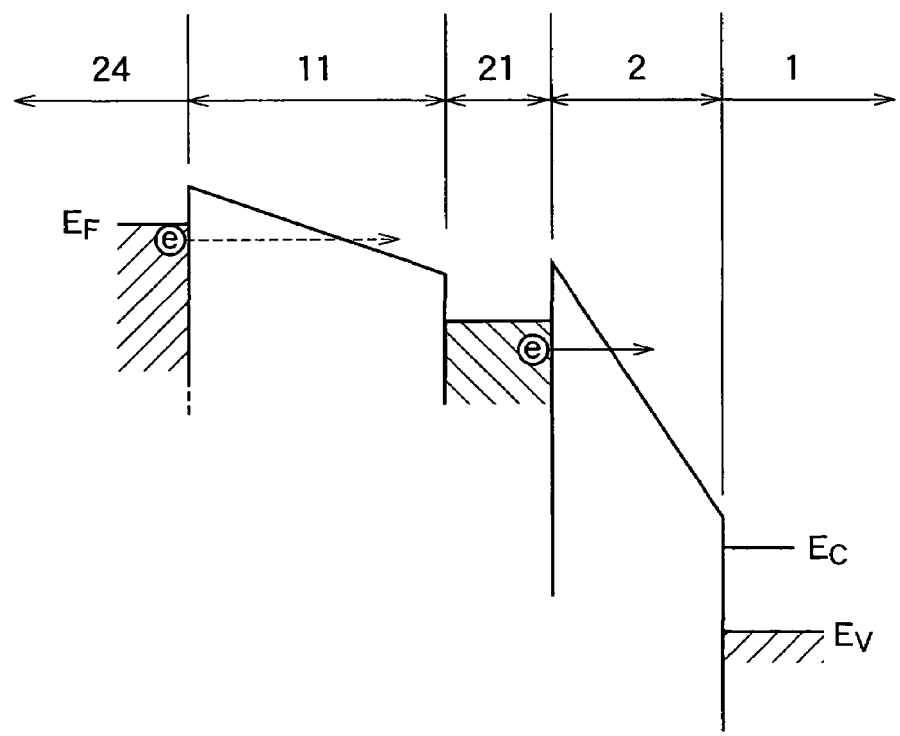
FIG. 1B is a corresponding energy band diagram explaining erase operation in the memory cell structure of the earlier semiconductor memory.
Figure 2A:
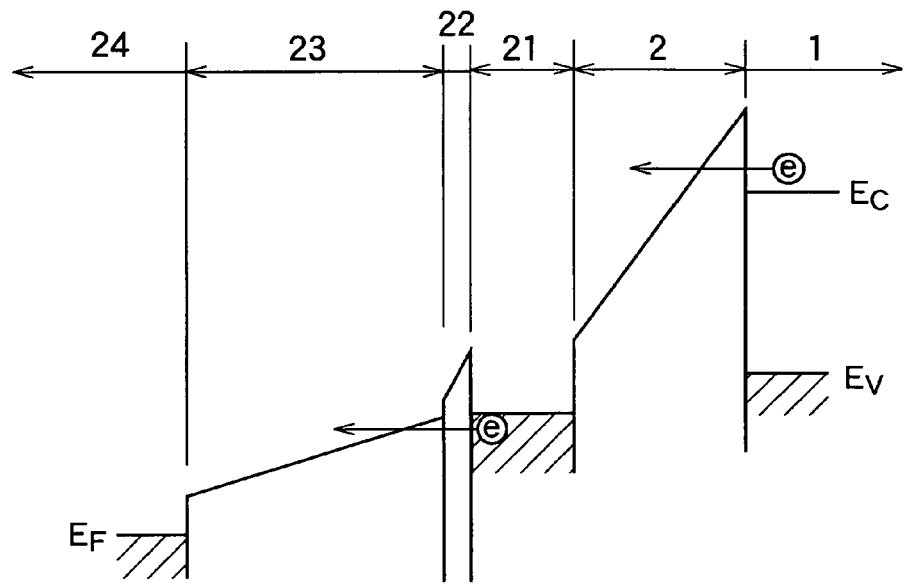
FIG. 2A is an energy band diagram explaining program operation in a memory cell structure of another earlier semiconductor memory.
Figure 2B:
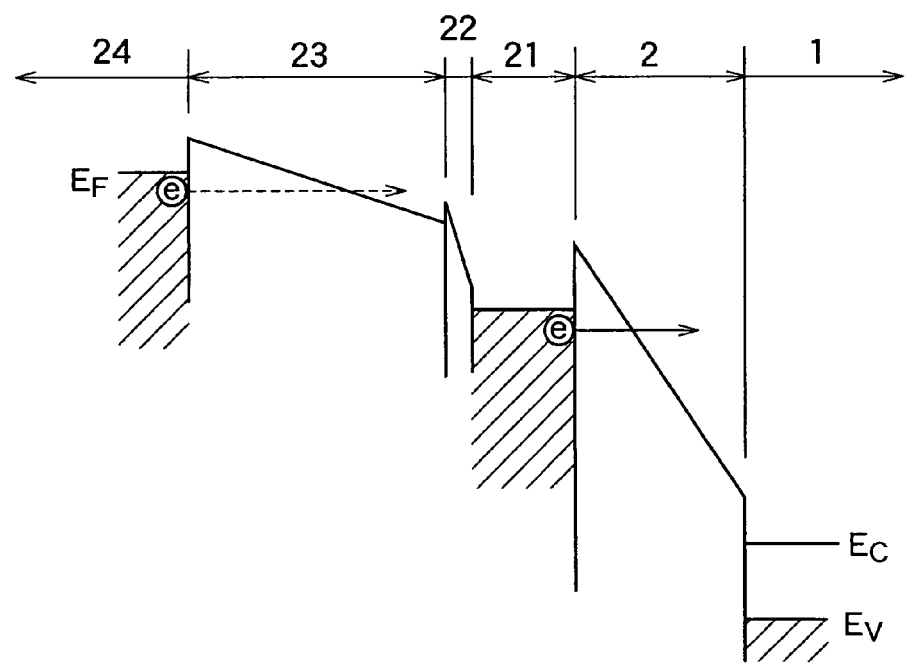
FIG. 2B is a corresponding energy band diagram explaining erase operation in the memory cell structure explained in FIG. 2A.
Figure 3A:
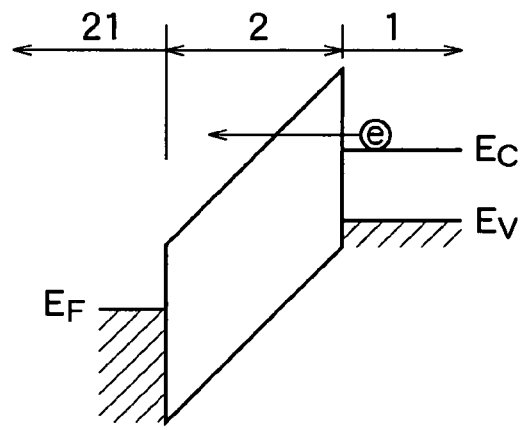
FIGS. 3A to 3D are an energy band diagrams explaining the principle of operations in a memory cell structure of a semiconductor memory corresponding to first to the fourth embodiments of the present invention.

FIG. 3A shows an energy band diagram illustrating the structure of the gate insulator 2 and the floating gate electrode 21 stacked on the Si semiconductor substrate 1 in the case where no electron charge is existing in the gate insulator 2. In FIG. 3A, when voltage is applied between the floating gate electrode 21 and the Si semiconductor substrate 1, an electric field is established across the gate insulator 2, and the establishment of the electric field in the gate insulator 2 enables a tunneling current (Fowler-Nordheim current) to flow in the gate insulator 2.

Figure 3B:
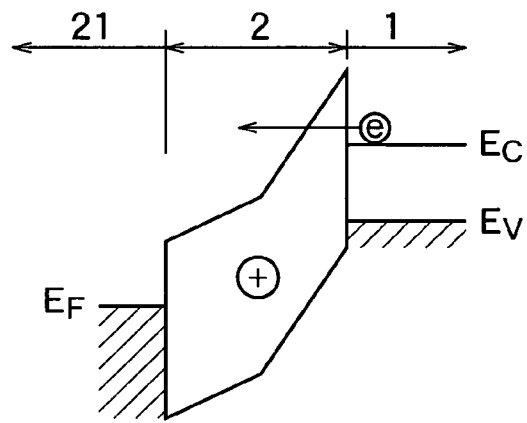

FIG. 3B is a corresponding energy band diagram illustrating the case where positive charges exist so as to form a fixed positive charge layer in the gate insulator 2, in the case when applying the same voltage as in FIG. 3A. FIG. 3B shows that an electric field distribution ascribable to the presence of the fixed positive charge layer bends the energy band diagram of the gate insulator 2, and the slopes of the conduction band and valence band become steeper at the interface side of the semiconductor substrate 1. The energy band bending increases the amount of tunneling current passing through the gate insulator 2.

Figure 3C:
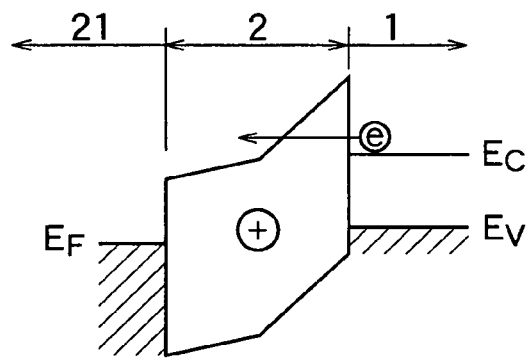

FIG. 3C is another corresponding energy band diagram illustrating the case of having adjusted the applied voltage so that the amount of tunneling current is equal to that in FIG. 3A in the presence of the fixed positive charge layer. In other words, since the applied voltage is decreased so that the amount of tunneling current is the same as that in FIG. 3A, the electric field influencing the gate insulator 2 on the interface side of the floating gate electrode 21 decreases. In this way, by generating positive charges in the gate insulator 2, the applied voltage can be decreased so as to weaken the electric field in the upper-level region of the gate insulator 2, which is upper than the position of the fixed positive charge layer, and provides a desired amount of tunneling current.

Figure 3D:
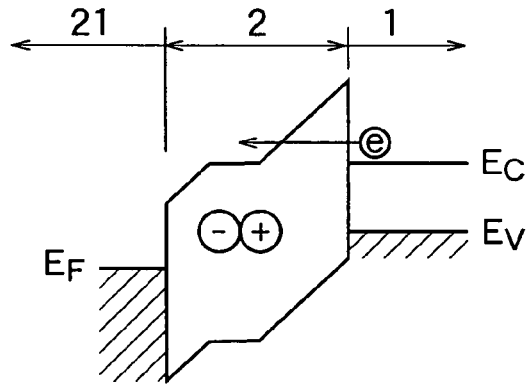

FIG. 3D is still another corresponding energy band diagram illustrating the case of negative charges existing further so as to form a fixed negative charge layer in the region downstream of the tunneling current from the fixed positive charge layer. That is, a fixed negative charge layer is disposed above the fixed positive charge layer defined with respect to a direction perpendicular to the planar surface of the Si semiconductor substrate 1. FIG. 3D shows that an electric field distribution ascribable to the presence of the fixed positive and negative charge layers bends the energy band diagram at two positions in the gate insulator 2, and three different slopes of the conduction band and valence band are existing in the gate insulator 2. The slopes of the conduction band and valence band around the central region in the gate insulator 2 are relaxed to be flat. Even in this complicated band bending case, the applied voltage decreases to be less than that in FIG. 3A. In other words, by providing the positive charge layer and the negative charge layer separate from each other at a certain distance, the applied voltage decreases, weakening the electric field within the central region between the positive and negative charge layers and provides a desired amount of tunneling current.

First Embodiment

FIG. 4 is a block diagram illustrating a schematic circuitry of NAND flash memory as a semiconductor memory according to a first embodiment of the present invention. Peripheral circuits (91, 92, 93, and 94) such as a top page buffer 91, a bottom page buffer 92, a left row decoder/charge pump 93, and a right row decoder/charge pump 94 are arranged on the periphery of a memory cell matrix 90.

Figure 5:
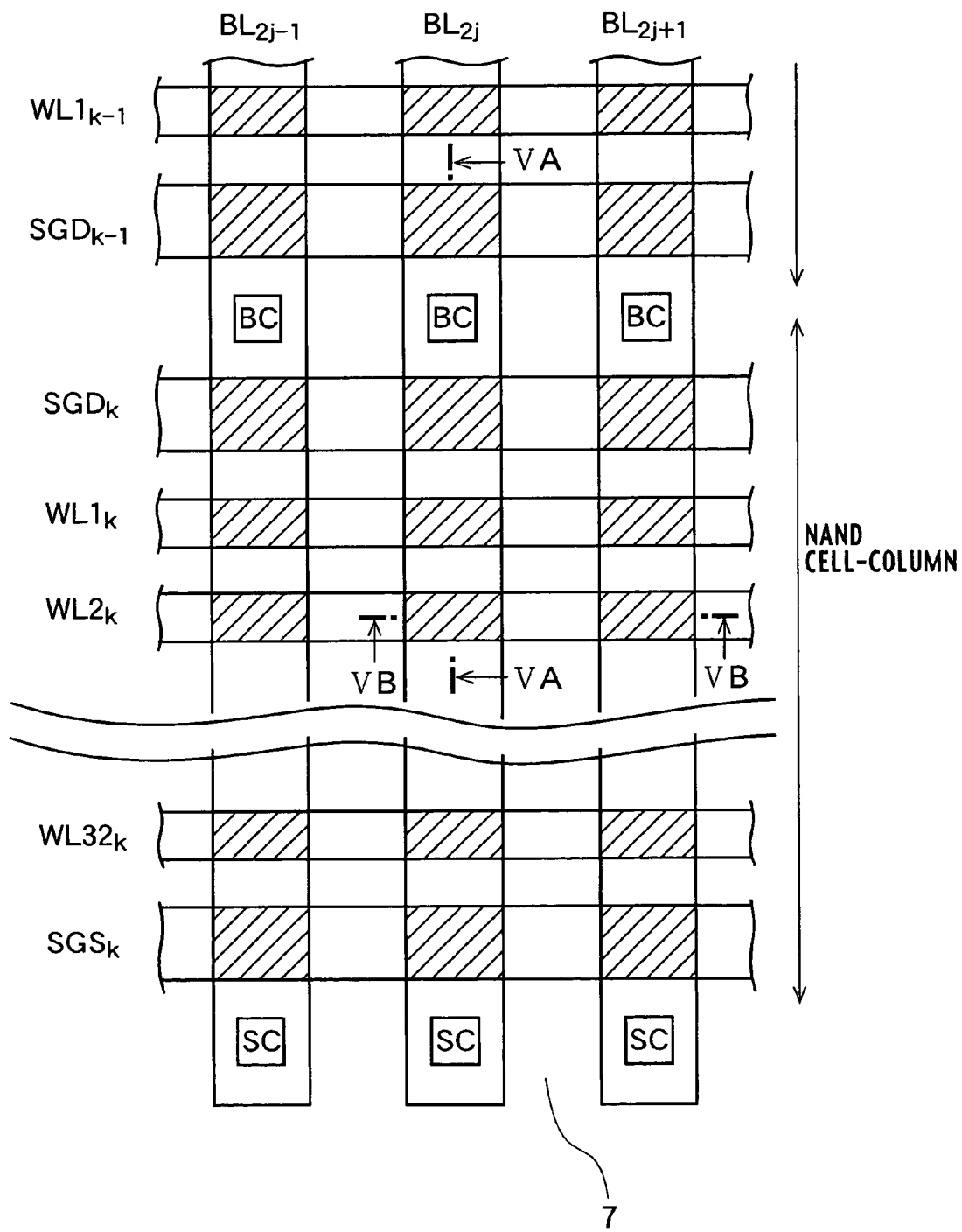
FIG. 5 is a schematic aerial view showing part of a memory cell array of the semiconductor memory according to the first embodiment of the present invention.

As shown in FIGS. 4 and 5, the memory cell matrix 90 embraces plural cell columns (NAND cell columns) extending along a column-direction, the cell columns are arranged along a row-direction in parallel. Each of the cell columns is implemented by plural memory cell transistors serially arranged along the column-direction. Each of the memory cell transistors has a charge accumulation layer whose electric charge accumulation level is configured to be controlled separately. The horizontal lines connected to all the memory cell transistors in corresponding rows are called "the word lines $WL1_k$, $WL2_k$, ..., $WL32_k$, $WL1_{k-1}$, ...". The word lines $WL1_k$ to $WL32_k$ are connected to all the memory cell transistors in plural k-th NAND cell columns, and the word lines $WL1_{k-1}$, ... are connected to all the memory cell transistors in plural k−1-th NAND cell columns. In other words, the semiconductor memory according to the first embodiment of, as shown in FIGS. 4 and 5, encompasses plural word lines $WL1_k$, $WL2_k$, ..., $WL32_k$, $WL1_{k-1}$, arranged along the row-direction, and plural bit lines $BL_{2j-1}$, $BL_{2j}$, $BL_{2j+1}$, arranged along the column-direction orthogonal to these word lines $WL1_k$, $WL2_k$, ..., $WL32_k$, $WL1_{k-1}$, .... The vertical lines $BL_{2j-1}$, $BL_{2j}$, $BL_{2j+1}$, ..., along which the data flow in and out of the memory cell transistors, are called "bit lines". In addition, memory cell transistors, which have respective charge accumulation layers whose electric charge accumulation levels can be controlled separately using plural word lines $WL1_k$, $WL2_k$, ..., $WL32_k$, $WL1_{k-1}$, ..., are arranged along the row-direction in FIGS. 4 and 5.

FIGS. 4 and 5 illustrate the case where 32 memory cell transistors are arranged along the column-direction so as to implement each of the cell columns. A pair of select transistors, which select a group of memory cell transistors serially arranged in the corresponding cell column, are arranged at both ends of the respective cell columns. The plural cell columns are arranged in parallel, close to each other. Upper select gate line $SGD_K$ of the k-th NAND cell columns is connected to the respective gates of upper select transistors of the corresponding k-th NAND cell columns. Lower select gate line $SGS_K$ of the k-th NAND cell columns is connected to the respective gates of the lower select transistors of the corresponding k-th NAND cell columns. Further, lower select gate line $SGD_{K-1}$ of the adjacent k−1-th NAND cell columns is connected to the respective gates of the lower select transistors of the corresponding k−1-th NAND cell columns. The drain electrodes of the upper select transistors of the corresponding k-th NAND cell columns and the lower select transistors of the corresponding k−1-th NAND cell columns are connected to the corresponding bit lines $BL_{2j-1}$, $BL_{2j}$, $BL_{j+1}$, .... The source electrodes of the upper select transistors of the corresponding k-th NAND cell columns are connected to the drain electrodes of the uppermost memory cell transistor in the corresponding k-th NAND cell columns. The source electrodes of the lower select transistors of the corresponding k−1-th NAND cell columns are connected to the drain electrodes of the lowermost memory cell transistor in the corresponding k−1-th NAND cell columns. The drain electrodes of the lower select transistors of the corresponding k-th NAND cell columns are connected to the source electrodes of the lowermost memory cell transistor in the corresponding k-th NAND cell columns, and the source electrodes of the lower select transistors of the corresponding k-th NAND cell columns are connected to the common source line CSK of the corresponding k-th NAND cell columns. As it will be appreciated, the terms drain and source can be exchanged without modifying the structure itself.

The top page buffer 91 and the bottom page buffer 92 are respectively connected to the bit lines $BL_{2j-1}$, $BL_{2j}$, $BL_{2j+1}$, . . . . The top page buffer 91 and the bottom page buffer 92 buffer respectively the cell column information read out respectively from corresponding memory cell transistors. The left row decoder/charge pump 93 and the right row decoder/charge pump 94 are connected to the word lines $WL1_k$, $WL2_k$, . . . , $WL32_k$, $WL1_{k-1}$, . . . , respectively, and control the electric charge accumulation state of each memory cell transistor implementing the cell column.

FIG. 6A is a schematic cross sectional view showing part of the memory cell matrix 90 taken on line VB—VB in FIG. 5, FIG. 6B is a schematic cross sectional view showing part of the memory cell matrix 90 taken on line VA—VA in FIG. 5. In other words, FIG. 6A shows a cross sectional view cut along the length of the word lines $WL1_k$, $WL2_k$, . . . , $WL32_k$, $WL1_{k-1}$, . . . , . . . in FIG. 4; FIG. 6B shows the bit lines $BL_{2j-1}$, $BL_{2j}$, $BL_{2j+1}$, . . . in FIG. 4. As shown in the cross sectional view of FIGS. 6A and 6B, source and drain regions 81, 82, 83, for select transistors, which select a memory cell transistor, and memory cell transistors each having stacked gate architecture are formed on the surface of the p-type semiconductor substrate 1, and a 5 to 10 nm thick gate insulator (tunneling oxide film) 2 configured to enable tunneling of electrons to and from the p-type semiconductor substrate 1, is formed on the channel region defined between each of the source and drain regions 81, 82, 83, . . . . The source/drain regions 81, 82, 83, are $n^+$ type semiconductor regions, which are obtained by doping an n-type impurity into the p-type semiconductor substrate 1 in a high concentration. The source/drain region 83 serves as a bit line contact region. Alternatively, a p-type well region (p-well) may be formed on an n-type semiconductor substrate in place of the p-type semiconductor substrate 1.

A floating gate electrode 21 configured to accumulate electron charges, is stacked on this gate insulator 2, an approximately 10 to 50 nm thick inter-electrode dielectric 11 is stacked on the floating gate electrode 21, and a control gate electrode 24 is stacked on the inter-electrode dielectric 11, forming each memory cell transistor gate electrode. Similarly, as shown in FIG. 6B, each select transistor has a gate electrode structure made up of the gate insulator 2, the floating gate electrode 21, the inter-electrode dielectric 11, the control gate electrode 24, which is conductively coupled to the floating gate electrode 21 via the opening in the inter-electrode dielectric 11. Namely, the control gate electrode 24 is electrically connected to the floating gate electrode 21 via the inter-electrode dielectric-punching windows in the inter-electrode dielectric 11. As shown in FIG. 6A, the floating gate electrodes 21 of memory cell transistors each belonging to an adjacent memory cell column are opposed along the row-direction (along the word-line direction) via device isolation films 7 implementing a shallow trench isolation (STI) architecture. As shown in FIG. 5, the device isolation films 7 extend parallel to the column direction.

Note that the structure shown in FIGS. 6A and 6B is merely an example, and the height of the device isolation film 7 is not limited to a lower horizontal level than the top of the inter-electrode dielectric 11 as shown in FIG. 6A For example, the height of the device isolation film 7 may be substantially even with or higher than the top of the inter-electrode dielectric 11. If the height of the device isolation film 7 is substantially even with or higher than the top of the inter-electrode dielectric 11, the inter-electrode dielectric 11 does not need to be formed as a continuous film to be shared with the adjacent memory cell column along the row direction, as shown in FIG. 6A.

Figure 7A:
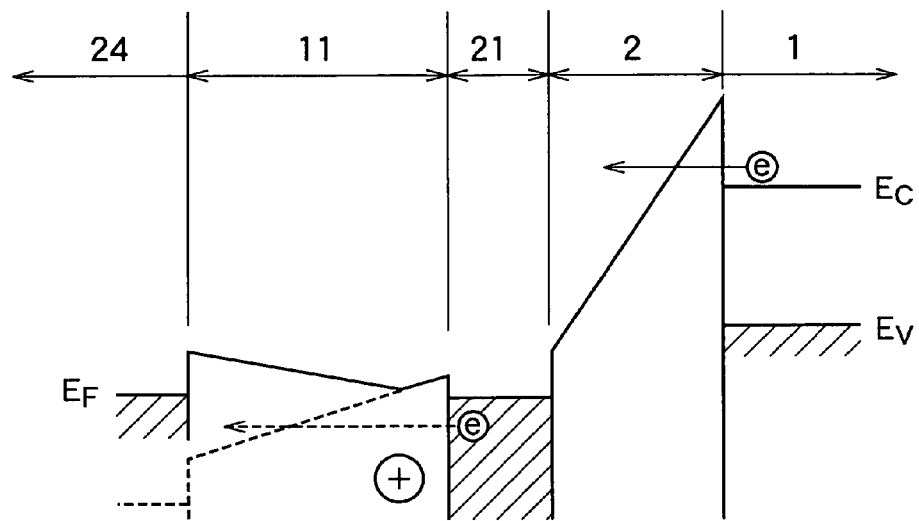
FIG. 7A is an energy band diagram explaining program operation in the memory cell structure of the semiconductor memory according to the first embodiment of the present invention.

In the semiconductor memory according to the first embodiment, each of the memory cell transistors is implemented by a stacked gate architecture, in which the gate insulator 2, the floating gate electrode 21, the inter-electrode dielectric 11, and the control gate electrode 24 are stacked on the semiconductor substrate 1 in order as shown in FIGS. 6A and 6B, and the inter-electrode dielectric 11 has a positive charge layer, preferably a fixed positive charge layer in the lower-level region of the inter-electrode dielectric 11 as shown in FIG. 7A. Here, "lower-level region" means a layer being distributed in the lower half of the inter-electrode dielectric 11, or the layer localize at a lower level than the center of the thickness of the inter-electrode dielectric 11 (on the floating gate electrode 21 side). For example, the inter-electrode dielectric 11 may be divided into third sub-layers such as a lower layer (first sub-layer) having no significant charges; a middle layer (second sub-layer) disposed on the lower layer, having a distribution of positive charges, and an upper layer (third sub-layer) disposed on the middle layer, having no significant charges. The thickness of the upper layer is larger than the sum of the thickness of the lower and middle layers so that the fixed positive charge layer can be localized in the lower half of the inter-electrode dielectric 11. Here, the lower layer (first sub-layer) can be omitted. The distribution of positive charges in the middle layer (second sub-layer) is not required to be uniform.

The fixed positive charge layer may be a layer containing a bond structure implemented by an impurity atom being bonded to a positively charged atom, which constitutes a network of the inter-electrode dielectric 11. For example, an impurity atom of boron (B) may be bonded to a positively charged oxygen atom ($O^-$), the oxygen atom constitutes a network of the silicon oxide ($SiO_2$) so as to form a bond structure of $B-O^+$. In silicon oxide ($SiO_2$), a silicon atom is tetrahedrally surrounded by four oxygen atoms. These tetrahedral are joined together at their corners by oxygen bridges to form quartz network.

Or, the positive charge layer may be a layer containing a film structural defect of the inter-electrode dielectric 11 such as "E center" serving as a hole trap, or oxygen vacancy ($V_O^{2+}$). The oxygen vacancy corresponds to a defect of an oxygen atom missing from a bond structure of Si—O—Si in the case of the silicon oxide ($SiO_2$) film.

FIG. 7A shows an energy band diagram at the program operation of a memory cell in the semiconductor memory according to the first embodiment, where the thickness of the gate insulator (tunneling oxide film) 2 is 8 nm, and a 12 nm-thick alumina ($Al_2O_3$) film is used as the inter-electrode dielectric 11. For the semiconductor substrate 1, the conduction band edge $E_c$ and the valence band edge $E_v$ are represented. For the gate insulator 2 and the inter-electrode dielectric 11, only the conduction band edge is represented. For the floating gate electrode 21 and the control gate electrode 24, a metallic band structure is assumed and Fermi level $E_F$ is represented in FIG. 7A. FIG. 7A shows the case in which fixed positive charges are distributed with an electron charge density of $4 \times 10^{13}$ $cm^{-2}$ at a position 2 nm away from the interface of the floating gate electrode 21 in the lower-level region of the inter-electrode dielectric 11; however, the electron charge density is not limited to that value. Note that the "electron charge density" is defined by the number of electron charges per area. It can be converted into "charge density" by multiplying the electron charge $q=1.6 \times 10^{-19}$ C by the "electron charge density". Note that in the case of charges being ions, conversion into an "ion density" is possible by dividing the "electron charge density" by the ionic charge number "n". The electron charge density in the fixed positive charge layer needs to be $1\times10^{10}$ cm$^{-2}$ or greater, which is effective to a certain extent, but more preferably to lie between $1\times10^{12}$ cm$^{-2}$ and $6\times10^{16}$ cm$^{-2}$. The effectiveness of an electron charge density of $6\times10^{16}$ cm$^{-2}$ or greater can be promising. However, with an electron charge density greater than $6\times10^{16}$ cm$^{-2}$, defects will be generated so as to remarkably decrease the film quality of the inter-electrode dielectric 11, increasing the leakage current and decreasing the surface morphology, therefore too much inclusion of electron charges is not favorable.

With the semiconductor memory according to the first embodiment, the program gate voltage applied to the control gate electrode 24, which is determined so that a desired tunneling current (Fowler-Nordheim current) can flow through the gate insulator 2, decreases by 5 volts from the voltage when there is no fixed positive charge layer, which is indicated by the dotted line in FIG. 7A, due to a fixed positive charge layer with an electron charge density of $4\times10^{13}$ cm$^{-2}$. If positive charges are distributed with an electron charge density of $1\times10^{12}$ cm$^{-2}$ or greater, the program gate voltage decreases by 0.1 volts or greater. Moreover, since the effective tunneling distance established in the inter-electrode dielectric 11 is long, the amount of tunneling current flowing through the inter-electrode dielectric 11 decreases. The amount of leakage current is equal to or less than a detection limit of $1\times10^{-12}$ A/cm$^2$ even without charges; however, according to a tunneling current calculation, even though there is a fixed positive charge layer of $1\times10^{10}$ cm$^{-2}$, a decrease in the leakage current by an order of at least a single digit is achieved.

Figure 7B:
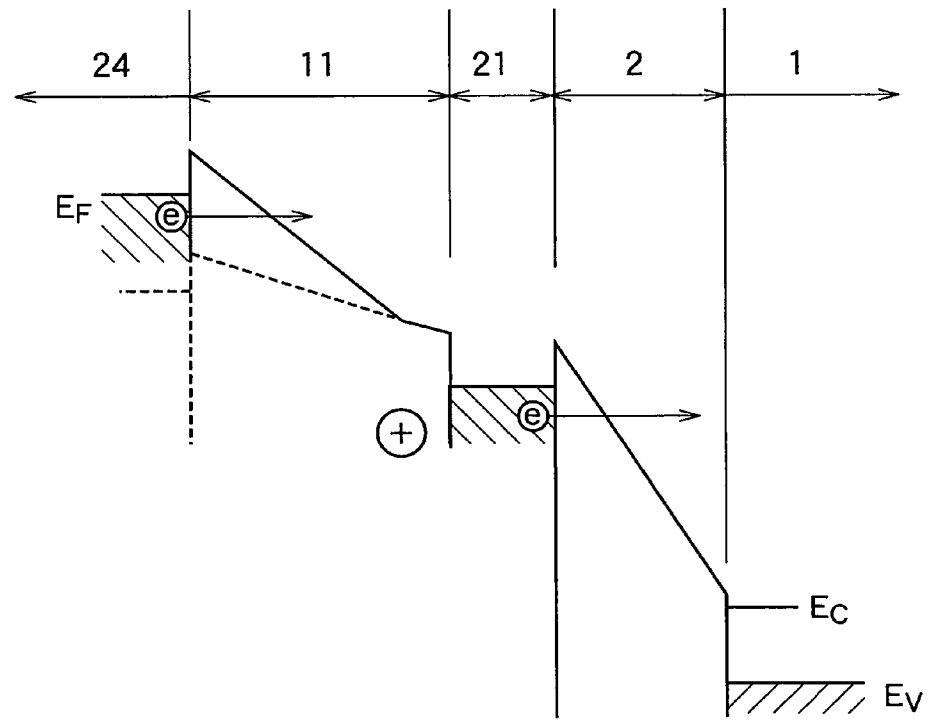
FIG. 7B is a corresponding energy band diagram explaining erase operation in the memory cell structure of the semiconductor memory according to the first embodiment of the present invention.

FIG. 7B shows a corresponding energy band diagram during an erase operation of the semiconductor memory according to the first embodiment. The erase gate voltage applied to the control gate electrode 24, which is determined so that a desired tunneling current can flow through the gate insulator 2, increases higher than the voltage in the case where there is no fixed positive charge layer, and is indicated by the dotted line in FIG. 7B. Moreover, since the effective tunneling distance established in the inter-electrode dielectric 11 becomes shorter, the amount of tunneling leakage current flowing through the inter-electrode dielectric 11 increases. The leakage current flowing via the inter-electrode dielectric 11 during the erase operation, as shown in FIG. 7B, is approximately $1\times10^{-10}$ A/cm$^2$ to $1\times10^{-5}$ A/cm$^2$, and the increase in the erase gate voltage is approximately 3 to 10 volts. A more preferable structure for suppressing such leakage current will be explained later with a semiconductor memory according to a third embodiment.

Note that with the semiconductor memory according to the first embodiment, there is no theoretical limitation on the thickness of the fixed positive charge layer. Therefore, fixed positive charge layers can be distributed throughout the inter-electrode dielectric 11, or they may be homogenously distributed throughout the inter-electrode dielectric 11, and it is not necessary for the fixed positive charge layers to be localized in the lower-level region of the inter-electrode dielectric 11.

Moreover, the fixed positive charge layers may be localized within a certain range in thickness, and a similar effectiveness may be provided as long as the electron charge density per unit area is the same and the position of the equivalent center of gravity in terms of charge (level of the equivalent center of gravity) is also the same. "The equivalent center of gravity" is the point in or near a body at which the electrical potential energy of the body is equal to that of a single particle of the same charge located at that point and through which the resultant of the electrical forces on the component particle of the body acts. Generally the equivalent center of gravity of the charge distribution may correspond to a peak in a charge distribution profile. More specifically, it is preferable that the fixed positive charge layers are localized at or in the vicinity of the interface between the floating gate electrode 21 and the inter-electrode dielectric 11 because even a low electron charge density can provide the aforementioned effectiveness. In other words, the equivalent center of gravity of the fixed positive charge layer being positioned on the lower-level region side of the inter-electrode dielectric 11 is preferable because even a low electron charge density can provide the desired effectiveness. Accordingly, the thinner the thickness of the fixed positive charge layers, the more preferable since the equivalent center of gravity of the fixed positive charge layer becomes closer to the interface. In addition, considering the manufacturing method from a realistic viewpoint, it is preferable that the thickness of the fixed positive charge layers be equal to the thickness of approximately one molecular layer (approximately twice the interval between atoms) in the insulator film.

Moreover, with the semiconductor memory according to the first embodiment, the positive charges are not limited to fixed charges, and alternatively may be mobile charges. However, fixed charges are preferable because there is no change in the charge distribution during memory cell operations and no change in memory cell electric characteristics; where, "fixed charges" means charges that cannot move by the applied electric field intensity, which is usually employed for memory cell operations. The fixed charges may be ascribable to trap levels, which typically reside near the center of the energy band gap of the inter-electrode dielectric 11.

In FIGS. 6A and 6B, the floating gate electrode 21 is formed with a double-level composite structure, which is made up of a first polycrystalline silicon film 3 doped with n-type impurities such as phosphorous (P) or arsenic (As) atoms (hereinafter called "first doped polysilicon film 3"), and a second polycrystalline silicon film 8 doped with the n-type impurities in the same way (hereinafter called "second doped polysilicon film 8"). The impurity concentration of the second doped polysilicon film 8 may be higher than that of the first doped polysilicon film 3. The control gate electrode 24 is formed with a triple-level composite structure, which is made up of an n-type impurity-doped third polycrystalline silicon film 12 (hereinafter called "third doped polysilicon film 12"), a tungsten silicide (WSi$_2$) film 13, and a cap insulator film 14. A metallic silicide film, such as a cobalt silicide (CoSi$_2$) film, a titanium silicide (TiSi$_2$) film, and a molybdenum silicide (MoSi$_2$) film, as well as the tungsten silicide (WSi$_2$) film 13 can be used as the silicide film 13. A refractory metal, such as tungsten (W), cobalt (Co), titanium (Ti), or molybdenum (Mo), may be used in place of the silicide film 13; moreover, a polycide film using these silicide films is also available. A high conductivity metal film such as aluminum (Al) or copper (Cu) in place of the silicide film 13 may be deposited on the third polycrystalline silicon film 12, and this high conductivity metal film may be shared by the word lines WL1$_k$, WL2$_k$, ..., WL32$_k$, WL1$_{k-1}$, ..... Alternatively, either a tungsten nitride (WN) film or a titanium nitride (TiN, Ti$_2$N) film, or a stacked film made thereof in place of the silicide film 13 may be deposited on the third doped polysilicon film 12. Note that while peripheral transistors are not shown in the drawings, they are implemented by transistors having gate electrode structures, which correspond to respective control gate electrodes 24 obtained by removing the floating gate electrodes 21 and the inter-electrode dielectrics 11 from the stacked gate architecture for the select transistors shown in FIGS. 6A and 6B. Or, the gate electrode structures of the peripheral transistors may be almost the same stacked gate architecture as that of the select transistors.

With the structure shown in FIG. 6A, the lower portions of the inter-electrode dielectric 11 and the third doped polysilicon film 12 implement a downwardly convex topology so that the downwardly convex portions can be inserted into the gaps between adjacent second polycrystalline silicon films 8, respectively. Otherwise, another insulator film may be inserted into the gaps between adjacent second polycrystalline silicon films 8.

According to the semiconductor memory of the first embodiment, as is apparent in the cross sectional view cut along the bit-line direction shown in FIG. 6B, a plurality of memory cell transistors are aligned along the column direction, and the floating gate electrodes 21 of adjacent memory cell transistors face each other via intracolumn-isolation insulators 16, which are inserted between the memory cell transistors aligned along the column direction.

Note that cell-isolation underlying films 15 made of an approximately 6 nm-thick silicon oxide film are formed on the sidewalls of the stacked structure (21, 11, and 24), which are made up of the first doped polysilicon film 3, the second doped polysilicon film 8, the inter-electrode dielectric 11, the third doped polysilicon film 12, the silicide film 13 and the cap insulator film 14 in FIG. 6B. However, when adhesion between the cell-isolation insulator 16 and corresponding sidewall of the stacked structure (21, 11, and 24) or the interface state therebetween are of no concern, the cell-isolation underlying film 15 may be omitted.

A composite structure of intracolumn-isolation insulators 16 and a core filling insulator film 18 is inserted between the adjacent select transistors aligned along the column direction, each of the adjacent select transistors is assigned to different NAND cell-columns aligned along the column direction. The adjacent NAND cell-columns implement a mirror image, in which the NAND cell-columns are arranged in reversal of upper and lower along the column direction with reference to the center of the core filling insulator film 18. A boro-phosphate-silicate-glass (BPSG) film or the like can be used for the core filling insulator film 18.

More specifically, the core filling insulator film 18 fills in the center of the concave region, the intracolumn-isolation insulators 16 implement the sidewalls of the concave region, and a contact plug 52 is then filled penetrating the center of this core filling insulator film 18. The contact plug 52 has ohmic contact with a bit line contact region 83, with a low ohmic contact resistance. The contact plug 52 is connected to a corresponding bit line ($BL_{2j}$) 51 formed on the inter-layer insulator film 19. As shown in FIG. 6A, bit lines $BL_{2j}$ and $BL_{2j+1}$ are disposed on the inter-layer insulator film 19; alternatively, damascene trenches may be formed in the inter-layer insulator film 19, and metallic interconnects made of copper (Cu) as a primary component may be filled in those damascene trenches, and be available as damascene interconnects.

A variety of insulator films may be used as the inter-electrode dielectric 11. As described at the beginning, the miniaturized semiconductor memory has a small area of the floating gate electrode 21 opposing the control gate electrode 24. However, to allow the semiconductor memory to function successfully, the capacitance between the floating gate electrode 21 and the control gate electrode 24 via the inter-electrode dielectric 11 needs to maintain a constant value. In particular, with a miniaturized semiconductor memory with a minimum line width of approximately 100 nm or less, usage of a material with a dielectric constant $\in_r$ greater than that of a $SiO_2$ film is preferred, considering the coupling capacitance between the floating gate electrode 21 and the control gate electrode 24. With an ONO film, for example, the ratio in thickness of the upper layer silicon oxide film, the middle layer silicon nitride film, and the underlayer silicon oxide film is selectable, however, a dielectric constant $\in_r$ of approximately 5 to 5.5 can be provided. Alternatively, a single layer film made from any one of a strontium oxide (SrO) film with $\in_r=6$, a silicon nitride ($Si_3N_4$) film with $\in_r=7$, an aluminum oxide ($Al_2O_3$) film where $\in_r=8-11$, a magnesium oxide (MgO) film where $\in_r=10$, an yttrium oxide ($Y_2O_3$) film where $\in_r=16-17$, a hafnium oxide ($HfO_2$) film where $\in_r=22-23$, a zirconium oxide ($ZrO_2$) film where $\in_r=22-23$, a tantalum oxide ($Ta_2O_5$) film where $\in_r=25-27$, or a bismuth oxide ($Bi_2O_3$) film where $\in_r=40$, or a composite film embracing at least two of these plural layers thereof may be used. $Ta_2O_5$ and $Bi_2O_3$ show disadvantages in lacking thermal stability at the interface with the polysilicon. Furthermore, it may be a composite film made from a silicon oxide film and these films. The composite film may have a stacked structure of triple-levels or more. In other words, it should be an insulating film containing a material with the relative dielectric constant $\in_r$ of 5 to 6 or greater in at least a portion thereof. However, in the case of a composite film, selecting a combination that results in having an effective relative dielectric constant $\in_{reff}$ of 5 to 6 or greater measured for the entire film is preferred. Moreover, it may also be an insulating film made from an oxide film of a ternary compound such as a hafnium aluminate (HfAlO) film.

In other words, an oxide containing at least one of the elements: aluminum (Al), magnesium (Mg), yttrium (Y), hafnium (Hf), zirconium (Zr), tantalum (Ta), and bismuth (Bi) may be the insulating film used as the inter-electrode dielectric 6. It should be noted that ferroelectrics such as strontium titanate ($SrTiO_3$) and barium strontium titanate ($BaSrTiO_3$) are available as the high dielectric constant insulating film material; however, a lack of thermal stability at the interface with the polysilicon and hysteresis characteristics of the ferroelectrics must be considered. The thickness of the inter-electrode dielectric 11 changes due to the dielectric constant of the film material, and it is preferably approximately 10 to 20 nm when using an alumina film.

Figure 19A:
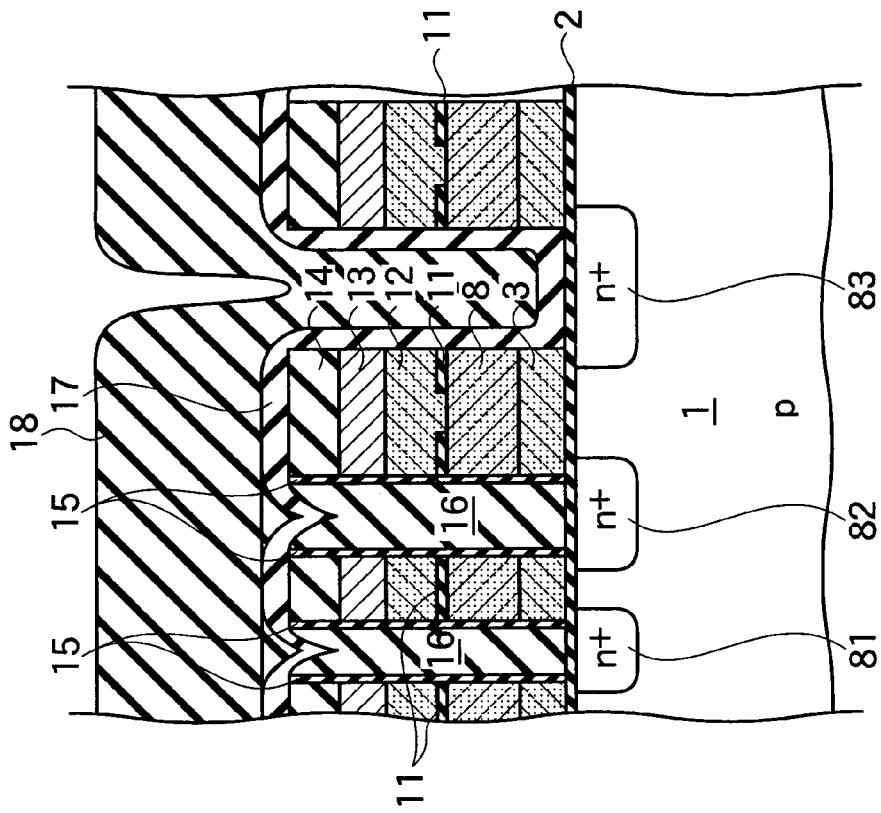
FIG. 19A is a subsequent process flow cross section cut along the bit-line direction, after the process stage shown in FIG. 18A.
Figure 19B:
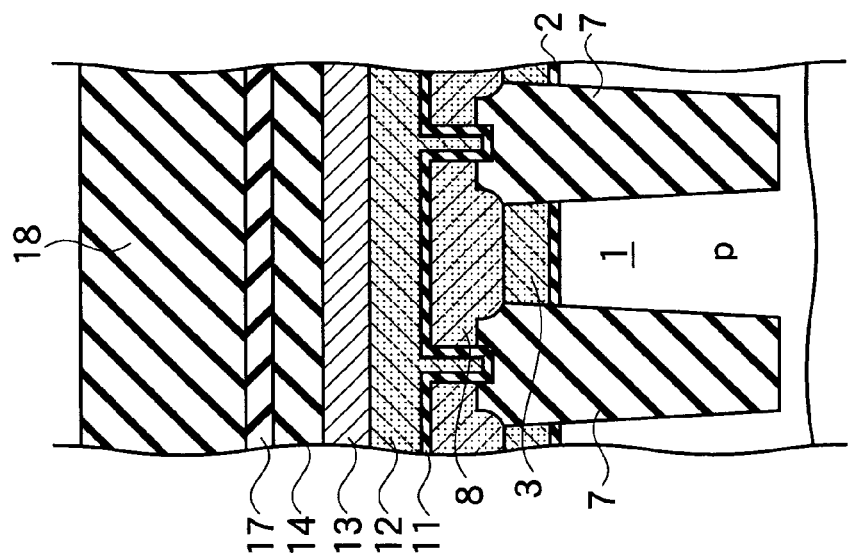
FIG. 19B is a subsequent process flow cross section cut along the word-line direction, after the process stage shown in FIG. 18B.

A fabrication method for the semiconductor memory according to the first embodiment is explained referencing FIGS. 8A and 8B through to FIGS. 19A and 19B. Note that the fabrication method for the semiconductor memory to be described below is merely an example, and naturally, other fabrication methods including modifications of this fabrication method may also be implemented. In the following description, a case of using an alumina ($Al_2O_3$) film as the inter-electrode dielectric 11 is explained; however, it is apparent from the above explanation that the present invention is not limited thereto.

(a) An approximately 8 nm-thick gate insulator (tunneling oxide film) 2, which is electrically conductive due to the tunneling effect, is formed on a p-type semiconductor substrate 1, and a 40 nm-thick first doped polysilicon film 3 is then deposited on the resulting surface through the low pressure CVD (LPCVD) method. Subsequently, an approximately 90 nm-thick first silicon nitride film 4 and an approximately 230 nm-thick first silicon oxide film 5 are deposited by the LPCVD method. Next, a photoresist is delineated through photolithography, forming a desired pattern, and the first silicon nitride film 4 and the first silicon oxide film 5 are then etched by the RIE method using that desired pattern as an etching mask. After removing the photoresist, the first doped polysilicon film 3 is etched by the RIE method. Moreover, the gate insulator 2 and the semiconductor substrate 1 are etched using a similar method, forming device isolation grooves in the semiconductor substrate 1. Subsequently, an approximately 550 nm-thick third silicon oxide film 7 is deposited through a plasma enhanced CVD method such as high-density plasma (HDP) CVD, as shown in FIGS. 8A and 8B (note that while it is omitted in the drawings, before deposition of the third silicon oxide film 7, the semiconductor substrate 1 is heated at approximately 1000° C. under an oxidizing atmosphere, and an approximately 6 nm-thick second silicon oxide film is then formed on the sidewalls of the exposed device isolation grooves, thereby improving adhesion between the third silicon oxide film 7 and the sidewalls of the device isolation grooves, which is favorable). Afterwards, the third silicon oxide film 7 is polished until the first silicon nitride film 4 is exposed through the CMP method, planarizing the resulting surface. The device isolation grooves are then filled with the third silicon oxide film 7, forming an STI structure of device isolating insulator regions. The buffered hydrofluoric acid (BHF) process etches the third silicon oxide film (device isolation films) 7 by approximately 44 nm, and the phosphoric acid ($H_3PO_4$) process selectively removes the first silicon nitride film 4.

(b) An approximately 60 nm-thick second doped polysilicon film 8 and an approximately 130 nm-thick fourth silicon oxide film 9 are deposited using the LPCVD method. Afterwards, the photoresist is delineated, forming a window above each of the device isolation films 7 by a photolithography process. The fourth silicon oxide film 9 above the device isolation films 7 is then selectively removed by the RIE method using this photoresist as an etching mask. Afterwards, the photoresist is removed, and an approximately 45 nm-thick fifth silicon oxide film 10 is then deposited by the LPCVD method as shown in FIGS. 9A and 9B. As shown in FIGS. 10A and 10B, the entire surface of the fifth silicon oxide film 10 is etched back until the second doped polysilicon film 8 above the device isolation films 7 is exposed. That is, while the fifth silicon oxide film 10 above the fourth silicon oxide films 9 is removed, by etching back the entire surface, the fifth silicon oxide film sidewalls 10*a*, 10*b*, 10*c*, and 10*d* are left on the sidewalls of the windows in the fourth silicon oxide film 9 above the device isolation films 7, as shown in FIG. 10A. The sidewalls 10*a*, 10*b*, 10*c*, 10*d* allow formation of a shrunk etching mask having narrower windows above the device isolation films 7 than that achieved by photolithography technology.

Figure 12B:
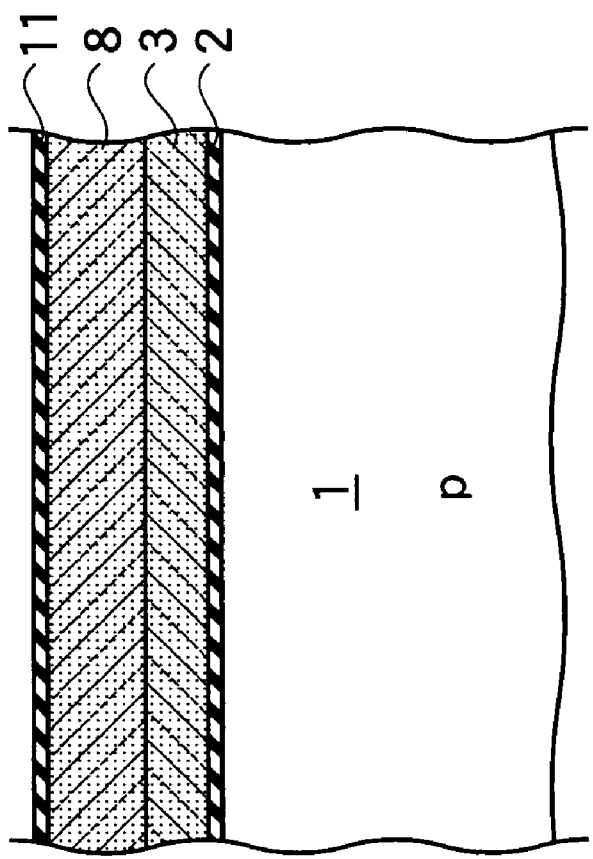
FIG. 12B is a subsequent process flow cross section cut along the word-line direction, after the process stage shown in FIG. 11B.
Figure 12A:
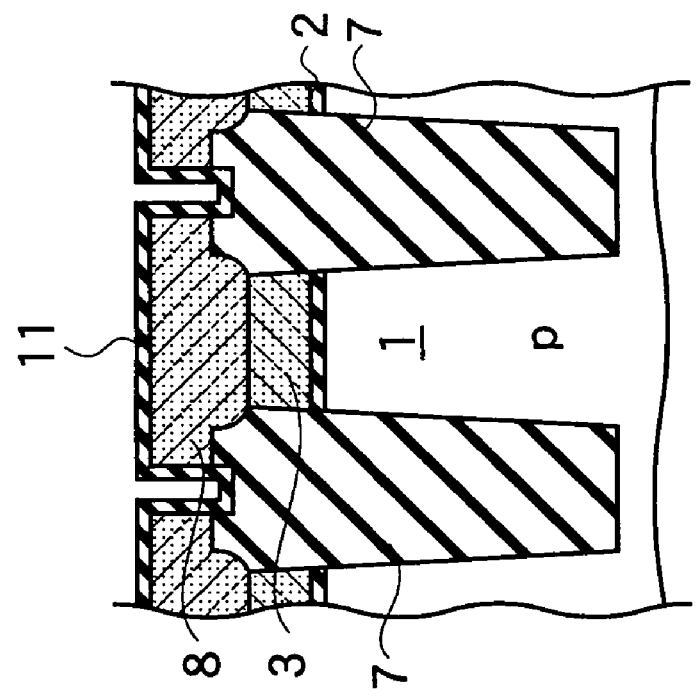
FIG. 12A is a subsequent process flow cross section cut along the bit-line direction, after the process stage shown in FIG. 11A.

(c) Next, the second doped polysilicon film 8 above the device isolation films 7 is selectively removed by the RIE method using the shrunk etching mask, with narrower windows above the device isolation films 7, thereby isolating each adjacent cell column of the second doped polysilicon film 8 by grooves 49*a* and 49*b* as shown in FIG. 11A. Afterwards, the fourth silicon oxide film 9 and the fifth silicon oxide film 10 are removed through oxygen plasma processing and HF processing, as shown in FIGS. 12A and 12B, an approximately 12 nm-thick alumina ($Al_2O_3$) film is deposited as the inter-electrode dielectric 11 on the second polycrystalline silicon films 8, which are assigned to neighboring isolated cell columns, through an atomic layer deposition (ALD) method. The inter-electrode dielectric 11 is formed in, for example, a growth chamber 41 at 400° C. under 650 Pa in an ALD furnace shown in FIG. 20 by alternately supplying trimethyl aluminum (TMA) for the aluminum (Al) atom source at a rate of $1.69 \times 10^{-1}$ Pa·m³/s (=100 sccm) and ozone ($O_3$) for the oxygen (O) atom source at a rate of 200 g/Nm³, causing a surface reaction and ALD film deposition (first growth condition for growing a stoichiometric composition of the inter-electrode dielectric) of an alumina film—a lower layer of the inter-electrode dielectric 11 is stacked on the floating gate electrode 21—wherein a supply cycle period for each atomic layer is set to 1 sec. After 10 cycles of thin film deposition (first growth condition), only the ozone supply time is changed to 0.1 sec, and an additional 10 cycles of thin film deposition (second growth condition for growing a non-stoichiometric composition of the inter-electrode dielectric) are carried out. As a result, in the underlying stoichiometric atomic layer, a non-stoichiometric alumina film ($Al_2O_3$) is formed to be approximately 1 nm in thickness. That is, a middle layer of the inter-electrode dielectric 11 is stacked on the lower layer of the inter-electrode dielectric 11. For the middle layer of the inter-electrode dielectric 11, the non-stoichiometric alumina film is formed, in which the oxygen composition is approximately half the stoichiometric composition value. Since the oxygen composition is approximately half the stoichiometric composition value, oxygen vacancies are generated in the middle layer. The oxygen vacancies generated in the middle layer serve as atomic layers for providing the fixed positive charges. Afterwards, the cycle period time is reset to 1 sec., and additional ALD film deposition—by the first growth condition—is carried out so as to form a 12 nm-thick stoichiometric alumina film. Then a stoichiometric upper layer of the inter-electrode dielectric 11 is stacked on the non-stoichiometric middle layer. Note that, for stacking the middle layer of the inter-electrode dielectric 11 on the lower layer, even by decreasing the supplied amount of ozone in place of shortening the ozone supply time, a similar non-stoichiometric middle film can be provided.

(d) Next, after application of a photoresist 54 across the entire surface, the photo resist 54 is delineated by a photolithography process. And using this photo resist 54 as an etching mask, inter-electrode dielectric-punching windows 61*a* and 61*b* are formed by the RIE method in the regions of the inter-electrode dielectric 11 where select transistors are to be later fabricated, as shown in FIG. 13B. As shown in FIG. 13B, two inter-electrode dielectric-punching windows 61*a* and 61*b* are formed on the center and the right side, respectively. After removal of the photo resist 54, an approximately 80 nm-thick third doped polysilicon film 12 is deposited using the LPCVD method, as shown in FIGS. 14A and 14B. The third doped polysilicon film 12 and the second doped polysilicon film 8 are connected to each other via the two inter-electrode dielectric-punching windows 61*a* and 61*b* on the center and the right side of FIG. 14B, respectively. A silicide film 13 made of a tungsten silicide ($WSi_2$) film is then deposited on the third doped polysilicon film 12 to be approximately 70 nm in thickness using the PVD method. As shown in FIGS. 14A and 14B, on this approximately 70 nm-thick silicide film 13, a second silicon nitride film 14 or a cap insulator film is deposited to be approximately 300 nm in thickness by the LPCVD method.

(e) Subsequently, an additional photoresist is delineated into a desired pattern by a photolithography process, and using the delineated photoresist as an etching mask, the second silicon nitride film (cap insulator film) 14 is etched by the RIE method, forming an intracolumn-isolation etching mask. Next, the additional photoresist used for formation of the intracolumn-isolation etching mask is removed. As shown in FIG. 15B, the silicide film 13, the third doped polysilicon film 12, the inter-electrode dielectric 11, the second doped polysilicon film 8, and the first doped polysilicon film 3 are selectively etched by the RIE method using the cap insulator film 14 as an intracolumn-isolation etching mask until the gate insulator 2 is exposed, forming multiple slit-shaped cell-isolation trenches extending along the row direction (along the word-line direction), thereby isolating select transistors and memory cell transistors in each cell column. The cell-isolation trenches isolate the control gate electrode 24 of each memory cell transistor in each cell column, which is made up of the third doped polysilicon film 12, the silicide film 13, and the second silicon nitride film (cap insulator film) 14. Similarly, the cell-isolation trenches isolate the floating gate electrode 21 of each memory cell transistor in each cell column, which is made up of the first doped polysilicon film 3 and the second doped polysilicon film 8. The cell-isolation trenches isolate select transistors disposed on the center and the right side of FIG. 15B along the column direction, each having the inter-electrode dielectric-punching windows 61a and 61b included in the respective inter-electrode dielectrics 11. The two adjacent select transistors are assigned to different NAND cell-columns aligned along the column direction.

(f) Next, by heating at approximately 800° C. for approximately 120 sec. under a nitrogenous atmosphere and then heating at approximately 1000° C. under an oxidizing atmosphere, a cell-isolation underlying film 15 made of a silicon oxide film is formed to be approximately 6 nm in thickness on the sidewalls exposed to the cell-isolation trenches as shown in FIGS. 15A and 15B. Namely, the cell-isolation underlying film 15 is formed on the side edges of the control gate electrode 24 exposed to the cell-isolation trenches, as well as on the side edges of the floating gate electrode 21 exposed to the cell-isolation trenches. Using the stacked gate architecture (21, 11, 24), which is isolated by the cell-isolation trenches and made up of the first doped polysilicon film 3, the second doped polysilicon film 8, the inter-electrode dielectric 11, the third doped polysilicon film 12, the silicide film 13, the cap insulator film 14, and the cell-isolation underlying film 15, as an implantation mask, n-type impurity ions such as arsenic ions ($^{75}As^+$) or phosphorus ions ($^{31}P^+$) are implanted into the semiconductor substrate 1 through the gate insulator 2 exposed to the bottom of the cell-isolation trenches so as to implement the self-aligned implantation. Annealing for activation after the ion implantation is carried out, forms source/drain regions 81, 82, 83, . . . on the semiconductor substrate 1 as shown in FIG. 15B.

(g) As shown in FIGS. 16A and 16B, a cell-isolation insulator 16 is deposited on the entire surface so as to bury the slit-shaped cell-isolation trenches between the select transistors, between the select transistor and memory cell transistor and between the memory cell transistors. Afterwards, by etching back the entire surface through the RIE method, the cell-isolation insulator 16 above the cap insulator film 14 is removed. After application of an additional photoresist across the entire surface, that photoresist is delineated using a photolithography process, and then using this photoresist as an etching mask, the cell-isolation insulator 16, which is inserted between two adjacent select transistors along the column direction, is selectively removed by the RIE method, as shown in FIGS. 17A and 17B. The two adjacent select transistors are assigned to different NAND cell-columns aligned along the column direction, respectively. As shown in FIGS. 18A and 18B, using the LPCVD method, a stopper film 17 made of a silicon nitride film is then deposited on the entire surface to be approximately 40 nm in thickness, and is heated at approximately 850° C. under an oxidizing atmosphere. As shown in FIGS. 19A and 19B, an approximately 300 nm-thick core filling insulator film (BPSG film) 18 is deposited on the stopper film 17. Afterwards, heating at approximately 800° C. under a nitrogenous atmosphere makes the core filling insulator film (BPSG film) 18 reflow. Using the CMP method, the core filling insulator film 18 is polished until the stopper film 17 is exposed, planarizing the resulting surface. The stopper film 17 is not limited to the silicon nitride film as long as the selectivity relative to the silicon oxide film is high when using the CMP method. Thereupon, an approximately 350 nm-thick inter-layer insulator film 19 made of a silicon oxide film is deposited using the plasma enhanced CVD method, and is then subjected to heat treatment under a nitrogenous atmosphere. Next, after application of an additional photoresist across the entire surface, that photoresist is delineated using a photolithography process, and then using this photoresist as an etching mask, a contact hole is formed between two select transistors by the RIE method. Filling a contact plug 52 such as tungsten in this contact hole and then patterning for a bit line 51 completes the semiconductor memory according to the first embodiment shown in FIGS. 6A and 6B. The contact plug 52 filling process may be carried out after forming a contact hole in a self-aligned manner by using etch selectivity of the silicon nitride film or the stopper film 17 and the BPSG film core or the filling insulator film 18.

As described above, the thinner the thickness of the fixed positive charge layer, the closer the distance between the interface and the equivalent center of gravity of the fixed positive charge layer, achieving a the desired effectiveness even with a low electron charge density. According to the fabrication method for the semiconductor memory of the first embodiment, since the ALD method is used, the thickness of the fixed positive charge layer can be controlled precisely in the order of the single molecule layer thickness of an alumina ($Al_2O_3$) film (approximately twice the interatom distance).

The ALD furnace shown in FIG. 20 has a growth chamber 41 capable of being evacuated to an ultra high vacuum, in which is installed a susceptor 48, configured to mount a substrate 1. The growth chamber 41 is evacuated to the ultra high vacuum by a combination of a turbo-molecular pump 47 and an oil-sealed rotary vacuum pump 49, for example. A gate valve 46 is provided between the growth chamber 41 and the turbo-molecular pump 47. An infrared heating lamp 42 is disposed above the growth chamber 41, so that infrared ray can heat the surface of the semiconductor substrate 1. The growth chamber 41 is provided with an aluminum (Al) atomic source introduction system, which introduces trimethyl aluminum (TMA) via a flow control valve 52a and a shut-off valve 51a such as a magnetic valve. The growth chamber 41 is also provided with an oxygen (O) atomic source introduction system, which introduces ozone ($O_3$) via a shut-off valve 51b and a flow control valve 52b. The oxygen (O) atomic source introduction system has a high-frequency induction coil 53, which is used to activate ozone ($O_3$). The growth chamber 41 is equipped with a pyrometer 43, which measures the temperature of the semiconductor substrate 1 surface, and a detector 44, which has a He—Ne laser 45 as a light source for monitoring the thin film deposition rate and measures the reflected light from the surface of the substrate. Monitoring the thin film deposition rate is not always required by the measurement system shown in FIG. 20, and may be omitted according to the ALD film deposition principle.

The ALD furnace shown in FIG. 20 controls the shut-off valves 51a and 51b to open or close, alternatively supplying aluminum (Al) atoms and oxygen (O) atoms; as a result, an alumina film is deposited by atomic layer so as to implement the ALD film deposition. Moreover, by controlling the ozone supply time for each cycle period, the stoichiometric composition value for the alumina film ($Al_2O_3$) to be deposited can be controlled. In other words, by decreasing a supplied amount of oxygen in a specific atomic layer, thereby deviating from the stoichiometric composition value of $Al_2O_3$, an atomic layer with fixed positive charges (fixed charge layer) can be deposited. Note that usage of the ALD furnace shown in FIG. 20 allows deposition of a variety of insulator films other than an alumina ($Al_2O_3$) film having a fixed positive charge layer in the underlying atomic layer region with atomic layer or molecular layer precision.

Although FIG. 20 shows an apparatus employed in the ALD method configured to deposit an approximately 12 nm-thick alumina ($Al_2O_3$) film as the inter-electrode dielectric 11, in which the oxygen composition at a specific molecular layer—a middle layer of the inter-electrode dielectric 11—is decreased from the stoichiometric composition value so as to form a fixed positive charge layer in the inter-electrode dielectric 11; however, the present invention is not limited to the ALD method. In the same way, the inter-electrode dielectric 11 incorporating the fixed positive charge layer can be formed by the CVD method, for example; wherein a supplied amount of oxygen is controlled during film deposition, allowing formation of a non-stoichiometric composition layer where there is deviation of the oxygen composition from the stoichiometric composition value. A hafnium silicate ($HfSiO_2$) film with, for example, a fixed positive charge layer may be deposited using the MOCVD furnace as described below.

(a) Employing the growth chamber of the single-wafer type MOCVD, a first growth condition for growing a stoichiometric composition of the inter-electrode dielectric 11 is set. Namely, under the first growth condition such that the growth temperature is 600° C., and the growth pressure is 1.3 kPa, a hafnium atomic source of tetradiethylamide hafnium (TDEAH) is supplied at a rate of 50 mg/min., a silicon atomic source of tetradimethylamide silicon (TDMAS) is supplied at a rate of 100 mg/min., and an oxygen atomic source of an oxygen gas is supplied at a rate of 3.38 $Pa·m^3$/sec. (=2000 sccm) at the same time, thereby depositing a stoichiometric hafnium silicate film for 30 seconds by the MOCVD method for stacking a lower layer of the inter-electrode dielectric 11 on the floating gate electrode 21. As a result, an approximately 2 nm-thick hafnium silicate film ($HfSiO_2$), which is substantially the same as the stoichiometric composition value is stacked as the lower layer of the inter-electrode dielectric 11 on the floating gate electrode 21.

(b) Afterwards, only the oxygen gas flow rate is changed to $3.38 \times 10^{-1}$ $Pa·m^3$/sec. (=200 sccm) for establishing a second growth condition for growing a non-stoichiometric composition of the inter-electrode dielectric 11, and additional deposition is carried out for another 30 seconds. As a result, an approximately 2 nm-thick hafnium silicate film, which has half the oxygen composition of the stoichiometric composition value, is stacked as the middle layer of the inter-electrode dielectric 11 on the 2 nm-thick stoichiometric lower layer.

(c) Afterwards, the oxygen gas flow rate is changed to 3.38 $Pa·m^3$/s so as to achieve the first growth condition for growing a stoichiometric composition of the hafnium silicate film, and a 15 nm-thick hafnium silicate film is stacked as an upper layer of the inter-electrode dielectric 11 on the middle layer, using the MOCVD method. Then, because the non-stoichiometric middle layer generates a positive charge layer in the inter-electrode dielectric 11, the positive charge layer is localized in the lower half of the inter-electrode dielectric 11.

Note that when forming the inter-electrode dielectric 11 using the CVD method or the ALD method, a boron (B) containing gas such as diborane ($B_2H_6$) may be added to a source gas.

In the case of the CVD method, as a minimum thickness of the inter-electrode dielectric 11 incorporating the fixed positive charge layer, approximately five-molecule layers, or approximately 2 nm will be required so as to secure a uniform film thickness.

Moreover, in the process stage represented by FIGS. 12A and 12B, after deposition of the inter-electrode dielectric 11 using the CVD method or the like, boron ions ($^{11}B^+$) may be implanted into the inter-electrode dielectric 11. More specifically, after deposition of the inter-electrode dielectric 11, selecting acceleration energy $E_{ACC}$ so that a projected range $R_p$ can fall within a depth larger than half of the thickness of the inter-electrode dielectric 11, and with the selected energy, boron ions ($^{11}B^+$) are implanted, forming a positive charge layer in the inter-electrode dielectric 11, which is distributed on the lower half of the thickness of the inter-electrode dielectric 11. The electron charge density of the fixed positive charge layer generated by the ion implantation method falls within the range of between 10 and 100% of an implanted dose $\Phi$ of ions. To control the electron charge density of the fixed positive charge layer formed in the lower-level region of the inter-electrode dielectric 11, forming, for example, a MOS capacitor in advance, finding a flat band voltage shift $\Delta V_F$ through C-V measurement, and then determining a relationship of an implanted dose $\Phi$ and the electron charge density of the generated, fixed positive charge layer as well as annealing conditions may be carried out. Similarly, in the case of depositing the inter-electrode dielectric 11 using the CVD method or the ALD method and decreasing the oxygen composition from the stoichiometric composition value, or in the case of adding a boron (B) containing gas to a source gas, the electron charge density of the fixed positive charge layer can be controlled by forming a MOS capacitor, finding the flat band voltage shift $\Delta V_F$ through C-V measurement, and determining a relationship of deposition conditions for the CVD method or the ALD method and the electron charge density of the generated, fixed positive charge layer.

In the case of ion implantation, by implanting heavy particles such as boron fluoride ions ($^{49}BF^{2+}$) at a low acceleration energy $E_{ACC}$ of approximately 5 keV, a minimum thickness of the fixed positive charge layer can be controlled to be between the standard deviation of the projected range $\Delta R_p$ and approximately 5 nm.

Note that by omitting the first thin film deposition process using the ALD method shown in FIG. 20 and carrying out thin film deposition (second thin film deposition) of a charge layer with oxygen vacancy or the like first, the desired effectiveness can be obtained with a low electron charge density. It should be noted that in the case where the first thin film deposition process is omitted and the charge layer is contacted to the floating gate electrode 21, the electric charge stored in the floating gate electrode 21 may be captured in the charge layer or re-discharged, causing a malfunction of a memory cell or a deterioration in reliability. Therefore, through the first thin film deposition, it is preferable that an (stoichiometric) insulator layer without charges be inserted therebetween.

As described above, with the semiconductor memory according to the first embodiment, the positive charges are not limited to be fixed charges; alternatively, they may be mobile charges. Mobile ions such as sodium ions ($Na^+$) or potassium ions ($K^+$) may be incorporated through a thermal diffusion process after formation of the inter-electrode dielectric 11. Moreover, they may be implanted by an ion implantation process.

It should be noted that the semiconductor memory or the fabrication method thereof according to the first embodiment is not limited to the NAND flash memory shown in FIGS. 4, 5, 6A and 6B, and is naturally applicable to various nonvolatile memories, such as NOR flash memory, AND flash memory, each of the nonvolatile memories encompasses one or more transistors having floating gates serving as the electric charge accumulating layers. One of the examples of the nonvolatile memories is AND flash memory, of which the equivalent circuit is given in FIG. 21.

Figure 21:
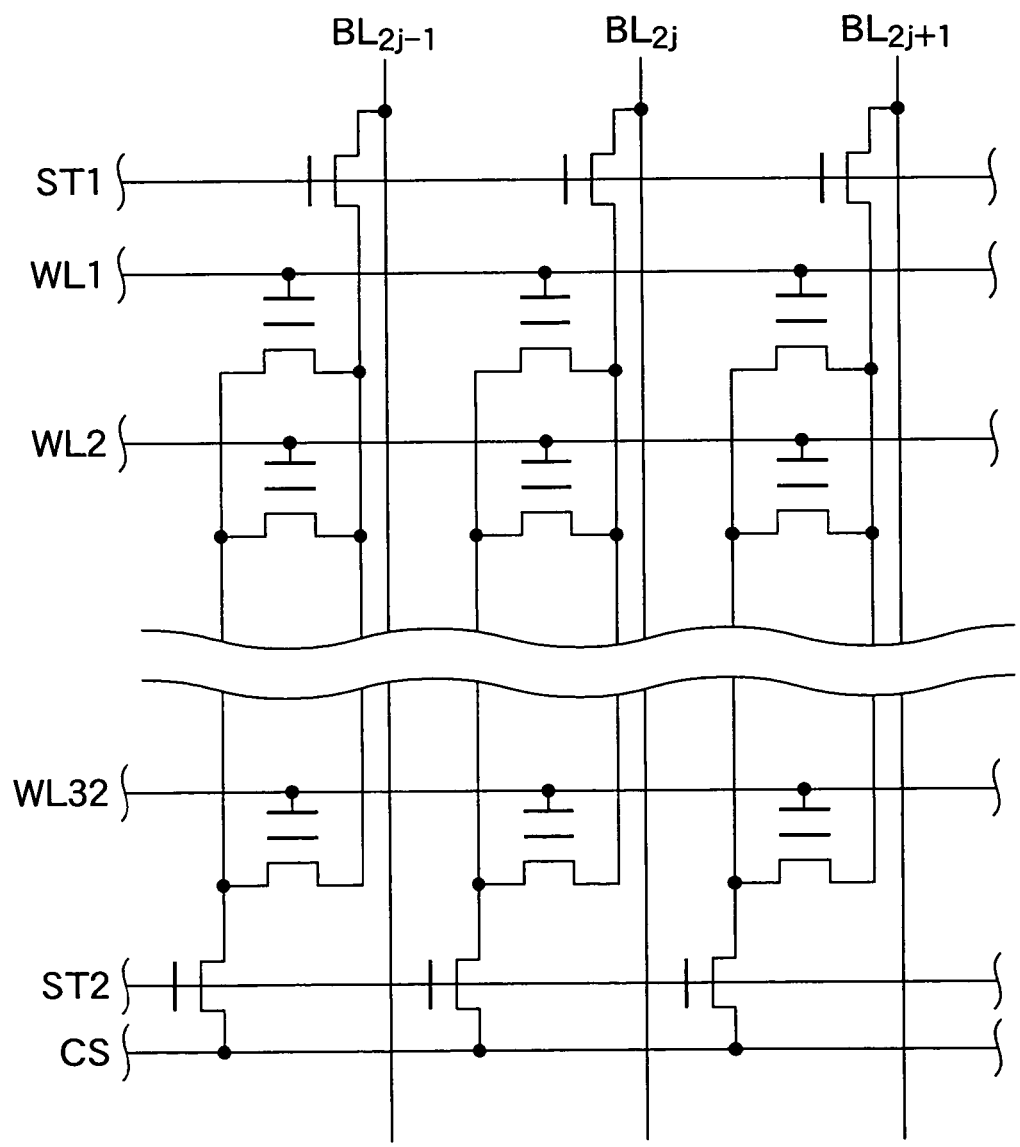
FIG. 21 is an equivalent circuit of a modified example of the memory cell array of the semiconductor memory according to the first embodiment of the present invention.

In the AND flash memory, memory cell transistors sharing the same gate constitute the word lines WL1, WL2, . . . WL32 arranged along the horizontal direction. And memory cell transistors sharing the same drain electrode and same source electrode constitute bit lines $BL_{2j-1}$, $BL_{2j}$, $BL_{2j+1}$, . . . arranged along the vertical direction, orthogonal to these word lines WL1, WL2, . . . WL32. FIG. 21 illustrates the case where 32 memory cell transistors are arranged along the column-direction so as to implement each of the cell columns. Pair of select transistors, which select a group of memory cell transistors serially arranged in the cell column, are arranged at both ends of the cell column array. The plural cell columns are arranged in parallel, close to each other. An upper select gate line ST1 is connected to the respective gates of upper select transistors. A lower select gate line ST2 is connected to the respective gates of the lower select transistors.

The drain electrode of the upper select transistors are connected to the corresponding bit lines $BL_{2j-1}$, $BL_{2j}$, $BL_{2j+1}$, . . . The source electrodes of the upper select transistors are connected to the drain electrodes of memory cell transistors constituting the corresponding cell columns. The drain electrodes of the lower select transistors are connected to the source electrodes of memory cell transistors constituting the corresponding cell columns, and the source electrodes of the lower select transistors are connected to the common source line CS. As it will be appreciated, the terms drain and source can be exchanged without modifying the structure itself. The structure and materials of the memory cell transistors are similar to the structure and materials already explained in the NAND flash memory, and an overlapping or redundant description may be omitted in the AND flash memory.

Second Embodiment

Figure 22:
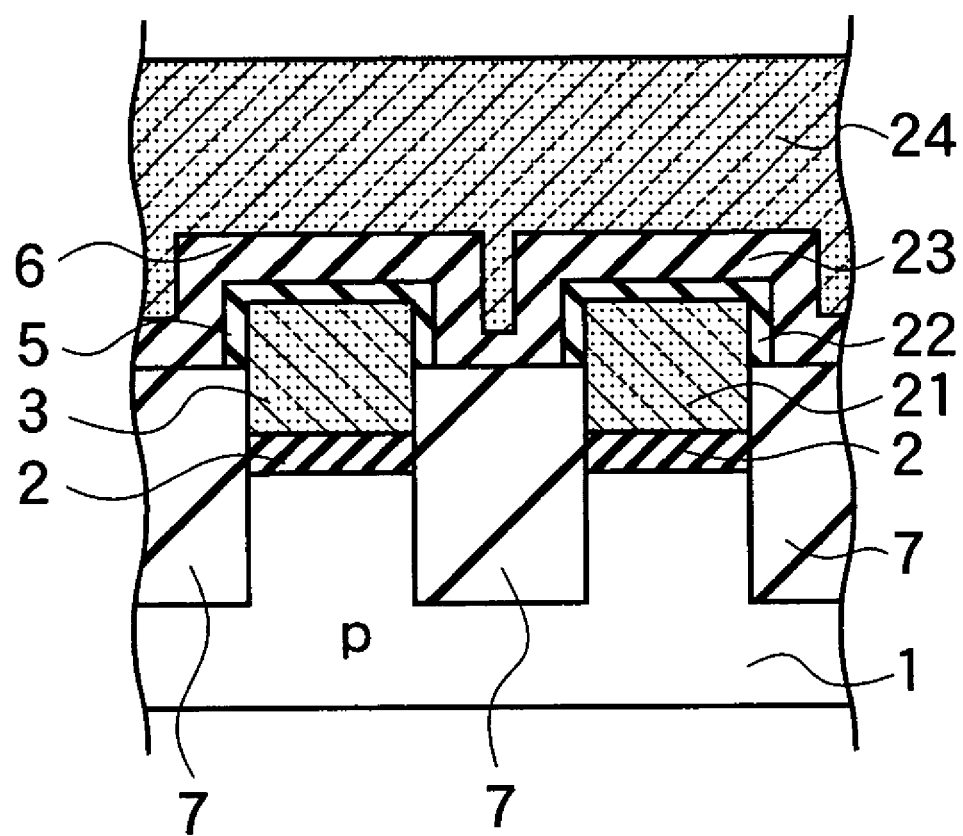
FIG. 22 is a schematic cross sectional view showing part of a memory cell array of the semiconductor memory according to a second embodiment of the present invention, which corresponds to the cross sectional view taken on line VB—VB in FIG. 5.

Similar to the semiconductor memory according to the first embodiment, a second embodiment of the present invention has a memory cell matrix, which embraces plural cell columns (NAND cell columns) extending along a column-direction, the cell columns are arranged along a row-direction in parallel. Plural memory cell transistors serially arranged along the column-direction implement each of the NAND cell columns. Each of the memory cell transistors is implemented by a stacked gate architecture, in which a charge accumulation layer is encompassed. Each of the electric charge accumulation levels in the respective charge accumulation layers, which are arranged in a matrix form, is controlled separately. FIG. 22 is a cross sectional view showing a corresponding part of the memory cell matrix 90 taken on line VB—VB in FIG. 5.

As shown in FIG. 22, the memory cell matrix of the semiconductor memory according to the second embodiment encompasses: device isolation films 7, which are arranged upon a semiconductor substrate 1 between adjacent NAND cell columns; plural floating gate electrodes 21, which are isolated from each other by these device isolation films 7; plural interface insulators 22, which are respectively arranged on crests of the floating gate electrodes 21; an inter-electrode dielectric 23, which is arranged upon the device isolation films 7 and the interface insulators 22' respectively; and a control gate electrode 24, which is arranged upon the inter-electrode dielectric 23. A positive charge layer, preferably a fixed positive charge layer is incorporated in the lower-level region of approximately 0.5 to 3 nm thick interface insulators 22. The interface insulators 22 are made from an insulating film having a dielectric constant lower than that of the inter-electrode dielectric 23. As explained in the first embodiment, "the lower-level region" means the layer positioned at a lower level than the center of the thickness of the interface insulators 22 (on the floating gate electrode 21 side).

More specifically, a plurality of approximately 5 to 10 nm thick tunnel oxide films, which become gate insulators 2 and through which mobile carrier conduct by the tunneling effect, are sandwiched between the semiconductor substrate 1 and the floating gate electrodes 21, and the plural floating gate electrodes 21 are arranged close to each other on the corresponding gate insulators (tunnel insulating film) 2. Each of the floating gate electrodes 21 has a topology of a rectangular parallelepiped, and isolated rectangular parallelepipeds are arranged along the column and row-directions. The device isolation films 7 are embedded between the adjacent floating gate electrodes 21 to approximately half the height thereof. Each of the device isolation films 7 is formed into a rectangular ridge sandwiched by the adjacent floating gate electrodes 21, and the rectangular ridge runs along the column-direction. The top surface and a portion of the side surfaces of each of the floating gate electrodes 21 are covered by the interface insulators 22. Namely, each of the interface insulators 22 covers the crest or the upper edge of the floating gate electrode 21, being formed continuously and extending along the row-direction from the crest (upper edge) of the floating gate electrode 21 to the side surfaces thereof. Thus, the farthest edges of the respective interface insulators 22 lie on the top surface level of the floating gate electrodes 4. Each of the interface insulators 22 is arranged to be isolated from that of the adjacent NAND cell column as shown in FIG. 22. An approximately 10 to 50 nm thick inter-electrode dielectric 23 arranged on the outer surface of the interface insulators 22 is made from an insulating film differing from the interface insulators 22, and are arranged extending to the adjacent NAND cell column. Since the adjacent interface insulators 22 are isolated from each other, there are no variations in the cell threshold voltage associated with the electric charge migration due to the conduction via trap levels in the interface insulators 22, the trap levels are provided so as to generate the positive charge layer. A variety of insulator films explained in the first embodiment may also be used as the inter-electrode dielectric 23 for the memory cell of the second embodiment. The control gate electrode 24 is arranged on the inter-electrode dielectric 23, extending to the adjacent NAND cell column so that the control gate electrode 24 can be shared by a plurality of NAND cell columns.

Figure 23A:
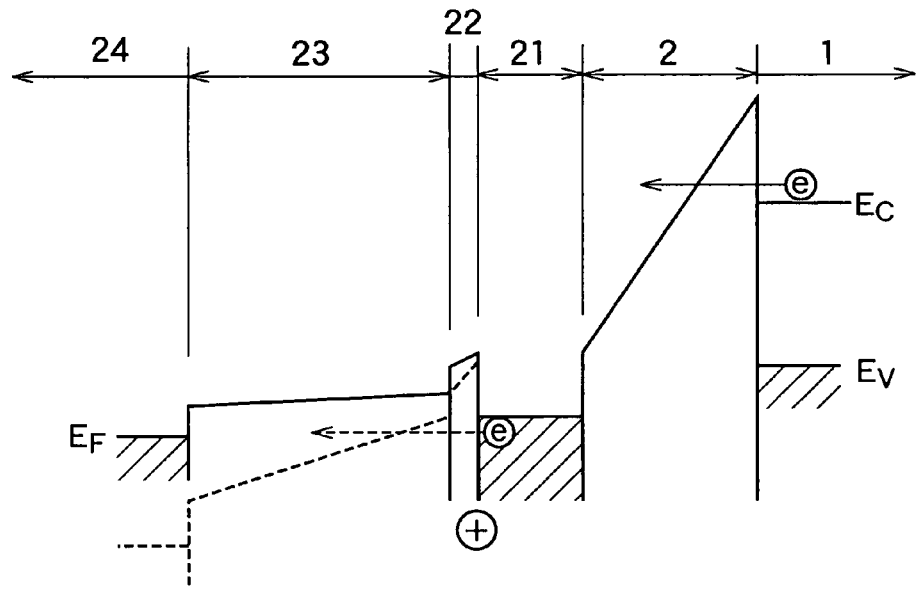
FIG. 23A is an energy band diagram explaining program operation in the memory cell structure of the semiconductor memory according to the second embodiment of the present invention.

FIG. 23A shows an energy band diagram at the program operation of a memory cell in the semiconductor memory according to the second embodiment, where the thickness of the gate insulator (tunneling oxide film) 2 is 8 nm, a 1 nm-thick silicon oxide ($SiO_2$) film is used as the interface insulators 22, and a 12 nm-thick alumina ($Al_2O_3$) film is used as the inter-electrode dielectric 23. For the semiconductor substrate 1, the conduction band edge $E_c$ and the valence band edge $E_v$ are represented. For the gate insulator 2, the interface insulator 22, and the inter-electrode dielectric 23, only the conduction band edge is represented. For the floating gate electrode 21 and the control gate electrode 24, a metallic band structure is assumed and Fermi level $E_F$ is represented in FIG. 23A. FIG. 23A shows the case in which fixed positive charges are distributed with an electron charge density of $4 \times 10^{13}$ $cm^2$ around the interface between the interface insulators 22 and the floating gate electrode 21; however, the electron charge density is not limited to that value. The electron charge density in the fixed positive charge layer needs to be $1 \times 10^{10}$ $cm^{-2}$ or greater, which is effective to a certain extent, but more preferably is to lie between $1 \times 10^{12}$ $cm^{-2}$ and $6 \times 10^{16}$ $cm^{-2}$. With an electron charge density greater than $6 \times 10^{16}$ $cm^{-2}$, defects will be generated and will remarkably decrease the quality of the interface insulators 22, increase the leakage current and decrease the surface morphology, therefore too much inclusion of electron charges is not favorable.

With the semiconductor memory according to the second embodiment, the program gate voltage applied to the control gate electrode 24, which is determined so that a desired tunneling current (Fowler-Nordheim current) can flow through the gate insulator 2, decreases by 5 volts from the voltage when there is no fixed positive charge layer, which is indicated by the dotted line in FIG. 23A, due to a fixed positive charge layer of $4 \times 10^{13}$ $cm^{-2}$. If positive charges are distributed with an electron charge density of $1 \times 10^{12}$ $cm^{-2}$ or greater, the program gate voltage decreases by 0.1 volts or greater. Moreover, since the effective tunneling distance established in the inter-electrode dielectric 23 is long, the amount of tunneling current flowing through the inter-electrode dielectric 23 decreases. The amount of leakage current is equal to or less than a detection limit of $1 \times 10^{-2}$ $A/cm^2$ for the case where there is no fixed positive charge, but the amount of leakage current reduces approximately ten digits for the case where there is a fixed positive charge layer of $4 \times 10^{13}$ $cm^{-2}$ in the interface insulators 22. Even in the case where there is a fixed positive charge layer of $1 \times 10$ $cm^{-2}$, a decrease in the leakage current by a single digit can be expected.

Figure 23B:
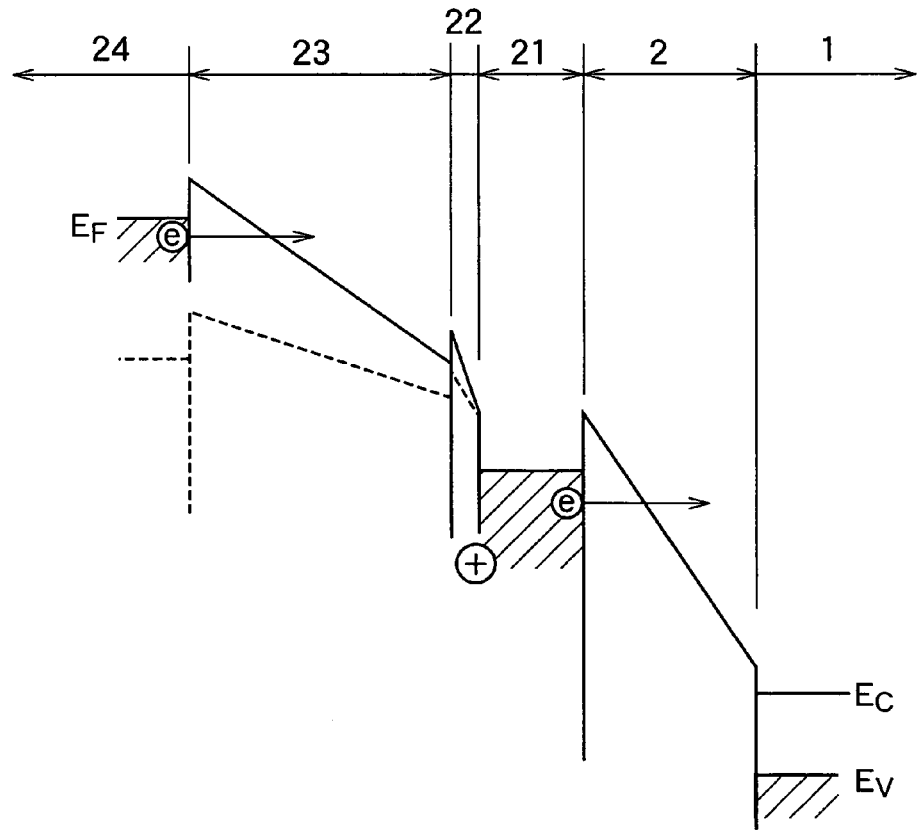
FIG. 23B is a corresponding energy band diagram explaining an erase operation in the memory cell structure of the semiconductor memory according to the second embodiment of the present invention.

FIG. 23B shows a corresponding energy band diagram during an erase operation of the semiconductor memory according to the second embodiment. The erase gate voltage applied to the control gate electrode 24, which is determined so that a desired tunneling current can flow through the gate insulator 2, increases higher than the voltage in the case where there is no fixed positive charge layer, which is indicated by the dotted line in FIG. 23B. Moreover, since the effective tunneling distance established in the inter-electrode dielectric 23 becomes shorter, the amount of tunneling leakage current flowing through the inter-electrode dielectric 23 increases. The leakage current flowing via the inter-electrode dielectric 23 during the erase operation as shown in FIG. 23B is approximately $1 \times 10^{-10}$ $A/cm^2$ to $1 \times 10^{-5}$ $A/cm^2$, and the increase in the erase gate voltage is approximately 3 to 10 volts. A more preferable structure for suppressing such leakage current will be explained later with a semiconductor memory according to a fourth embodiment.

In FIG. 23A, an example is given in which a silicon oxide film is employed as the interface insulator 22, however the interface insulators 22 is not limited to the silicon oxide film. For example, a silicon nitride film ($Si_3N_4$ film) or a silicon oxynitride film ($SiN_xO_y$ film) can be employed as the interface insulator 22. In the silicon nitride film or the silicon oxynitride film, the presence of a positively charged nitrogen atom with a coordinate number of two, bonded in the form such as Si—$N^+$—Si, implements the fixed positive charges.

In the semiconductor memory according to the second embodiment, the position of the fixed positive charge layer is not limited to the lower-level region of the interface insulators 22. However, it is preferable that the fixed positive charge layer is localized at or in the vicinity of the interface between the floating gate electrode 21 and the interface insulators 22 because even a low electron charge density can provide the aforementioned effectiveness.

Note that with the semiconductor memory according to the second embodiment, there is no theoretical limitation on the thickness of the fixed positive charge layer. Therefore, fixed positive charge layers can be distributed throughout the interface insulator 22, or they may be homogenously distributed throughout the interface insulator 22, and it is not necessary for the fixed positive charge layers to be in the lower-level region of the interface insulators 22.

Moreover, the fixed positive charge layers may be localized within a certain range in thickness, and a similar effectiveness may be provided as long as the electron charge density per unit area is the same and the position of the equivalent center of gravity in terms of charge (level of the equivalent center of gravity) is also the same. More specifically, it is preferable that the fixed positive charge layers are localized at or in the vicinity of the interface between the floating gate electrode 21 and the interface insulator 22 because even a low electron charge density can provide the aforementioned effectiveness. In other words, charge distribution with the equivalent center of gravity of the fixed positive charge layer being positioned on the lower-level region side of the interface insulator 22 is preferable because even a low electron charge density can provide the desired effectiveness. Accordingly, the thinner the thickness of the fixed positive charge layers, the more preferable since the equivalent center of gravity of the fixed positive charge layer becomes closer to the interface. In addition, considering the manufacturing method from a realistic viewpoint, it is preferable that the thickness of the fixed positive charge layers be equal to the thickness of approximately one molecular layer (approximately twice the interval between atoms) in the insulator film.

In the semiconductor memory according to the second embodiment, the positive charges are not limited to fixed charges; alternatively, they may be mobile charges. Mobile ions such as sodium ions ($Na^+$) or potassium ions ($K^+$) may be incorporated through a thermal diffusion process after formation of the interface insulator 22. Moreover, they may be implanted by an ion implantation process. However, fixed charges are preferable because there is no change in the charge distribution during memory cell operations and no change in the memory cell electric characteristics.

Although the inter-electrode dielectric 23 made from an insulating film differing from the interface insulators 22 is arranged on the outer surface of the interface insulators 22, extending to the adjacent NAND cell column so that the inter-electrode dielectric 23 can be shared by a plurality of NAND cell columns, a variety of insulator films explained in the first embodiment may be used as the inter-electrode dielectric 23. Because the thickness of the inter-electrode dielectric 23 depends on the dielectric constant of the film material, an approximately 10 to 20 nm thickness is preferable, when using an alumina film for the inter-electrode dielectric 23. The control gate electrode 24 is arranged on the outer surface of the inter-electrode dielectric 23, extending to the adjacent NAND cell column so that the control gate electrode 24 can be shared by a plurality of NAND cell columns.

A fabrication method of the semiconductor memory according to the second embodiment is described referencing FIGS. 24 to 28. The cross sectional view cut along the length of the bit line is omitted from FIGS. 24 to 28. It should be noted that the fabrication method of the semiconductor memory according to the second embodiment given below is merely an example, and other various fabrication methods including this modified example may naturally be implemented.

Figure 24:
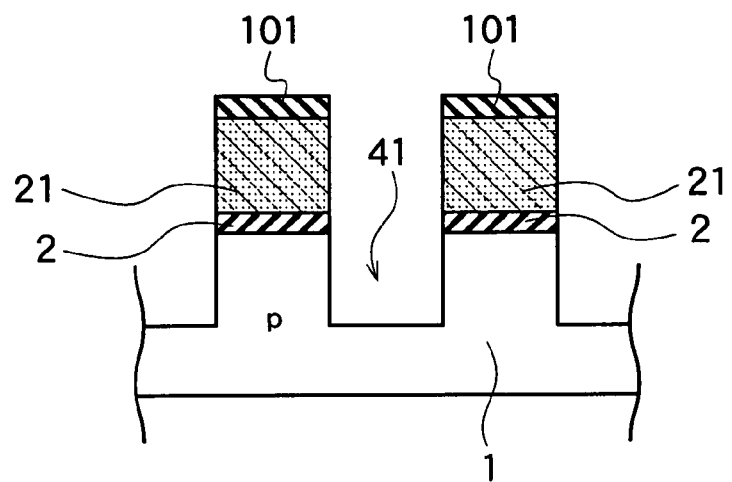
FIG. 24 is a process flow cross section explaining a fabrication method for the semiconductor memory according to the second embodiment of the present invention, which corresponds to the cross sectional view taken on line VB—VB in FIG. 5.

(a) To begin with, a 10 nm-thick tunnel oxide film, which becomes the gate insulators 2, is formed by thermal oxidation upon the surface of a semiconductor substrate (Si substrate) 1 doped with a desired impurity. Subsequently, a 100 nm-thick phosphorous-doped polysilicon layer 21, which becomes the floating gate electrodes 21, and a masking film 101, which is used for a device isolation process, are successively deposited by the CVD method. The masking film 101, the polysilicon layer 21, and the tunnel oxide film (gate insulators) 2 are then successively etched by the RIE method using resist film masks (not shown in the drawing) so as to expose a part of the top surface of the semiconductor substrate 1. Then, the exposed regions of the semiconductor substrate 1 are etched, so as to form 100 mm deep device isolation trenches 41 running along the column-direction as shown in FIG. 24. In other words, the plural device isolation trenches 41 define plural rectangular ridges running along the column-direction, each of the rectangular ridges encompassing the masking film 101, the polysilicon layer 21, the tunnel oxide film 2 and the upper portion of the semiconductor substrate 1.

Figure 25:
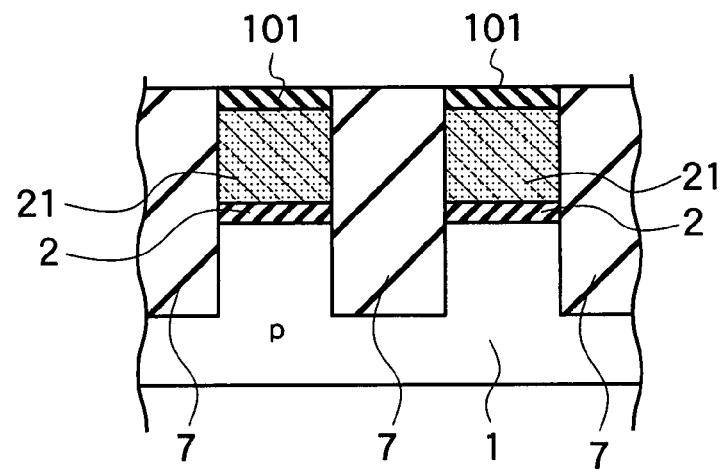
FIG. 25 is a subsequent process flow cross section explaining the fabrication method for the semiconductor memory according to the second embodiment after the process stage shown in FIG. 24.

(b) Next, a silicon oxide film 7 used for device isolation is deposited across the entire surface, so as to completely fill in the device isolation trenches 41. Subsequently, the top surface portions of the silicon oxide film 7 are removed by the CMP method until the masking film 101 is exposed, planarizing the surface as shown in FIG. 25. As a result, the device isolation film 7 made from the silicon oxide film is buried in the device isolation trenches 41.

Figure 26:
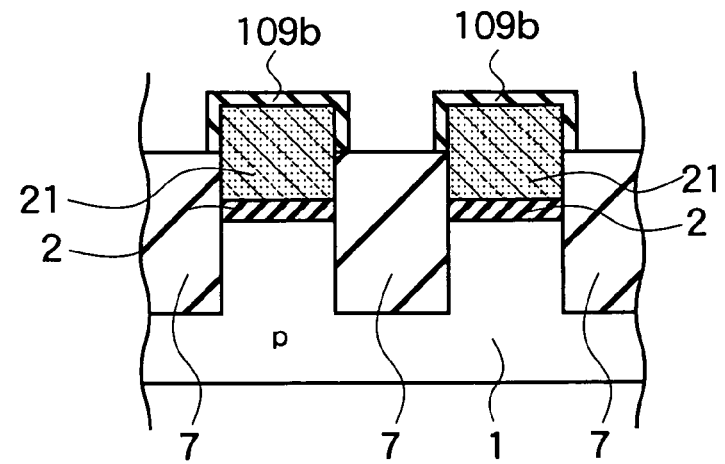
FIG. 26 is a subsequent process flow cross section explaining the fabrication method for the semiconductor memory according to the second embodiment after the process stage shown in FIG. 25.

(c) Next, the exposed masking film 101 at the top surface is selectively etched and removed. Further thereafter, regions in the vicinity of the top surface of the silicon oxide films 7 are partially etched with a diluted hydrofluoric acid (HF) solution so as to expose the side surfaces of the polysilicon layers 21. The height of the exposed side surfaces is set at 50 nm. When rinsing after this diluted hydrofluoric acid processing, as shown in FIG. 26, a natural oxide film 109b with a thickness under 1 nm is formed on the top surface and the exposed side surface of the respective floating gate electrodes (polysilicon layer) 21.

Figure 27:
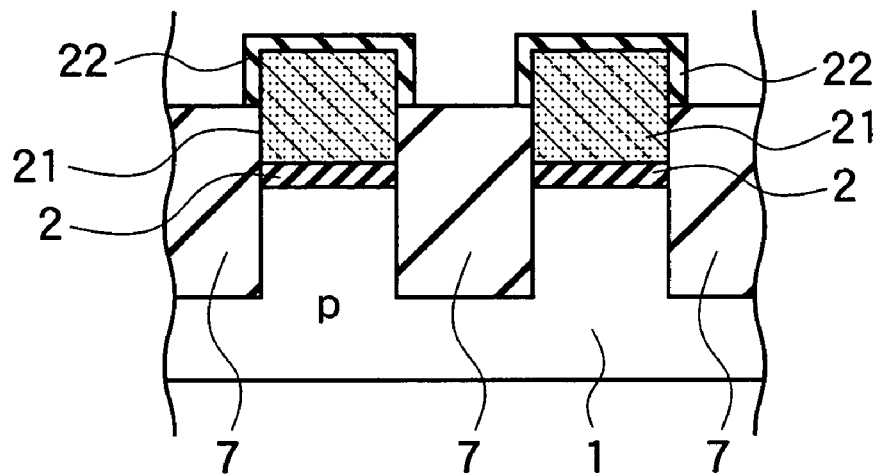
FIG. 27 is a subsequent process flow cross section explaining the fabrication method for the semiconductor memory according to the second embodiment after the process stage shown in FIG. 26.

(d) Next, the semiconductor substrate 1 is introduced into a LPCVD furnace and exposed under a nitrogen monoxide (NO) ambient at 850° C. so as to directly nitride the surface of the natural oxide films 109b and the surface of the floating gate electrodes (polysilicon layer) 21 under the natural oxide films 109b so as to form composite insulating films, each encompassing a silicon nitride film ($SiN_xO_y$ film) containing oxygen and a silicon oxide film stacked on the $SiN_xO_y$. Although a detailed growth mechanism of the fixed positive charges may be left to academic discussions, in the lower lying silicon oxynitride film ($SiN_xO_y$ film), the positively charged nitrogen atom having a coordinate number of two, bonded in the form such as Si—$N^+$—Si may be generated so as to form the fixed positive charges. Since it is known in the art, by the heat treatment under a nitrogen monoxide (NO) ambient so as to inject nitrogen atoms into the lattice structure of the natural oxide film (chemical oxide film) 109b, the oxygen atoms in the lattice structure of the natural oxide film are exchanged by the injected nitrogen atoms, oxygen-vacancies (film-structural defects) are assumed, in a model, to be generated so as to provide the fixed positive charges during the exchange reactions. Next, as shown in FIG. 27, the silicon oxide films on the $SiN_xO_y$ films are removed with diluted hydrofluoric acid, leaving only the $SiN_xO_y$ films 22, which become interface insulators. The $SiN_xO_y$ films 22 are left in the interfaces between the device isolation films 7 and the first conductive layers 21, covering a part of the side surface of the first conductive layers 21 as shown in FIG. 27. The film thickness of the remaining interface insulators ($SiN_xO_y$) 22 is approximately 1 nm. Instead of the thermal nitridation under a nitrogen monoxide (NO) ambient, the surface of the natural oxide films 109b and the surface of the floating gate electrodes (polysilicon layer) 21 may be thermally nitrided under an ammonia ($NH_3$) or dinitrogen oxide ($N_2O$) ambient. Or the interface insulator ($SiN_xO_y$) 22 containing the fixed positive charge layer may be formed by the radical nitridation method, in which the nitrogen radicals are formed in plasma under a mixed ambient of nitrogen gas and an inert gas.

Figure 28:
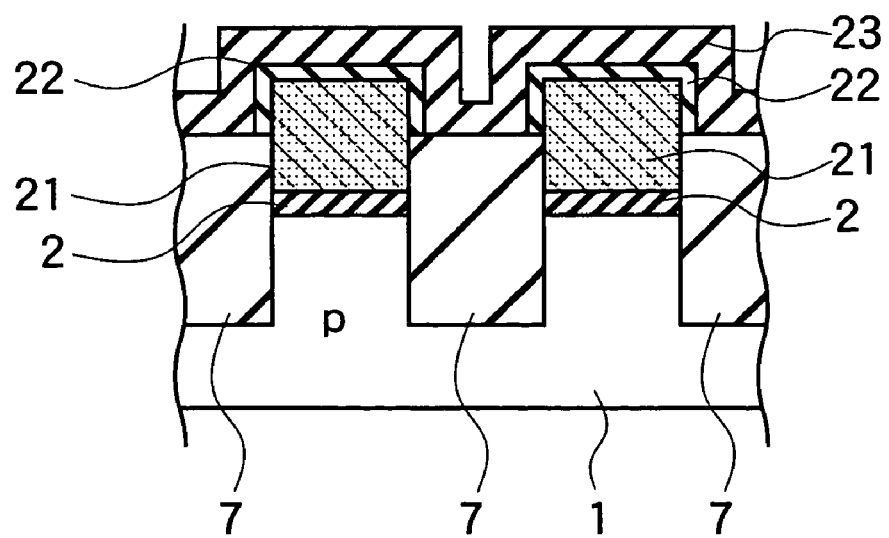
FIG. 28 is a subsequent process flow cross section explaining the fabrication method for the semiconductor memory according to the second embodiment after the process stage shown in FIG. 27.

(e) Next, as shown in FIG. 28, a 12 nm-thick $Al_2O_3$ film 6 is deposited as an inter-electrode dielectric across the entire surface by LPCVD.

(f) Subsequently, a polysilicon layer/tungsten silicide ($WSi_2$) layer is deposited across the entire surface so as to form control gate electrodes 24. The thickness of the control gate electrodes 24 is set as 100 nm, for example. Moreover, a masking film for RIE is deposited by the CVD method. Through the RIE method using resist film masks, the masking film, the control gate electrodes 24, the inter-electrode dielectric ($Al_2O_3$ film) 23, the interface insulator s ($Si_3N_4$ films) 22, the floating gate electrodes 21, and the gate insulators (tunnel oxide films) 2 are then successively and selectively etched to form a plurality of slits running parallel along the length of the word lines, which isolate memory cell transistors aligned in each of the memory cell columns. The shape of the floating gate electrodes 21 and the control gate electrodes 24 are accordingly determined. That is, the shape of the each of the floating gate electrodes 21 is cut into a topology of a rectangular parallelepiped, and isolated rectangular parallelepipeds are arranged along the column and row-directions. The shape of each of the control gate electrodes 24 is cut into a ridge running along the row-direction.

(g) Next, silicon oxide films, which are called "electrode sidewall films", are formed by thermal oxidation on the exposed side surface of the silts running along the word line length, or along the row-direction. Then, source and drain diffusion regions for each memory cell transistor are formed in the semiconductor substrate 1 at the bottoms of the respective slits by ion implantation, and the serially connected memory cell transistors along the column-direction are formed, the channel length of each of the memory cell transistors is defined by the electrode sidewall film. In this way, the core, or the memory matrix cite of the semiconductor memory according to the second embodiment shown in FIG. 22 is completed. Actually, an interlayer insulating film is additionally formed by the CVD method so as to cover the entire surface, and it goes without saying that an interconnect layer or the like is then formed through a well-known method as explained in the first embodiment.

It should be noted that the semiconductor memory or the fabrication method thereof according to the second embodiment is not limited to the NAND flash memory, and is naturally applicable to various nonvolatile memories, such as NOR flash memory, AND flash memory, each of the nonvolatile memories encompasses one or more transistors having floating gates serving as the electric charge accumulating layers. One of the examples of the nonvolatile memories is AND flash memory, of which the equivalent circuit is given in FIG. 21.

Modification of the Second Embodiment

Referencing FIGS. 26 and 27, the methods in which the interface insulator 22 containing the fixed positive charge layer is formed by thermal nitridation under a nitrogen monoxide (NO) ambient, ammonia ($NH_3$) ambient or dinitrogen oxide ($N_2O$) ambient, or the interface insulator 22 is formed by the radical nitridation using the nitrogen radicals have been explained, these formation methods of the interface insulators 22 are merely examples, and other various formation methods including modified examples may naturally be implemented. For example, a silicon nitride film ($Si_3N_4$ film) or a silicon oxynitride film ($SiN_xO_y$ film) 25 may be thermally oxidized under an ozone ($O_3$) ambient or steam ($H_2O$) ambient so as to generate the fixed positive charge layers, as explained in the following description of a modification of the second embodiment of the present invention.

Figure 29:
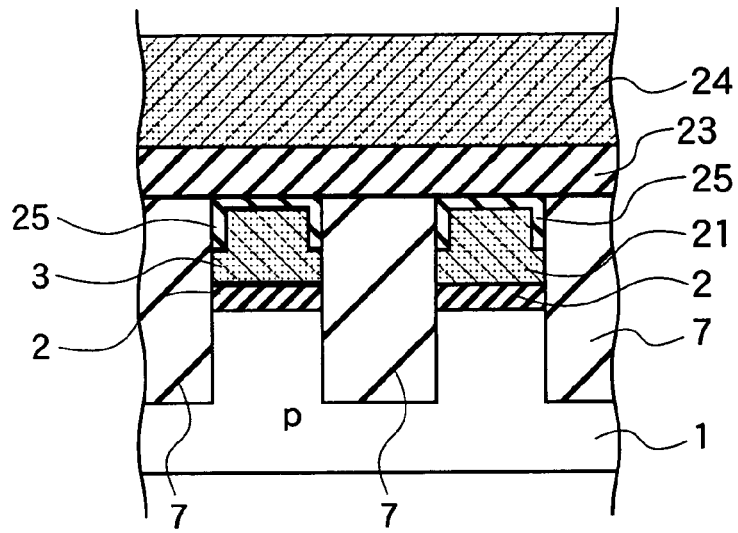
FIG. 29 is a schematic cross sectional view showing part of a memory cell array of the semiconductor memory according to a modification of the second embodiment of the present invention, which corresponds to the cross sectional view taken on line VB—VB in FIG. 5.

FIG. 29 is a cross sectional view showing a corresponding part of the memory cell matrix taken on line VB—VB in FIG. 5. A semiconductor memory according to a modification of the second embodiment of the present invention, as shown in FIG. 29, encompasses the floating gate electrodes 21, which have side surfaces partially covered by the device isolating films 7 and partially covered by the interface insulators 25. The interface insulators 25, each incorporating a fixed positive charge layer, are disposed such that the interface insulators 25 cover respectively on the top surface of the floating gate electrodes 21. Namely, each of the interface insulators 25, containing the fixed positive charge layers, covers the upper edge of the corresponding floating gate electrode 21, formed continuously extending from the top surface to the side surfaces of the floating gate electrode 21.

The configuration in which the interface insulators 25 incorporates the fixed positive charge layers extending to the side surface of the floating gate electrodes 21 and the side surface serves as the interface between the device isolating films 7 and the floating gate electrodes 21, is similar to the configuration of the semiconductor memory according to the modification of the second embodiment. However, the configuration of the semiconductor memory according to the modification of the second embodiment differs from the modification of the second embodiment in that the interface insulator 25 incorporating the fixed positive charge layer is buried in the top surface and in a portion of the side surfaces of the floating gate electrodes 21, and the interface between the interface insulators 25 and the floating gate electrodes 21 is lower than the original level of the top surface of the floating gate electrodes 21. Further, the interface between the interface insulators 25 and the floating gate electrodes 21 is internal compared to the original level of the side surface of the floating gate electrodes 21. In other words, the interface insulators 25 is generated as a result of the reaction of the semiconductor material, which implements the top surface of the floating gate electrodes 21 and a portion of the side surfaces thereof continuing to the top surface, with other elements such as oxygen, therefore it differs from the configuration of the semiconductor memory explained in the second embodiment.

Specifically, a case where the interface insulator 25 incorporating the fixed positive charge layer is a silicon oxynitride film, or the $SiN_xO_y$ film, which is formed by direct thermal nitridation of the surface of the polysilicon layer implementing the floating gate electrodes 21, will be exemplified in the modification of the second embodiment. However, the interface insulator 25 incorporating the fixed positive charge layer can also naturally be a $SiN_xO_y$ film not containing oxygen (y=0), namely a silicon nitride film ($Si_3N_4$ film).

In other words, in the memory cell transistor according to the modification of the second embodiment, portions of the side surfaces of the floating gate electrodes 21 are covered by the device isolating films 7, and the whole of the top surface of the floating gate electrodes 21 is covered by the interface insulators 25 made from the $SiN_xO_y$ film, incorporating the fixed positive charge layer. Furthermore, the interface insulators 25 made from the $SiN_xO_y$ films are provided even in the region of the interface between the device isolating films 7 and the floating gate electrodes 21. In addition, the farthest edges of the respective interface insulators 25 incorporating the fixed positive charge layer lies at the side surface of the respective floating gate electrode 21, which is a level deeper than the top surface of the device isolation film 7, therefore it differs from the case of the semiconductor memory according to the modification of the second embodiment. Otherwise, it is effectively similar to the modification of the second embodiment, and thus duplicate descriptions are omitted. In the memory cell transistor according to the modification of the second embodiment described above, because the adjacent interface insulators 25 incorporating the fixed positive charge layer are isolated from each other, there are no variations in the cell threshold voltage associated with the electric charge migration via charged trap levels in the interface insulators 25, the charged trap levels are incorporated so that the fixed positive charge layer can be generated in the interface insulators.

It should be noted that the case of the double layers of the interface insulator 25 and the inter-electrode dielectric 23 have been exemplified in FIG. 29, however, the memory cell transistor according to the modification of the second embodiment is not limited thereto. The inter-electrode dielectric ($Al_2O_3$ film) 23 may also be a different high dielectric constant insulating film as described in the semiconductor memory according to the first and second embodiments, and may also be a multi-level composite film. In addition, it may also be an ONO film. Furthermore, the modification of the second embodiment is applicable even to the case where a silicon oxide film ($SiO_2$ film), which is thin enough for an electric charge to easily penetrate, exists between the floating gate electrode 21 and the interface insulator (SiN$_x$O$_y$ film) 25. It is preferable that the thickness of this silicon oxide film is typically under 2 nm. Furthermore, the interface insulator 25 is not limited to the oxynitride film (SiN$_x$O$_y$).

A fabrication method of the semiconductor memory according to the modification of the second embodiment is described referencing FIGS. 30 to 33. The cross sectional view showing a corresponding part of the memory cell matrix taken on line VA—VA in FIG. 5 is omitted from FIGS. 30 to 33. It should be noted that the fabrication method of the semiconductor memory according to the modification of the second embodiment given below is merely an example, and other various fabrication methods including this modified example may naturally be implemented.

Figure 30:
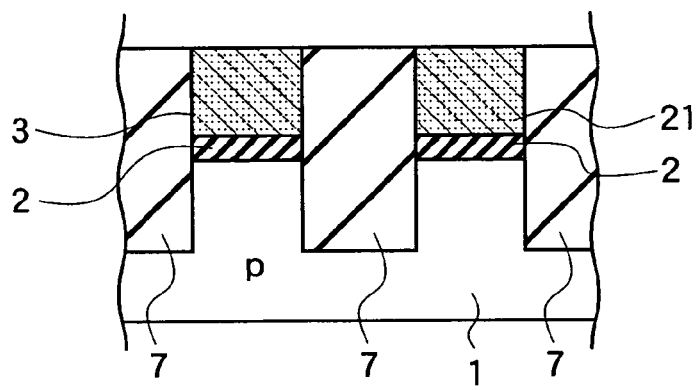
FIG. 30 is a process flow cross section explaining a fabrication method for the semiconductor memory according to the modification of the second embodiment of the present invention, which corresponds to the cross sectional view taken on line VB—VB in FIG. 5.

(a) To begin with, similar to the fabrication method of the semiconductor memory according to the second embodiment, a tunnel oxide film, which becomes gate insulators 2, is formed by thermal oxidation upon the surface of a semiconductor substrate (Si substrate) 1. Subsequently, a polysilicon layer 21, which becomes floating gate electrodes 21, and a masking film, which is used for processing for device isolation, are successively deposited by the CVD method. The masking film, the polysilicon layer 21 and the tunnel oxide film (gate insulators) 2 are then successively and selectively etched by the RIE method so as to expose a part of the semiconductor substrate 1. Further, the exposed regions of the semiconductor substrate 1 are etched so as to form device isolation trenches (See FIG. 24). Next, a silicon oxide film 7 used for the isolation of devices is deposited across the entire surface, completely filling in the device isolation trenches. Subsequently, the silicon oxide film 7 at the surface portion is selectively removed by using the CMP method until the top surface of the masking film is exposed, and further, the surface is polished by the CMP method until all of the masking film is removed so as to planarize the surface as shown in FIG. 30. FIG. 30 illustrates the state where the device isolation films 7 made from silicon oxide film are filled in the device isolation trenches.

Figure 31:
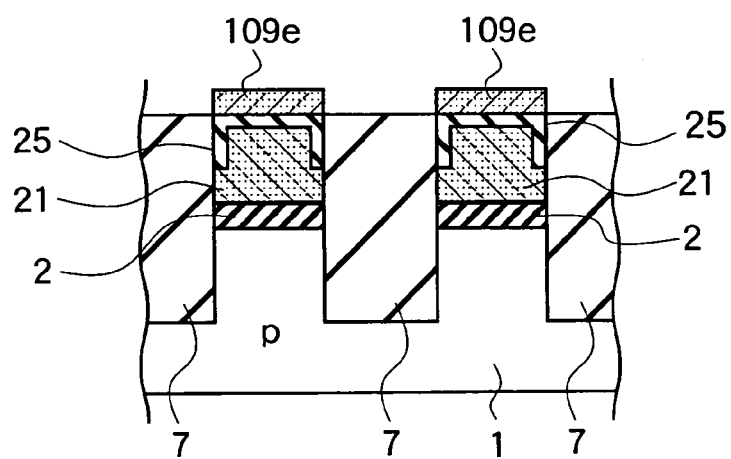
FIG. 31 is a subsequent process flow cross section explaining the fabrication method for the semiconductor memory according to the modification of the second embodiment after the process stage shown in FIG. 30.
Figure 32:
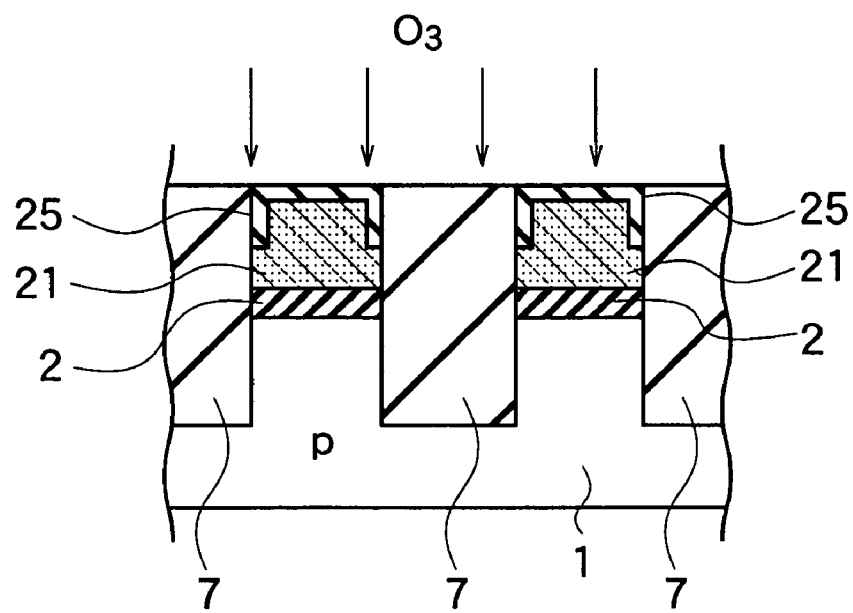
FIG. 32 is a subsequent process flow cross section explaining the fabrication method for the semiconductor memory according to the modification of the second embodiment after the process stage shown in FIG. 31.

(b) Subject to annealing under a nitrogen monoxide (NO) ambient at 850° C., the surfaces of the exposed floating gate electrodes (polysilicon layers) 21 are directly nitrided, and composite insulating films, each encompassing a silicon oxynitride film (SiN$_x$O$_y$ film) 25 and a silicon oxide film 109e stacked on the SiN$_x$O$_y$ film 25, are formed as shown in FIG. 31. The SiN$_x$O$_y$ films 25 encroach into the interfaces between the device isolation films 7 and the floating gate electrodes (polysilicon layers) 21 as shown in FIG. 31. Next, in a LPCVD furnace, the composite insulating films are exposed under an ozone (O$_3$) ambient or steam (H$_2$O) ambient so as to thermally oxidize the surface of the SiN$_x$O$_y$ films 25, thereby generating fixed positive charge layers in each of the SiN$_x$O$_y$ films 25. In the silicon oxynitride films (SiN$_x$O$_y$ film) 25, the positively charged nitrogen atoms, each having a coordinate number of two, bonded in the form such as Si—N$^+$—Si are presumed, in a model, to be generated, forming the fixed positive charges. Since it is known in the art, by the heat treatment under a nitrogen monoxide (NO) ambient so as to inject nitrogen atoms into the lattice structure of the natural oxide film (chemical oxide film) 109b, the oxygen atoms in the lattice structure of the natural oxide film are exchanged by the injected nitrogen atoms, oxygen-vacancies (film-structural defects) are assumed, in another model, to be generated so as to provide the fixed positive charges during the exchange reactions. Next, as shown in FIG. 32, the silicon oxide films 109e are removed with diluted hydrofluoric acid, leaving only the SiN$_x$O$_y$ films 25, which become interface insulators. The film thickness of the remaining interface insulators (SiN$_x$O$_y$) 25 is approximately 1 nm.

Figure 33:
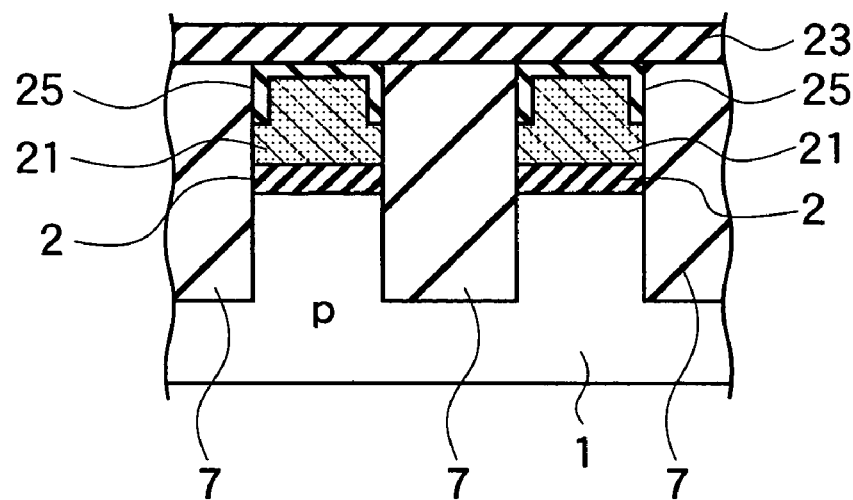
FIG. 33 is a subsequent process flow cross section explaining the fabrication method for the semiconductor memory according to the modification of the second embodiment after the process stage shown in FIG. 32.

(c) Next, as shown in FIG. 33, a 15 nm-thick Al$_2$O$_3$ film 23 is deposited as an inter-electrode dielectric across the entire surface by the LPCVD method. Subsequently, a conductive layer, which becomes a control gate electrode 24 is deposited across the entire surface, and a masking film for RIE is further deposited thereupon by the CVD method. By the RIE method using resist film masks, the masking film, the control gate electrodes 24, the inter-electrode dielectric (Al$_2$O$_3$ film) 23, the interface insulator (SiN$_x$O$_y$ film) 25, the floating gate electrodes 21, and the gate insulators (tunnel oxide film) 2 are then successively and selectively etched, and slits are formed along the length of the word lines so as to isolate each memory cell. The shapes of the floating gate electrodes 21 and the control gate electrodes 24 are determined accordingly. Next, an electrode sidewall film is formed on the exposed side surface of the silts along the word line length, and then forms source/drain diffusion layers of the memory cell transistor through ion implantation, thus the memory cell transistor according to the modification of the second embodiment shown in FIG. 29 is completed. In actuality, naturally, interconnect layers or the like are further formed after formation of an interlayer insulator film.

As such, according to the fabrication method of the semiconductor memory according to the modification of the second embodiment, the interface insulators (SiN$_x$O$_y$ films) 25 incorporating the fixed positive charge layers can be selectively formed in the top and side surfaces of the floating gate electrodes 21, the fixed positive charge layers are implemented by positively charged nitrogen atoms, each having a coordinate number of two, presumably bonded in the form such as Si—N$^+$—Si, or by oxygen-vacancies (film-structural defects).

Third Embodiment

As shown in FIG. 7B, in the erase operation of the semiconductor memory according to the first embodiment, when the erase gate voltage applied to the control gate electrode 24, which is determined so that a desired tunneling current can flow through the gate insulator 2, increases higher than the voltage in the case where there is no positive charge layer, since the effective tunneling distance established in the inter-electrode dielectric 11 becomes shorter, the amount of tunneling leakage current flowing through the inter-electrode dielectric 11 increases. A more preferable structure for suppressing such tunneling leakage current will be explained, referencing energy band diagrams shown in FIGS. 34A and 34B, in a semiconductor memory according to a third embodiment.

Similar to the structure shown in FIGS. 6A and 6B, in the semiconductor memory according to the third embodiment, each of the memory cell transistors is implemented by a stacked gate architecture, in which the gate insulator 2, through which mobile carrier conduct by the tunneling effect, the floating gate electrode 21, the inter-electrode dielectric 11, and the control gate electrode 24 are stacked on the semiconductor substrate 1 in order.

However a feature in which the inter-electrode dielectric 11 incorporates a positive charge layer, preferably a fixed positive charge layer in the lower-level region of the inter-electrode dielectric 11, and further, a negative charge layer, preferably a fixed negative charge layer distributing above and separated from the positive charge layer in the inter-electrode dielectric 11 is distinguishable from the features explained in the first embodiment. Here, "the lower-level region" means a layer being distributed in the lower half of the inter-electrode dielectric 11, or the layer locally positioned at a lower level than the center of the thickness of the inter-electrode dielectric 11 (on the floating gate electrode 21 side). For example, the inter-electrode dielectric 11 may be divided into five sub-layers such as a first sub-layer having no significant charges; a second sub-layer disposed on the first sub-layer, having a distribution of positive charges; a third sub-layer disposed on the second sub-layer, having no significant charges; a fourth sub-layer disposed on the third sub-layer, having a distribution of negative charges; and a fifth sub-layer disposed on the fourth sub-layer, having no significant charges. The sum of the thickness of the third to fifth sub-layers is larger than the sum of the thickness of the first and second sub-layers so that the fixed positive charge layer can be localized in the lower half of the inter-electrode dielectric 11. Here, the first sub-layer can be omitted. The distribution of the positive charges in the second sub-layer, or the distribution of the negative charges in the fourth sub-layer is not required to be uniform.

The fixed positive charge layer may be a layer containing film structural defects such as oxygen vacancies ($V_O^{2+}$) or an impurity atom bonded to a positively charged atom, which constitutes a network of the inter-electrode dielectric 11, such as boron bonded to a positively charged oxygen atom so as to form a bond structure of B—O$^+$.

The fixed negative charge layer may be a layer containing a film structural defect such as interstitial oxygens ($O_I^{2-}$). Or, the fixed negative charge layer may be a layer containing an impurity atom bonded to a negatively charged atom, which constitutes network of the inter-electrode dielectric 11, such as a phosphorous (P) or an arsenic (As) atom bonded to a negatively charged atom so as to form a bond structure of P—O$^-$ or As—O$^-$.

The spacing between the fixed positive and negative charge layers can be set freely, but it is preferable to select a narrower value. For example, the spacing may be selected between 0.5–5 nm, or it is preferable to select a value between 1–3 nm. The minimum value of the spacing between the fixed positive and negative charge layers may be an inter-atomic distance, or the length of the bond such as Si—O, implementing the lattice structure of the inter-electrode dielectric 11.

For example, in the case where a silicon oxide (SiO$_2$) film is employed as the inter-electrode dielectric 11, as the inter-atomic distance of the bond Si—O, the following values are reported:

0.1654 nm for silanol (Si (OH)$_4$);
0.1595 nm for quartz;
0.1605 nm for cristobalite;
0.1757 nm for stishovite;

Furthermore, because the inter-atomic distance of the bond Si—Si is repotted as around 0.285 nm, the minimum value of the spacing between the fixed positive and negative charge layers must be larger than these values. When the fixed positive and negative charge layers implement a dipole, because the length of the dipole may be larger than twice that of the inter-atomic distance of the bond Si—O or Si—Si, the minimum value of the spacing between the fixed positive and negative charge layers may be an order of 0.5 nm.

In principle, the positions of the fixed negative charge layer can lie at any level up to the control gate electrode 24 as long as the fixed negative charge layer is disposed above the fixed positive charge layer. However, it is preferable that the horizontal level of the negative charge layer is localized in the vicinity of the horizontal level of the fixed positive charge layer, because even a low electron charge density can provide the effectiveness, which will be explained in the following.

Figure 34A:
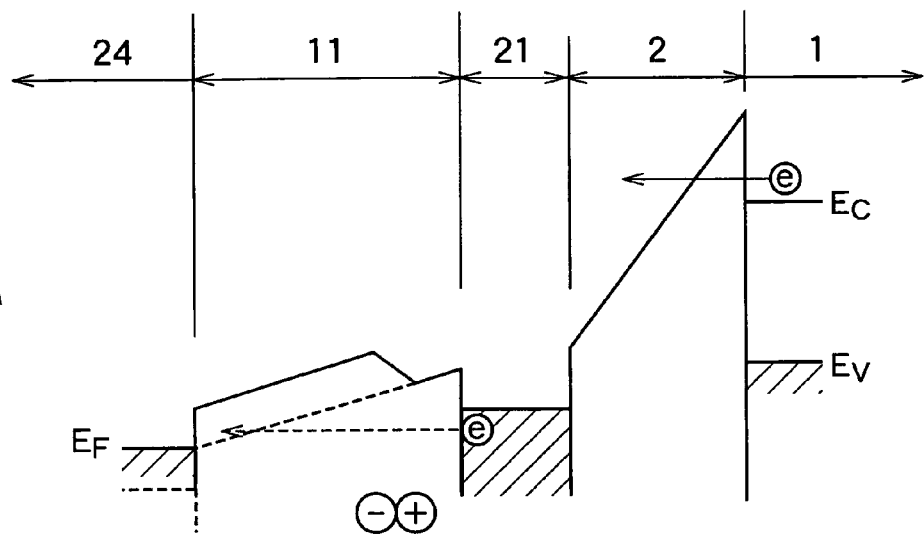
FIG. 34A is an energy band diagram explaining program operation in a memory cell structure of a semiconductor memory according to a third embodiment of the present invention.
Figure 34B:
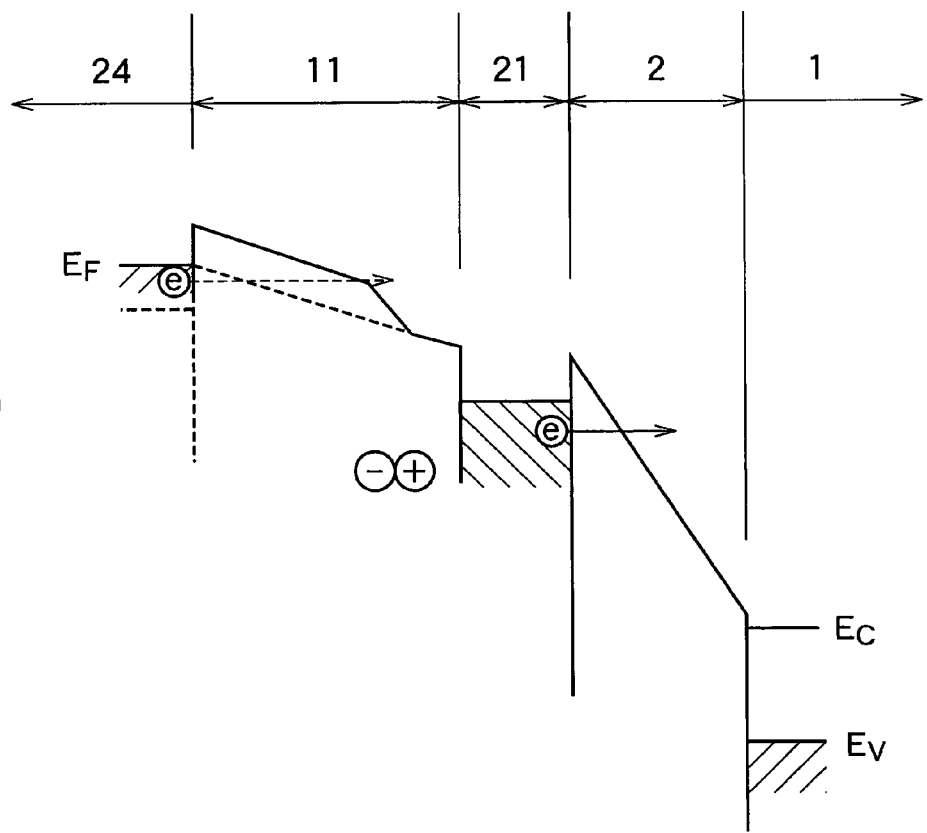
FIG. 34B is a corresponding energy band diagram explaining an erase operation in the memory cell structure of the semiconductor memory according to the third embodiment of the present invention.

FIG. 34A shows an energy band diagram during the program operation, and FIG. 34B shows a corresponding energy band diagram during the erase operation of the semiconductor memory according to the third embodiment. For the semiconductor substrate 1, the conduction band edge $E_c$ and the valence band edge $E_v$ are represented. For the gate insulator 2 and the inter-electrode dielectric 11, only the conduction band edge is represented. For the floating gate electrode 21 and the control gate electrode 24, a metallic band structure is assumed and Fermi level $E_F$ is represented in FIGS. 34A and 35B. Similar to the structure explained in the first embodiment, the thickness of the gate insulator (tunneling oxide film) 2 is 8 nm, and a 12 nm-thick alumina (Al$_2$O$_3$) film is used as the inter-electrode dielectric 11. FIGS. 34A and 34B show the case in which the spacing between the fixed positive and negative charge layers is 2 nm.

In the semiconductor memory according to the third embodiment, because a fixed negative charge layer is disposed above a positive charge layer in the inter-electrode dielectric 11, the fixed negative charge layer is separated from the positive charge layer by a specific distance, the program gate voltage is reduced while reducing the leakage current flowing through the inter-electrode dielectric 11 at the program operation, and the leakage current is also reduced at the erase operation. FIG. 34A shows the case in which fixed positive charges are distributed with an electron charge density of $4\times10^{13}$ cm$^{-2}$ at a position 2 nm away from the interface of the floating gate electrode 21, and fixed negative charges are distributed with an electron charge density of $4\times10^{13}$ cm$^{-2}$ at a position 4 nm away from the interface of the floating gate electrode 21 in the lower-level region of the inter-electrode dielectric 11; however, the electron charge density is not limited to those values. If the electron charge densities in the fixed positive and negative charge layers exceed the level of $1\times10^{10}$ cm$^{-2}$, certain effectiveness can be achieved, but it is more preferable that they fall between $1\times10^{12}$ cm$^{-2}$ and $6\times10^{16}$ cm$^{-2}$. As already explained in the first embodiment, the "electron charge density" is defined by the number of electron charges per area. With an electron charge density greater than $6\times10^{16}$ cm$^{-2}$, because defects will be generated so as to remarkably decrease the quality of the inter-electrode dielectric 11, increasing the leakage current and decreasing the surface morphology, therefore, it is not recommended to include such a large amount of electron charges.

As shown in FIGS. 34A and 34B, by distributing the fixed negative charge layer, having approximately the same electron charge density with that of the fixed positive charge layer, the drawbacks ascribable to the presence of the fixed positive charge layer, which was pointed out in the first embodiment, referencing to FIG. 7B, can be overcome. The amount of the leakage current at the erase operation is equal to or less than a detection limit of $1\times10^{-2}$ A/cm$^2$; the increase of the erase gate voltage is suppressed to be less than one volt. The program gate voltage is reduced by one volt, approximately, compared with the case in which there are no positive and negative charges.

If the improvement of the performances at the program operation, such as the decrease of leakage current and the decrease of the program gate voltage, is prior to other improvements, electron charge density of the fixed positive charge layer should be larger than that of the fixed negative charge layer. If the improvement of the performances at the erase operation, such as the decrease of leakage current and the decrease of the erase gate voltage, is prior to other improvements, electron charge density of the fixed positive charge layer should be smaller than that of the fixed negative charge layer.

Note that with the semiconductor memory according to the third embodiment, there is no theoretical limitation on the thickness of the fixed positive/negative charge layers, and the positions of the fixed positive/negative charge layers are not limited to the lower-level region of the inter-electrode dielectric 11. However, it is preferable that the fixed positive charge layer is localized at or in the vicinity of the interface between the floating gate electrode 21 and the inter-electrode dielectric 11 because even a low electron charge density can provide the aforementioned effectiveness. In other words, charge distribution with the equivalent center of gravity of the fixed positive charge layer being positioned on the lower-level region side of the inter-electrode dielectric 11 is preferable because even a low electron charge density can provide the desired effectiveness.

Therefore, the thinner the thickness of the fixed positive charge layer, the more preferable since the equivalent center of gravity of the fixed positive charge layer becomes closer to the interface between the floating gate electrode 21 and the inter-electrode dielectric 11. Furthermore, the thinner the thickness of the fixed positive/negative charge layers, the more preferable since the fixed positive charge layer can be disposed closer to the fixed negative charge layer, which will allow the advantage that a lower electron charge density can provide the aforementioned effectiveness. In addition, considering the manufacturing method from a realistic viewpoint, it is preferable that the thickness of the fixed positive/negative charge layers be equal to the thickness of approximately one molecular layer (approximately twice the interval between atoms) in the insulator film.

Moreover, with the semiconductor memory according to the third embodiment, the positive/negative charges are not limited to fixed charges, and alternatively may be mobile charges. Similar to the semiconductor memory according to the first and second embodiments, positive mobile ions such as sodium ions ($Na^+$) or potassium ions ($K^+$) may be incorporated through a thermal diffusion process after formation of the interface insulator 22 so as to provide the positive charge layer. Moreover, positive mobile ions may be implanted by an ion implantation process so as to provide the positive charge layer. Further, negative mobile ions such as fluorine ions ($F^-$) or chlorine ions ($Cl^-$) may be incorporated through a thermal diffusion process after formation of the interface insulator 22 so as to provide the negative charge layer. Moreover, negative mobile ions may be implanted by an ion implantation process so as to provide the negative charge layer. However, fixed charges are preferable because there is no change in the charge distribution during memory cell operations and no change in memory cell electric characteristics.

Formation of the fixed negative charge layer can be achieved by implanting impurity ions, such as or phosphorus ions ($^{31}P^+$) or arsenic ions ($^{75}As^+$), into the inter-electrode dielectric 11. Or, when the inter-electrode dielectric 11 is deposited by the CVD method or ALD method, a phosphorus (P) containing gas such as phosphine ($PH_3$) or a arsenic (As) containing gas such as arsine ($AsH_3$) may be added to a source gas so as to provide the fixed negative charge layer.

Further, when the inter-electrode dielectric 11 is deposited by the CVD method or ALD method, the increase of the oxygen composition from the stoichiometric composition value at the growth of a specific molecular layer can form the fixed negative charge layer by intestinal interstitial oxygens ($O_I^{2-}$) at the specific molecular layer.

The electron charge density of the fixed negative charge layer generated by the ion implantation method falls within the range of between 10 and 100% of an implanted dose $\Phi$ of ions. For example, after implanting phosphorus ions ($^{31}P^+$) into hafnium silicate ($HfSiO_2$) film so as to fabricate a MOS capacitor, followed by annealing at approximately 1000° C. for approximately 60 sec, the electron charge density obtained by a flat band voltage shift $\Delta V_F$ through C-V measurement is $3 \times 10^{12}$ cm$^{-2}$ for the fixed negative charge layer, when implanted dose $\Phi = 1 \times 10^{13}$ cm$^{-2}$. In this speculation of the electron charge density, the equivalent center of gravity of the negative positive charge layer is assumed to lie at the center of the inter-electrode dielectric 11. Similar results can be obtained for the ion implantations into a hafnium ($HfO_2$) film or an alumina ($Al_2O_3$) film. Furthermore, by the implantation of arsenic ions ($^{75}As^+$) into the inter-electrode dielectric 11, a similar generation of the fixed negative charge layer has been confirmed by the flat band voltage shift $\Delta V_F$ observed in the C-V measurement of a MOS capacitor having a capacitor insulator, in which arsenic ions ($^{75}As^+$) have been implanted.

In this way, control of the electron charge density of the fixed negative charge layer formed above the fixed positive charge layer in the inter-electrode dielectric 11 can be achieved by fabricating a control MOS capacitor in advance, finding a flat band voltage shift $\Delta V_F$ through C-V measurement, and then determining a relationship of an implanted dose $\Phi$ and the electron charge density of the generated, fixed negative charge layer as well as annealing conditions may be carried out.

Similarly, in the case of depositing the inter-electrode dielectric 11 using the CVD method or the ALD method and increasing the oxygen composition from the stoichiometric composition value so as to generate interstitial oxygens ($O_I^{2-}$), or in the case of adding a phosphorus (P) containing gas or a arsenic (As) containing gas to a source gas, the electron charge density of the fixed negative charge layer can be controlled by forming a control MOS capacitor, finding the flat band voltage shift $\Delta V_F$ through C-V measurement, and determining a relationship of deposition conditions for the CVD method or the ALD method and the electron charge density of the generated, fixed negative charge layer.

Fourth Embodiment

As shown in FIG. 23B, in the erase operation of the semiconductor memory according to the second embodiment, when the erase gate voltage applied to the control gate electrode 24, which is determined so that a desired tunneling current can flow through the gate insulator 2, increases higher than the voltage in the case where there is no positive charge layer, since the effective tunneling distance established in the inter-electrode dielectric 23 becomes shorter, the amount of tunneling leakage current flowing through the inter-electrode dielectric 23 increases. A more preferable structure for suppressing such tunneling leakage current will be explained, referencing to energy band diagrams shown in FIGS. 35A and 35B, in a semiconductor memory according to a fourth embodiment.

Similar to the structure shown in FIG. 22, in the semiconductor memory according to the fourth embodiment, each of the memory cell transistors is implemented by a stacked gate architecture, in which a gate insulator 2, through which mobile carrier conduct by the tunneling effect, a floating gate electrode 21, an interface insulators 22 in which a positive charge layer, preferably a fixed positive charge layer is incorporated in the lower-level region, an inter-electrode dielectric 23 made of a high dielectric constant material, and a control gate electrode 24 are stacked on the semiconductor substrate 1 in order.

However a feature in which a negative charge layer, preferably a fixed negative charge layer is incorporated in the lower-level region of the inter-electrode dielectric 23 is distinguishable from the features explained in the second embodiment.

Figure 35A:
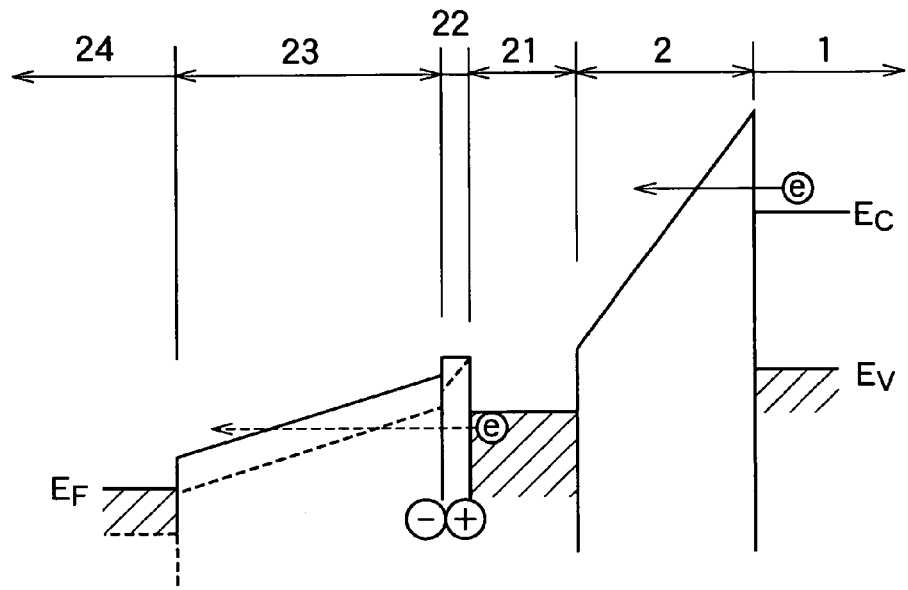
FIG. 35A is an energy band diagram explaining program operation in a memory cell structure of a semiconductor memory according to a fourth embodiment of the present invention.
Figure 35B:
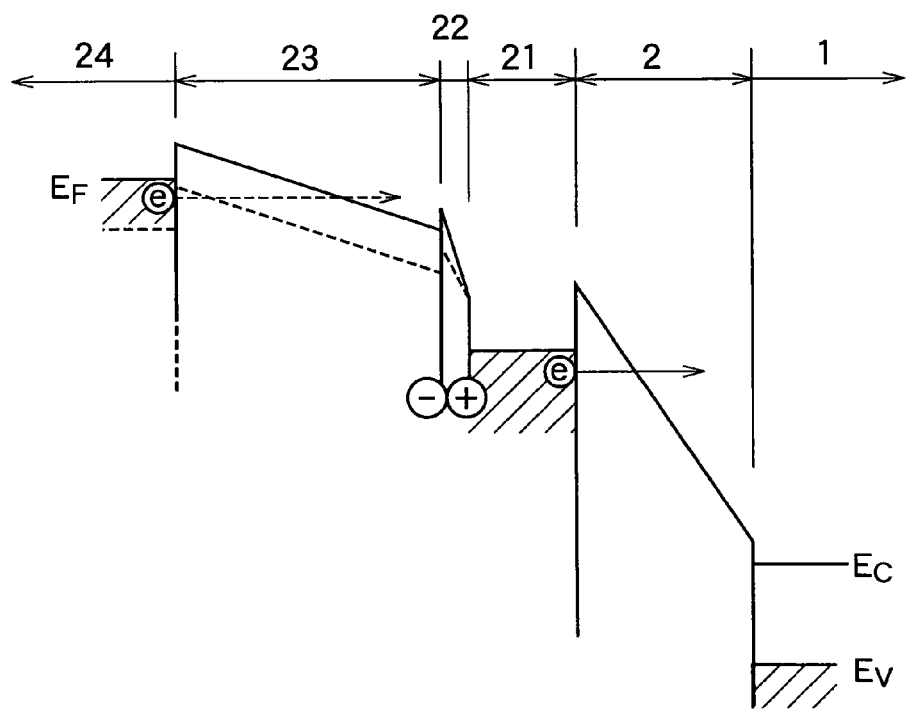
FIG. 35B is a corresponding energy band diagram explaining an erase operation in the memory cell structure of the semiconductor memory according to the fourth embodiment of the present invention.

FIG. 35A shows an energy band diagram during the program operation, and FIG. 35B shows a corresponding energy band diagram during the erase operation of the semiconductor memory according to the fourth embodiment. For the semiconductor substrate 1, the conduction band edge $E_c$ and the valence band edge $E_v$ are represented. For the gate insulator 2, the interface insulator 22, and the inter-electrode dielectric 23, only the conduction band edge is represented. For the floating gate electrode 21 and the control gate electrode 24, a metallic band structure is assumed and Fermi level $E_F$ is represented in FIGS. 35A and 35B. Similar to the structure explained in the second embodiment, the thickness of the gate insulator (tunneling oxide film) 2 is 8 nm, a 1 nm-thick silicon oxide ($SiO_2$) film is used as the interface insulators 22, and a 12 nm-thick alumina ($Al_2O_3$) film is used as the inter-electrode dielectric 23. FIGS. 35A and 35B show the case in which the fixed positive charges are distributed with an electron charge density of $4\times10^{13}$ cm$^{-2}$ around the interface between the interface insulators 22 and the floating gate electrode 21, and the fixed negative charges are distributed in the lower-level region of the inter-electrode dielectric 23 with an electron charge density of $4\times10^{13}$ cm$^{-2}$ around the interface between the inter-electrode dielectric 23 and the interface insulators 22. However, the electron charge densities of the fixed positive/negative charge layers are not limited to that value. The electron charge density in the fixed positive/negative charge layers need to be $1\times10^{10}$ cm$^{-2}$ or greater, which is effective to a certain extent, but more preferably to lie between $1\times10^{12}$ cm$^{-2}$ and $6\times10^{16}$ cm$^{-2}$. With an electron charge density greater than $6\times10^{16}$ cm$^{-2}$, because defects will be generated so as to remarkably decrease the quality of the interface insulators 22, increasing the leakage current and decreasing the surface morphology, therefore too much inclusion of electron charges is not favorable.

In the semiconductor memory according to the fourth embodiment, because the fixed positive charges are distributed in the interface insulators 22 and the fixed negative charges are distributed in the lower-level region of the inter-electrode dielectric 23, the drawbacks ascribable to the presence of the fixed positive charge layer, which was pointed out in the second embodiment, referencing to FIG. 23B, can be overcome. The amount of leakage current at the erase operation is equal to or less than a detection limit of $1\times10^{-12}$ A/cm$^2$; the increase of the erase gate voltage is suppressed to be less than one volt. Therefore, the leakage current flowing through the inter-electrode dielectric 23, at the erase operation can be suppressed.

The program gate voltage is reduced by one volt, approximately, compared with the case in which there are no positive and negative charges. If the improvement of the performances at the program operation, such as the decrease of leakage current and the decrease of the program gate voltage, is prior to other improvements, the electron charge density of the fixed positive charge layer should be larger than that of the fixed negative charge layer. If the improvement of the performances at the erase operation, such as the decrease of leakage current and the decrease of the erase gate voltage, is prior to other improvements, the electron charge density of the fixed positive charge layer should be smaller than that of the fixed negative charge layer.

As explained above, in the semiconductor memory according to the fourth embodiment, the program gate voltage is reduced while reducing the leakage current flowing through the inter-electrode dielectric 23 at the program operation, and the leakage current is also reduced at the erase operation.

Note that with the semiconductor memory according to the fourth embodiment, there is no theoretical limitation on the thickness of the fixed positive/negative charge layers. Therefore, the position of the fixed positive charge layer is not limited to the lower-level region of the interface insulator 22, and the fixed positive charge layer can be distributed throughout the interface insulator 22, or it may be homogenously distributed throughout the interface insulator 22. However, it is preferable that the fixed positive charge layer is localized at or in the vicinity of the interface between the floating gate electrode 21 and the interface insulator 22 because even a low electron charge density can provide the aforementioned effectiveness. In other words, charge distribution with the equivalent center of gravity of the fixed positive charge layer positioned on the lower-level region side of the interface insulator 22 is preferable because even a low electron charge density can provide the desired effectiveness.

The position of the fixed negative charge layer is not limited to the lower-level region of the inter-electrode dielectric 23, and the fixed negative charge layer can be distributed throughout the inter-electrode dielectric 23. However, it is preferable that fixed negative charge layer is localized at or in the vicinity of the interface between the interface insulator 22 and the inter-electrode dielectric 23 because even a low electron charge density can provide the aforementioned effectiveness. In other words, charge distribution with the equivalent center of gravity of the fixed negative charge layer being positioned on the lower-level region side of the inter-electrode dielectric 23 is preferable because even a low electron charge density can provide the desired effectiveness. The thinner the thickness of the fixed positive/negative charge layers, the more preferable since the fixed positive charge layer can be disposed closer to the fixed negative charge layer, which will allow the advantage such that a lower electron charge density can provide the aforementioned effectiveness. However, considering the manufacturing method from a realistic viewpoint, it is preferable that the thickness of the fixed positive/negative charge layers be equal to the thickness of approximately one molecular layer (approximately twice the interval between atoms) in the insulator film.

Moreover, with the semiconductor memory according to the fourth embodiment, the positive/negative charges are not limited to fixed charges, and alternatively may be mobile charges. Similar to the semiconductor memory according to the first and second embodiments, positive mobile ions such as sodium ions ($Na^+$) or potassium ions ($K^+$) may be incorporated through a thermal diffusion process after formation of the interface insulator 22 so as to provide the positive charge layer. Moreover, positive mobile ions may be implanted by an ion implantation process so as to provide the positive charge layer. Further, negative mobile ions such as fluorine ions ($F^-$) or chlorine ions ($Cl^-$) may be incorporated through a thermal diffusion process after formation of the interface insulator 22 so as to provide the negative charge layer. Moreover, negative mobile ions may be implanted by an ion implantation process so as to provide the negative charge layer. However, fixed charges are preferable because there is no change in the charge distribution during memory cell operations and no change in the memory cell electric characteristics.

OTHER EMBODIMENTS

Various modifications will become possible for those skilled in the art after receiving the teaching of the present disclosure without departing from the scope thereof.

For example, although a p-type semiconductor substrate 1 was employed in the explanations of the first to fourth embodiments, the employment of the p-type semiconductor substrate 1 is merely an example, and an n-type semiconductor substrate can be employed so as to achieve similar technical advantages stated in the first to fourth embodiments. By reversing all of the conductivity type from p-type to n-type and vice versa, features of the semiconductor memory and the fabrication method for the semiconductor memory described in the first to fourth embodiments can be understood by the similar principles stated above, and a similar effectiveness can be achieved.

In the explanation of the first embodiment, the control gate electrode 24 is explained such that it is formed with a triple-level composite structure, which is made up of the third doped polysilicon film 12, the tungsten silicide ($WSi_2$) film 13, and the cap insulator film 14, the configuration of the triple-level composite structure is merely an example, and naturally, other architectures including modifications of the structure may be implemented, such as a gate structure in which the cap insulator film 14 is deleted so as to implement a double-level composite structure. Furthermore, the control gate electrode 24 can be accomplished by a single layer of the third doped polysilicon film, or can be implemented by multi-level composite structures larger than a quadruple-level composite structure. Similarly, the floating gate electrode 21 is explained such that it is formed with a double-level composite structure, which is made up of the first doped polysilicon film 3 and the second doped polysilicon film 8, the configuration of the double-level composite structure is merely an example, and naturally, other architectures may be implemented, and the floating gate electrode 21 can be accomplished by a single layer of the doped polysilicon film, or can be implemented by multi-level composite structures larger than a triple-level composite structure.

Thus, the present invention of course includes various embodiments and modifications and the like which are not detailed above. Therefore, the scope of the present invention will be defined in the following claims.

What is claimed is:

1. A semiconductor memory comprising a plurality of memory cell transistors, each of the memory cell transistors comprising:
    a substrate;
    a gate insulator stacked on the substrate, configured to enable tunneling of electrons through the gate insulator;
    a floating gate electrode stacked on the gate insulator, configured to accumulate electron charges;
    an inter-electrode dielectric stacked on the floating gate electrode incorporating a positive charge layer, distribution of the positive charge layer being localized in the lower half of the inter-electrode dielectric; and
    a control gate electrode stacked on the inter-electrode dielectric.

2. The semiconductor memory of claim 1, wherein the positive charge layer is a layer including one of:
    a film structural defect of the inter-electrode dielectric; and
    a bond structure implemented by an impurity atom being bonded to a positively charged atom constituting network of the inter-electrode dielectric.

3. The semiconductor memory of claim 1, wherein the inter-electrode dielectric further incorporates a negative charge layer distributing above and separated from the positive charge layer.

4. The semiconductor memory of claim 3, wherein spacing between the negative charge layer and the positive charge layer is 0.5–5 nm.

* * * * *